United States Patent
Ducros et al.

(10) Patent No.: US 11,674,327 B2
(45) Date of Patent: Jun. 13, 2023

(54) POLE BASE CABINET

(71) Applicant: IPB Solution, Inc., Reno, NV (US)

(72) Inventors: Steven Victor Ducros, Yorba Linda, CA (US); Nathan Ross Mowery, Costa Mesa, CA (US); Ryan Smith, Mission Viejo, CA (US)

(73) Assignee: IPB Solution, Inc., Reno, NV (US)

( * ) Notice: Subject to any disclaimer, the term of this patent is extended or adjusted under 35 U.S.C. 154(b) by 0 days.

(21) Appl. No.: 17/239,992

(22) Filed: Apr. 26, 2021

(65) Prior Publication Data

US 2021/0381267 A1 Dec. 9, 2021

Related U.S. Application Data

(63) Continuation of application No. 16/796,806, filed on Feb. 20, 2020, now Pat. No. 10,988,954, which is a
(Continued)

(51) Int. Cl.
*E04H 12/00* (2006.01)
*H02G 3/08* (2006.01)
(Continued)

(52) U.S. Cl.
CPC .......... *E04H 12/003* (2013.01); *F21S 8/086* (2013.01); *H02G 3/083* (2013.01); *H02G 3/14* (2013.01)

(58) Field of Classification Search
CPC ........ E04H 12/003; E04H 12/22; F21S 8/086; H02G 3/083; H02G 3/14; H02G 3/03; H02G 3/0493; H05K 7/18
See application file for complete search history.

(56) References Cited

U.S. PATENT DOCUMENTS 3,341,718 A * 9/1967 Acker .................... F21V 23/02
307/157
3,608,991 A 9/1971 Wade
(Continued)

FOREIGN PATENT DOCUMENTS

CN 204001925 U 12/2014
EP 2913522 B1 4/2017
(Continued)

OTHER PUBLICATIONS

"Hapco Bolt Circle Adapter", Hapco Pole Products, HP-02 (06-18) 2018.
(Continued)

*Primary Examiner* — Hanh V Tran
(74) *Attorney, Agent, or Firm* — Knobbe Martens Olson & Bear, LLP

(57) ABSTRACT

This disclosure relates to pole bases, specifically to light pole base cabinets that can house items. The pole base cabinets can be positioned between a light pole and a footing. The pole base cabinets provide a base to a light pole while adding additional functionality. The cabinets can include a main opening allowing access to a cavity in which items can be stored. Access to the cavity can be restricted with a door that uncovers and covers the main opening. The pole base cabinets can include support panels, internal stiffening panels, external stiffening panels, support tabs, flanges, tabs, a peripheral wall, and other features to provide structural support and enclose the contents in the pole base cabinet.

21 Claims, 43 Drawing Sheets

Related U.S. Application Data continuation-in-part of application No. 16/568,198, filed on Sep. 11, 2019, now Pat. No. 10,760,753.

(60) Provisional application No. 62/730,201, filed on Sep. 12, 2018.

(51) Int. Cl.
 *F21S 8/08* (2006.01)
 *H02G 3/14* (2006.01)

(56) References Cited

U.S. PATENT DOCUMENTS

| | | | |
|---|---|---|---|
| 4,438,484 | A | 3/1984 | Winden |
| 5,581,958 | A | 12/1996 | Coté |
| 6,036,290 | A | 3/2000 | Jancsek et al. |
| 6,380,909 | B1 * | 4/2002 | Wilkinson ............ E04H 12/08 343/890 |
| 6,402,337 | B1 | 6/2002 | LeVasseur et al. |
| 6,422,232 | B1 | 7/2002 | Ashton et al. |
| 6,467,756 | B1 * | 10/2002 | Elsasser ............ E04H 17/1413 52/832 |
| 7,219,873 | B2 | 5/2007 | Harwood |
| 7,495,169 | B2 | 2/2009 | Adducci et al. |
| 7,731,383 | B2 * | 6/2010 | Myer .................... F21S 9/037 362/373 |
| 7,765,770 | B2 * | 8/2010 | Fournier ............ E04H 12/2253 52/843 |
| 7,851,702 | B2 | 12/2010 | Fournier et al. |
| 9,144,175 | B2 | 9/2015 | Segroves et al. |
| 9,351,427 | B2 | 5/2016 | Lewis, II et al. |
| 9,706,820 | B1 | 7/2017 | Lopez |
| 10,135,130 | B1 | 11/2018 | Bouchard |
| 10,411,336 | B1 * | 9/2019 | Schwartz ............ H01Q 1/12 |
| 10,760,753 | B2 | 9/2020 | Ducros et al. |
| 10,767,825 | B2 * | 9/2020 | Chia .................... E04C 3/36 |
| 10,988,954 | B2 | 4/2021 | Ducros et al. |
| 11,262,037 | B2 * | 3/2022 | Bijl .................... F21S 8/088 |
| 11,280,461 | B2 | 3/2022 | Ducros et al. |
| 2008/0285258 | A1 | 11/2008 | Maitland et al. |
| 2009/0273261 | A1 | 11/2009 | Fournier et al. |
| 2012/0143383 | A1 | 6/2012 | Cooperrider et al. |
| 2012/0230004 | A1 * | 9/2012 | Atchley .................... H02G 9/06 361/825 |
| 2014/0041556 | A1 | 2/2014 | Diepenbrock |
| 2015/0043200 | A1 | 2/2015 | Wilson |
| 2016/0146438 | A1 * | 5/2016 | LaFemina ............... F21V 21/10 362/362 |
| 2016/0365714 | A1 | 12/2016 | Galasso et al. |
| 2017/0122546 | A1 | 5/2017 | Abbott et al. |
| 2017/0179701 | A1 | 6/2017 | Drueke et al. |
| 2017/0307192 | A1 | 10/2017 | LaFemina |
| 2018/0172229 | A1 | 6/2018 | Lockwood et al. |
| 2018/0175661 | A1 | 6/2018 | Tuerk |
| 2018/0180234 | A1 | 6/2018 | Spiro |
| 2018/0219278 | A1 | 8/2018 | Wigdahl et al. |
| 2019/0006830 | A1 | 1/2019 | Richards et al. |
| 2019/0211984 | A1 | 7/2019 | Kovalchick et al. |
| 2020/0036174 | A1 | 1/2020 | Diakomis et al. |
| 2020/0190842 | A1 | 6/2020 | Ducros et al. |
| 2021/0080068 | A1 | 3/2021 | Ducros et al. |

FOREIGN PATENT DOCUMENTS

| | | |
|---|---|---|
| GB | 2508313 B | 7/2014 |
| KR | 10-2011-0029868 A | 3/2011 |
| KR | 10-1042293 B1 | 6/2011 |
| KR | 10-1437794 B1 | 9/2014 |
| WO | WO 2005/047625 | 5/2005 |
| WO | WO 2008/086607 | 7/2008 |
| WO | WO 2020/056049 | 3/2020 |
| WO | WO 2010/050993 | 5/2020 |
| WO | WO 2021/167951 | 8/2021 |

OTHER PUBLICATIONS

International Search Report and Written Opinion of International Application No. PCT/US2019/050683 dated Nov. 28, 2019 in 10 pages.
International Search Report and Written Opinion received in PCT/US2021/018328, dated Jun. 4, 2021 in 7 pages.

* cited by examiner

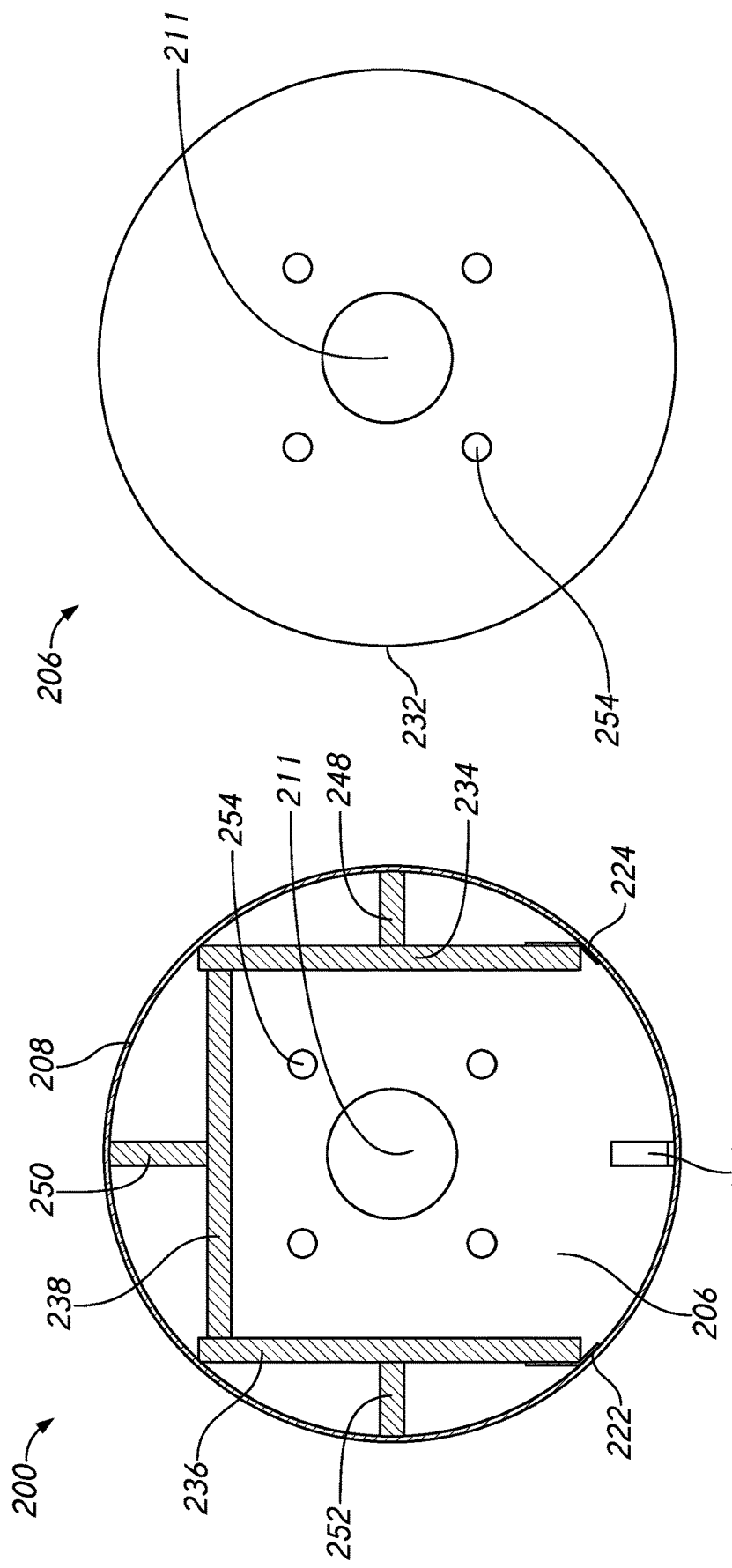

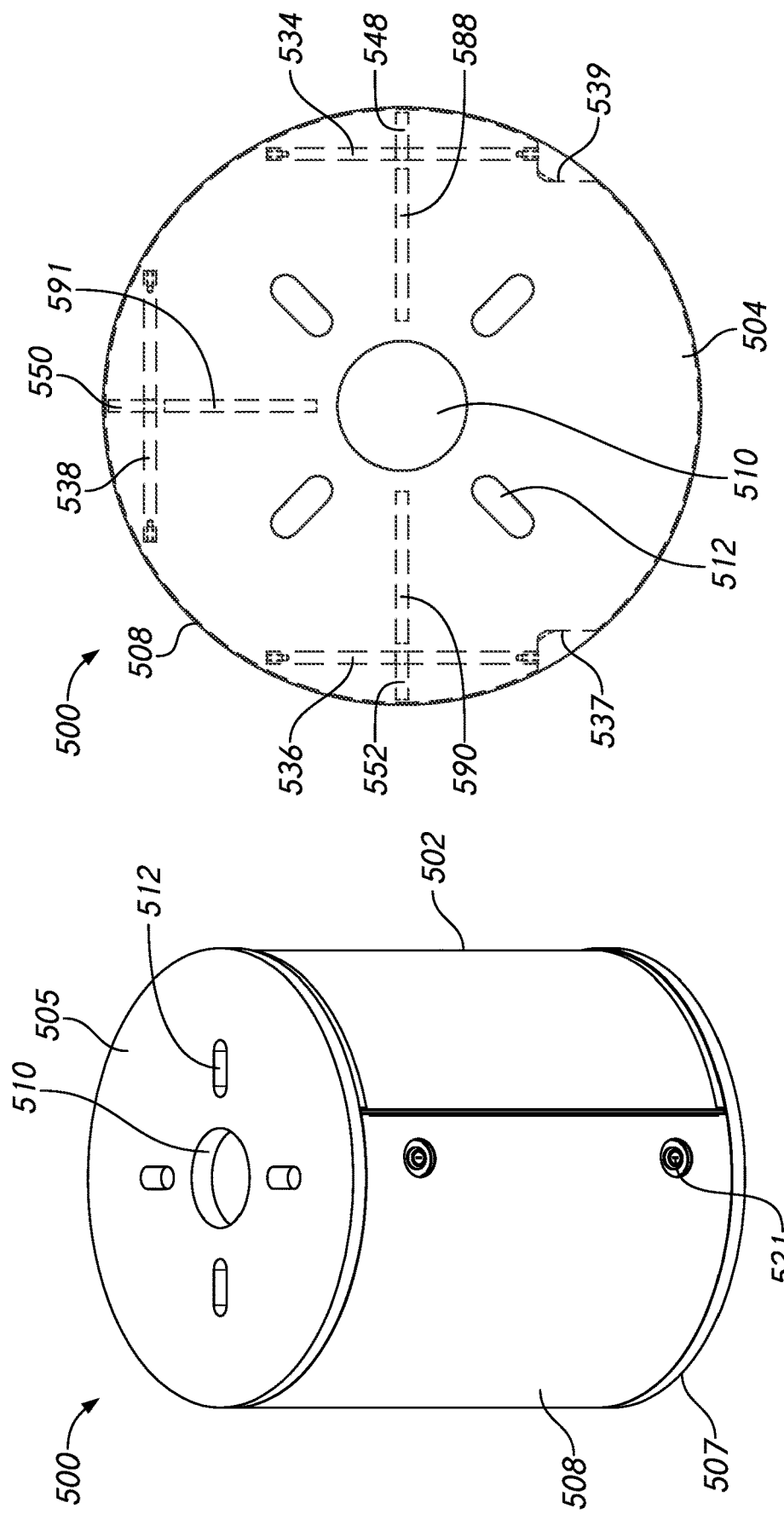

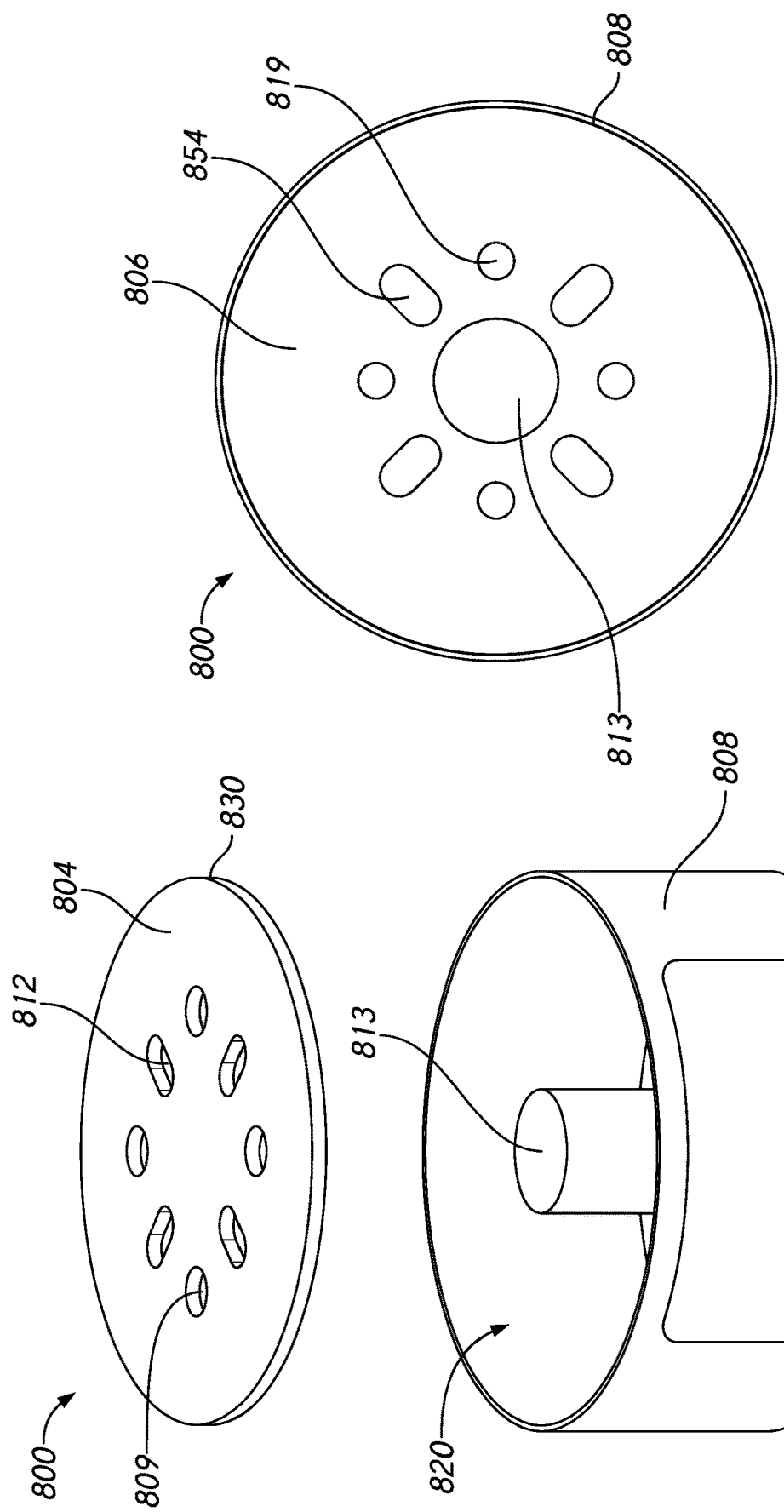

POLE BASE CABINET

INCORPORATION BY REFERENCE TO ANY PRIORITY AND RELATED APPLICATIONS

This application is a continuation of U.S. application Ser. No. 16/796,806, filed Feb. 20, 2020, which is a continuation-in-part of U.S. application Ser. No. 16/568,198, filed Sep. 11, 2019, which claims the priority benefit of U.S. Provisional Application No. 62/730,201, filed Sep. 12, 2018, which are hereby incorporated by reference in their entirety herein and made a part of this specification. Related PCT Application No. PCT/US2019/050683, filed Sep. 11, 2019, and related PCT Application No. PCT/US2021/018328, filed Feb. 17, 2021, are hereby incorporated by reference in their entireties herein and made a part of this specification.

Any and all applications for which a foreign or domestic priority claim is identified in the Application Data Sheet as filed with the present application are hereby incorporated by reference under 37 CFR 1.57.

FIELD

This disclosure relates to pole bases, specifically to light pole base cabinets that can house items.

BACKGROUND

Currently, light poles are installed on footings that protrude well above grade. For example, a hole is dug into the ground to a specified depth. A rebar cage is then placed in the hole and electrical conduits routed therethrough. A tube or similar structure is placed around the rebar cage and concrete is poured in. The concrete sets to establish a concrete footing above grade. A pole supporting a light source is mounted to the top of the concrete footing and electrical wiring is routed through the electrical conduits to provide electrical power to the light source. The concrete footing has the limited purpose of providing structural support. As society continues to progress, more adaptability and utility is desirable beyond providing structural support. Accordingly, pole base solutions that address at least some of these challenges are desirable.

SUMMARY

Neither the preceding summary nor the following detailed description purports to limit or define the scope of protection. The scope of protection is defined by the claims.

As society's needs change, it can be desirable to adapt a lighting pole and/or footing upon which the footing is mounted to include additional features or be adapted for multiple purposes. Currently, the concrete footings upon which light poles are mounted do not offer the capability to accommodate additional features and/or storage for supporting those additional features. The concrete footings cannot readily be adapted because the footing and light pole are structurally designed to meet specific demands or requirements, such as environmental, safety, load-bearing, code, and/or other requirements. In some cases, accessories, such as a camera for surveillance, are included during the installation of a lighting pole and footing. Wiring for said accessories is sometimes routed through any existing electrical conduits or externally, but due to a lack of space, connections, components, and/or supportive technology are externally mounted onto the footing and/or light pole. This configuration, however, can be unaesthetic, an inefficient use of space, fail to provide desirable protection, and/or have other deficiencies.

Various pole base cabinets are disclosed herein that address at least one or more of the problems detailed above or others. The pole base cabinets disclosed herein can be positioned between a pole base and a footing or base, such as a concrete base. The pole base cabinets disclosed herein can include a main opening allowing access to a cavity in which items can be stored. Access to the cavity can be restricted with a door that uncovers and covers the main opening. The pole base cabinets disclosed herein can include support panels, internal stiffening panels, external stiffening panels, support tabs, flanges, tabs, a peripheral wall, and/or other features to provide structural support and/or enclose the contents of the pole base cabinet.

In a configuration, a pole base cabinet for housing items can include a top plate comprising a plurality of apertures. The pole base cabinet can include a bottom plate offset from the top plate, the bottom plate can have a plurality of apertures configured to facilitate the coupling of the cabinet to a footing. The pole base cabinet can have a frame that includes a plurality of support panels extending between and connecting to the top plate and the bottom plate. The plurality of support panels can have a first support panel, a second support panel, and a third support panel. The first support panel can be offset from the second support panel and the third support panel can extend therebetween. The frame can include a plurality of internal stiffening braces extending between the plurality of support panels. The plurality of internal stiffening braces can include a first internal stiffening brace and a second internal stiffening brace. The first internal stiffening brace can extend between the first support panel and the second support panel. The second internal stiffening brace can extend between the first internal stiffening brace and the third support panel. The pole base cabinet can include a peripheral wall extending from a periphery of the top plate to a periphery of the bottom plate. The peripheral wall can have a main opening providing access into a cavity of the cabinet that is configured to house items. The pole base cabinet can include a door configured to releasably couple to the cabinet such that the main opening is covered to temporarily prevent access to the cavity through the main opening.

In a configuration, the pole base cabinet can include external stiffening planks that can extend between the top plate and the bottom plate. The external stiffening panels can extend between the plurality of support panels to the peripheral wall.

In a configuration, the external stiffening planks are positioned perpendicularly relative to the plurality of support panels.

In a configuration, the pole base cabinet can include a first flange connected to the first support panel proximate the main opening and a second flange connected to the second support panel proximate the main opening, wherein the first and second flanges engage the door.

In a configuration, the top plate can include an opening that provides access into the cavity of the cabinet such that wiring can extend into the cavity of the cabinet.

In a configuration, the periphery of the top plate and the periphery of the bottom plate are the same.

In a configuration, the periphery of the top plate and the periphery of the bottom plate are circular.

In a configuration, the pole base cabinet can include a top tab connected to the top plate and a bottom tab connected to the bottom plate, wherein the top and bottom tabs are positioned proximate the peripheral wall and the main opening such that the door interfaces with the top and bottom tabs.

In a configuration, the plurality of internal stiffening braces further can include a third internal stiffening brace and a fourth internal stiffening brace, wherein the third internal stiffening brace extends between the first support panel and the second internal stiffening brace and the fourth internal stiffening brace extends between the second support panel and the second internal stiffening brace.

In a configuration, the plurality of internal stiffening brace can be connected to the top plate and extend to a position between the top plate and the bottom plate.

In a configuration, a pole base cabinet can include a first plate that can have a plurality of apertures configured to facilitate coupling the cabinet to a pole. The pole base cabinet can include a second plate offset from the first plate. The second plate can have a plurality of apertures. The pole base cabinet can have a first support panel, second support panel, and third support panel extending between and connecting to the first plate and the second plate. The first support panel and the second support panel can be offset from each other and the third support panel can extend between proximate an end of the first support panel and proximate an end of the second support panel. The pole base cabinet can include a brace that extends between the first support panel and the second support panel. The brace can be offset from the third support panel. The pole base cabinet can include a peripheral wall extending from a periphery of the top plate to a periphery of the bottom plate. The peripheral wall can include a main opening providing access into a cavity of the cabinet.

In a configuration, the pole base cabinet can include a door configured to releasably couple to the cabinet such that the main opening is covered.

In a configuration, the brace can be connected to the top plate and extend to a position between the top plate and the bottom plate.

In a configuration, the peripheral wall can define a circular periphery of the cabinet.

In a configuration, the first plate can have one or more openings that provide access into the cavity of the cabinet.

In a configuration, the plurality of apertures of the first plate can be distributed around the one or more openings of the first plate.

In a configuration, the second plate can have a plurality of apertures that are configured to facilitate coupling the cabinet to a base.

In a configuration, the second plate can have one or more openings that provide access into the cavity of the cabinet.

In a configuration, the plurality of apertures of the second plate can be distributed around the one or more openings of the second plate.

In a configuration, the peripheral wall can be spaced away from the first support panel, second support panel, third support panel, and brace.

In a configuration, a pole base cabinet can have a top plate. The pole base cabinet can have a bottom plate. The pole base cabinet can have a first support panel and a second support panel. The first support panel and the second support panel can be offset from each other. The pole base cabinet can have a plurality of support tabs that can include a first top support tab, a second top support tab, a first bottom support tab, and a second bottom support tab. The first top support tab can be connected to the top plate and the first support panel. The second top support tab can be connected to the top plate and the second support panel. The first bottom support tab can be connected to the bottom plate and the first support panel. The second bottom support tab can be connected to the bottom plate and the second support panel. The pole base cabinet can include a peripheral wall extending from the top plate to the bottom plate. The peripheral wall can define a main opening providing access into a cavity of the cabinet.

In a configuration, the top plate can have an opening through which wiring can be extended.

In a configuration, the bottom plate can have an opening through which wiring can be extended.

In a configuration, the peripheral wall can extend from a periphery of the top plate to a periphery of the bottom plate.

In a configuration, the cabinet can have a top projection and a bottom projection. The top projection can be connected to the top plate and the bottom projection can be connected to the bottom plate. The top projection and the bottom projection can engage with the peripheral wall and extending into the main opening.

In a configuration, a pole base cabinet can have a top plate. The pole base cabinet can have a bottom plate offset from the top plate. The pole base cabinet can have a peripheral wall extending between the top plate and the bottom plate. The peripheral wall can define a main opening providing access a cavity of the cabinet. The pole base cabinet can have a first support panel, a second support panel, and a third support panel. The first support panel and the second support panel can be offset from each other and the third support panel can be perpendicular to the first and second support panels. The pole base cabinet can have a plurality of top support tabs and a plurality of bottom support tabs. One of the top support tabs and one of the bottom support tabs can be connected to each of the first support panel, the second support panel, and the third support panel. The plurality of top support tabs can be connected to the top plate and the plurality of bottom support tabs can be connected to the bottom plate. The pole base cabinet can have a plurality of planks, wherein one of the plurality of external stiffening panels extends from a side of each of the first support panel, the second support panel, and the third support panel, wherein the side is opposite another side upon which the plurality of top support tabs and bottom support tabs are connected, to the peripheral wall.

In a configuration, the top plate and the bottom plate can have notches configured to receive flanges, wherein the flanges can extend into the main opening.

In a configuration, the cabinet can have a door that couples to the flanges such that access to the cavity through the main opening is impeded.

In a configuration, the cabinet can have a secondary top plate and secondary bottom plate, wherein the secondary top plate can be positioned on the top plate and the secondary bottom plate can be positioned on the bottom plate.

In a configuration, the top plate can have an opening providing access into the cavity.

In a configuration, the bottom plate can have an opening providing access into the cavity.

In a configuration, a pole base cabinet can include a first plate that can have a plurality of apertures configured to facilitate the coupling of the cabinet to a baseplate of a pole. The cabinet can have a second plate offset from the top plate, the bottom plate can have a plurality of apertures configured to facilitate the coupling of the cabinet to a base and an opening through which wires may extend into a cavity of the cabinet. The cabinet can have a peripheral wall that can extend between the first plate and the second plate, the peripheral wall can define a main opening providing access a cavity of the cabinet. The pole base cabinet can have a plurality of top support tabs can be connected to the first plate and a plurality of bottom support tabs that can be connected to the second plate. The plurality of top support tabs can be connected to one of the plurality of bottom support tabs. The plurality of top support tabs and the plurality of bottom support tabs can be radially distributed about the opening of the first plate.

In a configuration, the plurality of top support tabs and the plurality of bottom support tabs can be equally spaced apart from each other and circumferentially distributed about the opening of the first plate.

In a configuration, the plurality of top support tabs can have four top support tabs and the plurality of bottom support tabs can have four bottom support tabs.

In a configuration, the cabinet can have a pair of flanges positioned proximate the main opening, wherein a door is configured to engage with the pair of flanges to cover and uncover the door.

In a configuration, the first plate can have an opening.

In a configuration, a pole base cabinet can have a top plate that includes a plurality of apertures configured to facilitate the coupling of the cabinet to a baseplate of a pole. The cabinet can have a bottom plate offset from the top plate, the bottom plate can have a plurality of apertures configured to facilitate the coupling of the cabinet to a base and an opening through which wires may extend into a cavity of the cabinet. The cabinet can have a wall extending between the top plate and the bottom plate, the wall can define defining a main opening providing access a cavity of the cabinet. The cabinet can have a plurality of structural supports, that can include a first structural support, second structural support, and third structural support, wherein each of the plurality of structural supports can include a center panel, a first wing panel, and a second wing panel, wherein the first wing panel and the second wing panel can extend away from the center panel at an angle. The center panel of the first structural support and the second structural support can be offset form each other, and wherein the center panel of the third structural support can extend between the center panels of the first structural support and the second structural support. The second wing panel of the first structural support can be proximate the first wing panel of the third structural support and the first wing panel of the second structural support can be proximate the second wing panel of the third structural support.

In a configuration, the first wing panel and the second wing panel extend to the wall.

In a configuration, the center panels can have apertures through which wires can be routed.

In a configuration, the wall can extend between the first wing panel of the first structural support to the second wing panel of the second structural support.

In a configuration, the pole base cabinet can have a top plate that can have a plurality of apertures configured to facilitate the coupling of the cabinet to a baseplate of a pole and one or more openings through which wires may be extending into a cavity of the cabinet. The cabinet can have a bottom plate offset from the top plate, the bottom plate can have a plurality of apertures configured to facilitate the coupling of the cabinet to a base. The cabinet can have a wall extending between the top plate and the bottom plate, the peripheral wall can define a main opening providing access a cavity of the cabinet. The cabinet can have a column extending between the bottom plate and the top plate. In a configuration, the column can be a tube.

In a configuration, a pole base cabinet can include a top plate that can have a plurality of apertures configured to facilitate the coupling of the cabinet to a baseplate of a pole and one or more openings through which wires may be extending into a cavity of the cabinet. The cabinet can have a bottom plate offset from the top plate, the bottom plate can include a plurality of apertures configured to facilitate the coupling of the cabinet to a base. The cabinet can have a peripheral wall that can extend between the top plate and the bottom plate, the peripheral wall can have a main opening providing access to a cavity of the cabinet formed by the peripheral wall. The peripheral wall can have a circular periphery. In a configuration, the peripheral wall is made of high-strength steel.

Methods of using the foregoing system(s) (including device(s), apparatus(es), assembly(ies), structure(s) or the like) included; the methods of use can include using or assembling any one or more of the features disclosed herein to achieve functions and/or features of the system(s) as discussed in this disclosure. Methods of manufacturing the foregoing system(s) are included; the methods of manufacture can include providing, making, connecting, assembling, and/or installing any one or more of the features of the system(s) disclosed herein to achieve functions and/or features of the system(s) as discussed in this disclosure. In a configuration, a method of assembling a pole base cabinet to a footing can include coupling a top plate of the cabinet to a baseplate of a pole, wherein the top plate can include a plurality of apertures. The method can include extending wires through one or more openings of the baseplate into a cavity of the cabinet. The method can include coupling a bottom plate offset from the top plate to a footing. The method can include positioning items through a main opening that provides access to the cavity of the cabinet formed by a peripheral wall extending between the top plate and the bottom plate, wherein the peripheral wall can have a circular periphery.

In a configuration, a pole base cabinet can include a first plate. The first plate can have a plurality of apertures that can facilitate coupling the cabinet to a pole. The pole base cabinet can have a second plate offset from the first plate. The second plate can have a plurality of apertures. The pole base cabinet can have a first support panel, second support panel, and third support panel extending between and connecting to the first plate and the second plate. The first support panel and the second support panel can be offset from each other and the third support panel can extend between proximate an end of the first support panel and proximate an end of the second support panel. The pole base cabinet can have a first brace, second brace, and third brace that can extend between and connect to the first support panel and the second support panel. The pole base cabinet can have a peripheral wall extending from a periphery of the first plate to a periphery of the second plate. The peripheral wall can have a main opening providing access into a cavity of the cabinet.

In a configuration, the cabinet can have a door that can selectively inhibit access to the cavity via the main opening.

In a configuration, the cabinet can have a door frame with an opening therethrough. The door frame can be positioned on an inner side of the peripheral wall and around a periphery of the main opening. The cavity of the cabinet can be accessible through the main opening of the peripheral wall and opening of the door frame. The door can be configured to interface with the door frame with the door flush with the peripheral wall.

In a configuration, the cabinet can have a hinge that can to allow the door to rotate open and closed.

In a configuration, the cabinet can have a shim that can be between the door frame and the peripheral wall. The hinge can be between the door frame and the peripheral wall. The hinge and the shim can space the door frame away from the peripheral wall. The door can interface with the door frame with the door flush with the peripheral wall.

In a configuration, the first support panel, second support panel, and third support panel can include an aperture.

In a configuration, the cabinet can have a bracket that is configured to receive a fan. In a configuration, a fan can be retained in the bracket. The fan can direct a flow of air in or through the cavity of the cabinet.

In a configuration, the first brace can extend between and be connected to proximate an end of the first support panel and an end of the second support panel.

In a configuration, the first plate can have one or more openings that provide access into the cavity of the cabinet.

In a configuration, the second plate can have one or more openings that provide access into the cavity of the cabinet.

In a configuration, the first brace, second brace, and third brace can extend from and are connected to the first plate.

In a configuration, the first brace, second brace, and third brace can extend from the first plate to a position between the first plate and second plate.

In a configuration, the second brace can extend between and be connected to a middle portion of each of the first support panel and the second support panel.

In a configuration, each of the first brace, second brace, and third brace can have a rectangular periphery.

In a configuration, the first brace, second brace, and third brace can be the same size.

In a configuration, the first brace, second brace, and third brace can have the same profile.

In a configuration, the first brace, second brace, and third brace can be the same length.

In a configuration, the first brace, second brace, and third brace can be the same height.

In a configuration, the first brace, second brace, and third brace can be the same thickness.

In a configuration, the first brace, second brace, and third brace can be at the same elevation.

In a configuration, the first brace, second brace, and third brace can be connected to the first support panel and second support panel at same elevation.

In a configuration, the first brace, second brace, and third brace can have a height that is less than one-fourth of a length of the first support panel, second support panel, and third support panel.

In a configuration, the first brace, second brace, and third brace have a height that is less than one-fourth of a distance between the top plate and the bottom plate.

In a configuration, the first brace, second brace, and third brace can extend from the top plate to a distance that is less than one-fourth of a distance between the top plate and the bottom plate.

In a configuration, the first brace, second brace, and third brace can have a length that is the same as the width of the third support panel.

In a configuration, the first brace, second brace, and third brace can be parallel to each other.

In a configuration, the first brace, second brace, and third brace can be parallel to the third support panel.

In a configuration, the first brace, second brace, and third brace can be perpendicular to the first support panel and second support panel.

In a configuration, the first brace and third brace can be equidistantly spaced away from the second brace.

In a configuration, the peripheral wall can define a circular periphery of the cabinet.

In a configuration, a pole base cabinet can have a first plate that can have a plurality of apertures that can facilitate coupling the cabinet to a pole and an opening that provides access into a cavity of the cabinet that is configured to house items. The pole base cabinet can have a second plate offset from the first plate. The second plate can have a plurality of apertures and an opening that provides access into the cavity of the cabinet that can house items. The pole base cabinet can have a first support panel, second support panel, and third support panel extending between and connecting to the first plate and the second plate. The first support panel and the second support panel can be offset from each other. The third support panel can extend between proximate an end of the first support panel and proximate an end of the second support panel. Each of the first support panel, second support panel, and third support panel can include an aperture. The pole base cabinet can have a first brace, second brace, and third brace that can extend between and connect to the first support panel and the second support panel. The second brace can be between the first and third braces. The pole base cabinet can have a peripheral wall that extends from a periphery of the first plate to a periphery of the second plate. The peripheral wall can have a main opening providing access into a cavity of the cabinet. The cabinet can have a door that can be coupled to the cabinet via a hinge. The door can rotate to inhibit access to the cavity of the cabinet.

In a configuration, the cabinet can have a bracket configured to receive a fan.

In a configuration, the plurality of apertures of the first plate form a square configuration.

In a configuration, the plurality of apertures of the second plate form a square configuration.

In a configuration, the cabinet can have a door frame with an opening therethrough. The door frame can be positioned on an inner side of the peripheral wall and around a periphery of the main opening. The cavity of the cabinet can be accessible through the main opening of the peripheral wall and opening of the door frame. The door can interface with the door frame with the door flush with the peripheral wall.

In a configuration, the first brace, second brace, and third brace extend from and are connected to the first plate.

In a configuration, the first brace, second brace, and third brace extend from the first plate to a position between the first plate and second plate.

In a configuration, the second brace extends between and is connected to a middle portion of each of the first support panel and the second support panel.

In a configuration, the each of the first brace, second brace, and third brace have a rectangular periphery.

In a configuration, the first brace, second brace, and third brace are the same size.

In a configuration, the first brace, second brace, and third brace have the same profile.

In a configuration, the first brace, second brace, and third brace are the same length.

In a configuration, the first brace, second brace, and third brace are the same height.

In a configuration, the first brace, second brace, and third brace are the same thickness.

In a configuration, the first brace, second brace, and third brace are at the same elevation.

In a configuration, the first brace, second brace, and third brace are connected to the first support panel and second support panel at same elevation.

In a configuration, the first brace, second brace, and third brace have a height that is less than one-fourth of a length of the first support panel, second support panel, and third support panel.

In a configuration, the first brace, second brace, and third brace have a height that is less than one-fourth of a distance between the top plate and the bottom plate.

In a configuration, first brace, second brace, and third brace extend from the top plate to a distance that is less than one-fourth of a distance between the top plate and the bottom plate.

In a configuration, the first brace, second brace, and third brace have a length that is the same as the width of the third support panel.

In a configuration, the first brace, second brace, and third brace are parallel to each other.

In a configuration, the first brace, second brace, and third brace are parallel to the third support panel.

In a configuration, the first brace, second brace, and third brace are perpendicular to the first support panel and second support panel.

In a configuration, the first brace and third brace are equidistantly spaced away from the second brace.

In a configuration, a method of assembling a pole base cabinet can include connecting a first support panel, second support panel, and third support panel to a top plate and bottom plate with the first and second support panels offset from each other and the third support panel perpendicularly extending between the first and second support panels. The method can include connecting a first brace to the first and second support panels proximate edges of the first and second support panels opposite the third support panel. The method can include connecting a second brace to midportions of the first and second support panels. The method can include connecting a third brace to the first and second support panels with the third brace positioned between and offset from the second brace and third support panel. The method can include attaching a peripheral wall to the top and bottom plates with the peripheral wall extending from a periphery of the top plate to a periphery of the bottom plate and defining a main opening that provides access into a cavity defined between the top plate, bottom plate, first support panel, second support panel, and third support panel, wherein the cavity is configured to house items.

In a configuration, the method can include coupling a door to the pole base cabinet with a hinge that is configured to allow the door to rotate to cover and uncover the main opening.

In a configuration, the method can include attaching a gasket around a periphery of the main opening. The gasket can engage with the door in a sealed interface.

In a configuration, the method can include forming an aperture in each of the first support panel, second support panel, and third support panel.

In a configuration, the method can include forming an opening in the top plate that can receive one or more wires therethrough.

In a configuration, the method can include forming an opening in the bottom plate that can receive one or more wires therethrough.

In a configuration, the method can include arranging the first brace, second brace, and third brace in parallel.

In a configuration, the method can include connecting the first brace, second brace, and third brace to the top plate.

In a configuration, the method can include positioning the first brace a distance from the second brace and positioning the third brace the same distance from the second brace.

In a configuration, the method can include positioning the first brace, second brace, and third brace perpendicular relative to the first support panel and second support panel.

In a configuration, the method can include attaching a bracket to the peripheral wall that can receive a fluid moving device that can move air within the cavity.

In a configuration, the method can include forming the first brace, second brace, and third brace to have a width that is less than one-fourth of a length of the first support panel, second support panel, and third support panel.

In a configuration, the method can include attaching the first brace, second brace, and third brace to the top plate with the first brace, second brace, and third brace extending in a direction of the bottom plate to a distance that is less than one-fourth of a length of the first support panel, second support panel, and third support panel.

In a configuration, the cabinet can include a first internal brace, second internal brace, third internal brace, fourth internal brace, fifth internal brace, and sixth internal brace. The first and second internal braces can extend between and be connected to the first brace and the second brace. The third and fourth internal braces can extend between and be connected to the second brace and the third brace. The fifth and sixth internal braces can extend between and be connected to the third brace and the third support panel.

In a configuration, the first internal brace, second internal brace, third internal brace, fourth internal brace, fifth internal brace, and sixth internal brace can be perpendicular to the third support panel and parallel to the first and second support panels.

In a configuration, the first internal brace, second internal brace, third internal brace, fourth internal brace, fifth internal brace, and sixth internal brace can be perpendicular to the first, second, and third braces.

In a configuration, the first internal brace, third internal brace, and fifth internal brace can be coplanar.

In a configuration, the second internal brace, fourth internal brace, and sixth internal can be coplanar.

In a configuration, the first internal brace and second internal brace can be parallel to and offset from each other.

In a configuration, the third internal brace and fourth internal brace can be parallel to and offset from each other.

In a configuration, the fifth internal brace and sixth internal brace can be parallel to and offset from each other.

In a configuration, the first internal brace, second internal brace, third internal brace, fourth internal brace, fifth internal brace, and sixth internal brace can extend from the first plate to a position between the first plate and the second plate.

In a configuration, the method can further include connecting a first internal brace and a second internal brace between the first brace and the second brace, connecting a third internal brace and a fourth internal brace between the second brace and the third brace, and connecting a fifth internal brace and a sixth internal brace between the third brace and the third support panel.

BRIEF DESCRIPTION OF THE DRAWINGS

The abovementioned and other features of the embodiments disclosed herein are described below with reference to the drawings of the embodiments. The illustrated embodiments are intended to illustrate, but not to limit, the scope of protection. Various features of the different disclosed embodiments can be combined to form further embodiments, which are part of this disclosure. In the drawings, similar elements may have reference numerals with the same last two digits.

FIG. 8 schematically illustrates a section view of the example pole base cabinet of FIG. 2.

FIG. 9 schematically illustrates a top view of the bottom plate of the example pole base cabinet of FIG. 2.

FIG. 23 schematically illustrates a perspective view of an example pole base cabinet.

FIG. 24 schematically illustrates a top view of the example pole base cabinet of FIG. 23.

FIG. 36 schematically illustrates an example pole base cabinet with the top plate removed.

FIG. 37 schematically illustrates a top view of the example pole base cabinet of FIG. 36 with the top plate removed.

DETAILED DESCRIPTION

Although certain embodiments and examples are described below, this disclosure extends beyond the specifically disclosed embodiments and/or uses and obvious modifications and equivalents thereof. Thus, it is intended that the scope of this disclosure should not be limited by any particular embodiments described below. Furthermore, this disclosure describes many embodiments in reference to light poles but any embodiment and modifications or equivalents thereof should not be limited to lighting fixtures. For example, embodiments disclosed herein may be used with stoplight poles, traffic sign poles, billboard poles, electricity poles, etc.

Overview

Figure 1:
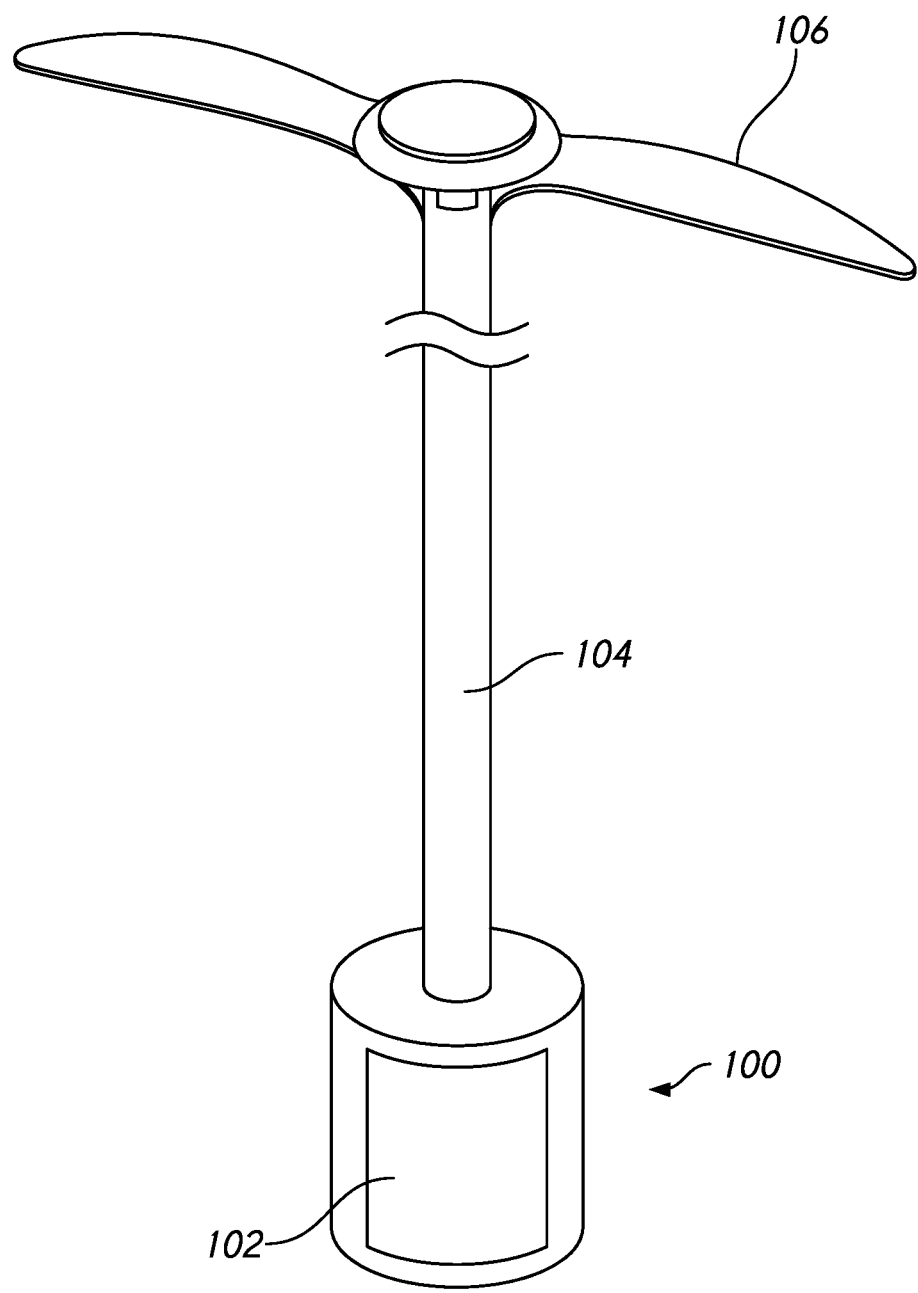
FIG. 1 schematically illustrates an example light pole mounted on a pole base cabinet.

FIG. 1 schematically illustrates an example of a pole base cabinet 100. A pole 104 is mounted onto the pole base cabinet, casing, housing, enclosure, locker 100 to support a light source 106 at an elevated height. The pole base cabinet 100 can have a cavity, lumen, chamber in which items can be positioned in, housed, stored. A door 102 can be opened and/or closed to obstruct or provide access to the cavity. The door 102 can be locked or unlocked. The pole base cabinet 100 can store components relating to a variety of applications, which can include at least electrical vehicle charging (which can include wireless EV charging), antennas, cameras (such as a camera switch), 50 AMP service, receptacle, transformers, high or low voltage system, surveillance, digital signage, Wi-Fi communication (such as extenders, 5G communication, mass notification (such as Blue Phone), emergency equipment, electrical outlets (which can be for holiday or temporary power), lighting control (such as switches, timers, relay, transformers, ballast, drivers, inverters, or other equipment), beacons, batteries or battery storage, solar power generation, broadcasting, speaker systems (which can include at least amplifiers, controllers, speakers, and/or other components), electrical charging (which can be for scooters, bikes, phones, and/or other electrically charged devices), drone technology, security, fiber optics (which can include splicing and terminating optical fibers), music reproduction, networks (which can include switches, routers, modems, patch panels, or other equipment), shelving, switch for converting signal from copper to fiber optics, disconnects, access points, wire mesh repeaters, emergency phone systems, general storage, house splice points, and/or other applications. The pole base cabinet 100 can be used for a variety of applications while still also functioning as a base for a light pole. Pole base cabinet 100 can include the same or similar features described or shown herein in reference to other configurations of pole base cabinets.

First Pole Base Cabinet Configuration—FIGS. 2-10

With reference to FIGS. 2-10, a pole base cabinet, casing, housing, enclosure, locker 200 is described. Pole base cabinet 200 can include substantially the same or similar features described or shown herein in reference to other configurations of pole base cabinets. Similarly numbered features can be the same or similar.

Figure 2:
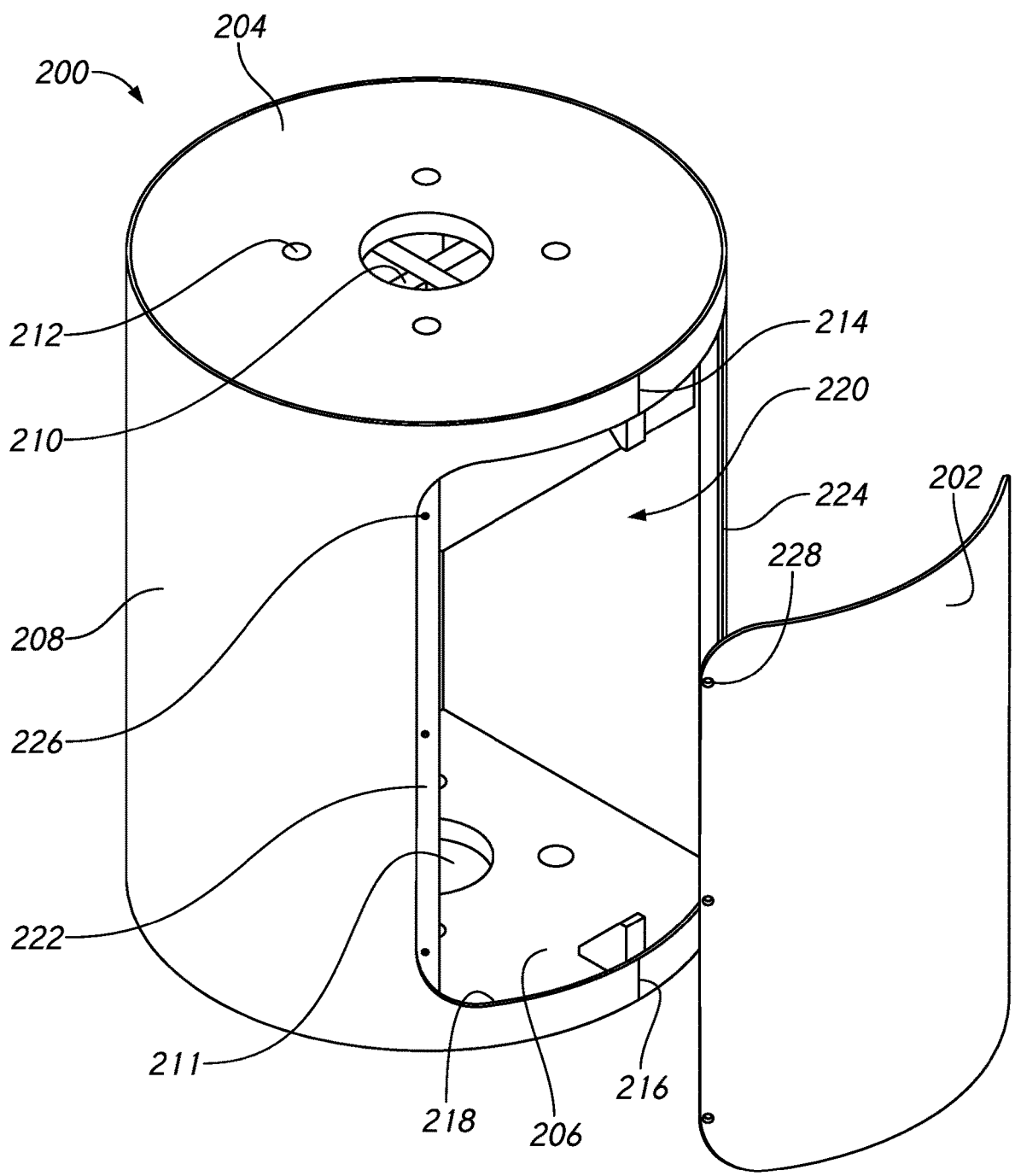
FIG. 2 schematically illustrates a perspective view of an example pole base cabinet with the door removed.
Figure 7:
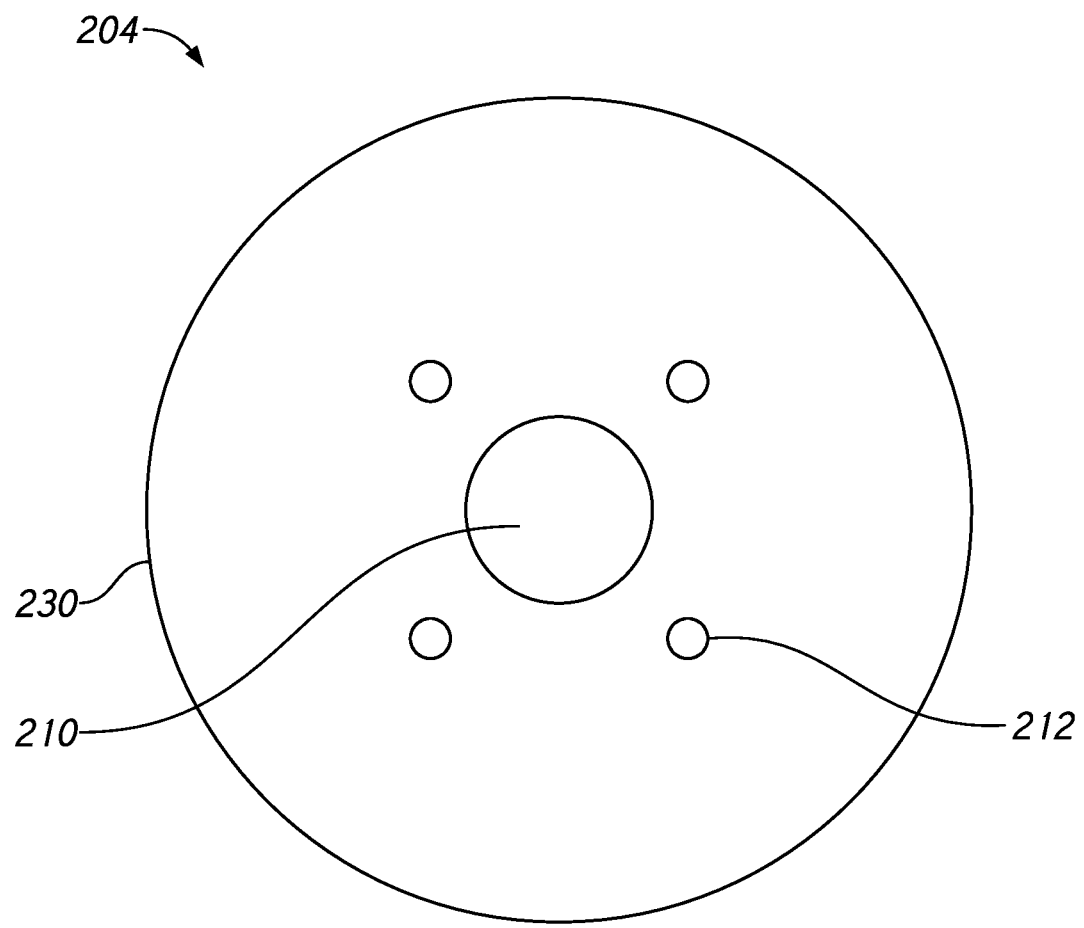
FIG. 7 schematically illustrates a top view of the top plate of the example pole base cabinet of FIG. 2.

As shown in FIG. 2, the pole base cabinet 200 can have a top or first plate, disc, sheet 204. The top plate 204 can have a periphery, perimeter 230 that is circular, as shown in FIG. 7, or polygonal, irregular, and/or others. The top plate 204 can have a plurality of apertures 212, which can include two, three, four, five, six, or more apertures 212. The apertures 212 can be used to secure the top plate 204 to a pole base, such as a pole base plate. For example, bolts attached to a pole base can extend through the apertures 212 and be secured with nuts, washers, and/or other similar devices, coupling the top plate 204 and pole base cabinet 200 to the pole base and pole. The apertures 212 can have a circular, polygonal, irregular, and/or other shape. The apertures 212 can all be the same or have varying shapes and/or sizes. The apertures 212 can be arranged in different configurations. For example, the apertures 212 can cooperate to form a square with each aperture 212 forming a corner thereof. The apertures 212 can cooperate to form a circular, polygonal, irregular, and/or other shape depending on what configuration is required or desired to couple to a corresponding pole base and/or is needed for structural integrity.

The top plate 204 can have an opening 210. The opening 210 can used to allow wiring, cords, optical fibers, and/or other devices through the top plate 204 and into and/or out of a cavity 220 of the pole base cabinet 200. The opening 210 can be centrally located. In a configuration, the opening 210 can be located at any position on the top plate 204. The opening 210 can have a circular, polygonal, irregular, and/or other shape. In a configuration, a periphery defining the opening 210 can be rounded to reduce abrasion on devices extending therethrough. In a configuration, a periphery defining the opening 210 can be coated or covered with a non-abrasive material to reduce abrasion on devices extending therethrough. In a configuration, the apertures 212 can be distributed around the opening 210, which can include circumferentially or radially distributed. In a configuration, the opening 210 can be located centered relative to the plurality of apertures 212. The opening 210 can be larger than each of the apertures 212.

The pole base cabinet 200 can have a bottom or second plate, disc, sheet 206. The bottom plate 206 can have a periphery 232 that is circular, as shown in FIG. 9, or polygonal, irregular, and/or others. The periphery 232 of the bottom plate 206 can be the same as the periphery 230 of the top plate 204. The periphery 232 of the bottom plate 206 can be different than the periphery 230 of the top plate 204. The bottom plate 206 can have a plurality of apertures 254, which can include two, three, four, five, six, or more apertures 254. The apertures 254 can be used to secure the bottom plate 206 to a footing or base, such as a concrete base or other support or structure, which can include a footing above grade or below grade. For example, bolts or an anchor attached to the footing and/or rebar can extend through the apertures 254 and be secured with nuts, washers, and/or other similar devices, coupling the bottom plate 206 and the pole base cabinet 200 to the footing. The plurality of apertures 254 can be the same as the plurality of apertures 212. The apertures 254 can have a circular, polygonal, irregular, and/or other shape. The apertures 254 can all be the same or have varying shapes and/or sizes. The apertures 254 can be arranged in different configurations. The apertures 254 can cooperate to form a square with each aperture 254 forming a corner thereof. The apertures 254 can cooperate to form a circular, polygonal, irregular, and/or other shape depending on what configuration is require to couple to a corresponding footing or bolt arrangement. In a configuration, the top plate 204 can be the same as the bottom plate 206.

The bottom plate 206 can have an opening 211. The opening 211 can used to allow wiring, cords, optical fibers, and/or other devices through the bottom plate 206 and into and/or out of the cavity 220 of the pole base cabinet 200. For example, wiring and/or cables can be routed through conduits in a footing or base upon which the pole base cabinet 200 is mounted and extend through the opening 211 and into the cavity 220. The wiring and/or cables can be used to supply electrical power to components/items stored in the cavity 220, components/items stored outside the cavity 220, and/or a light source mounted on a pole that is coupled to the pole base cabinet 200. The opening 211 can be centrally located. In a configuration, the opening 211 can be located at any position on the bottom plate 206. The opening 211 can have a circular, polygonal, irregular, and/or other shape. In a configuration, a periphery defining the opening 211 can be rounded to reduce abrasion on devices extending therethrough. In a configuration, a periphery defining the opening 211 can be coated or covered with a non-abrasive material to reduce abrasion on devices extending therethrough. In a configuration, the apertures 254 can be distributed around the opening 211, which can include circumferentially or radially distributed. In a configuration, the opening 211 can be located centered relative to the plurality of apertures 254. The opening 211 can be larger than each of the apertures 254. The opening 211 can be the same as or different than the opening 210. In a configuration, the opening 211 is larger than the opening 210.

Figure 4:
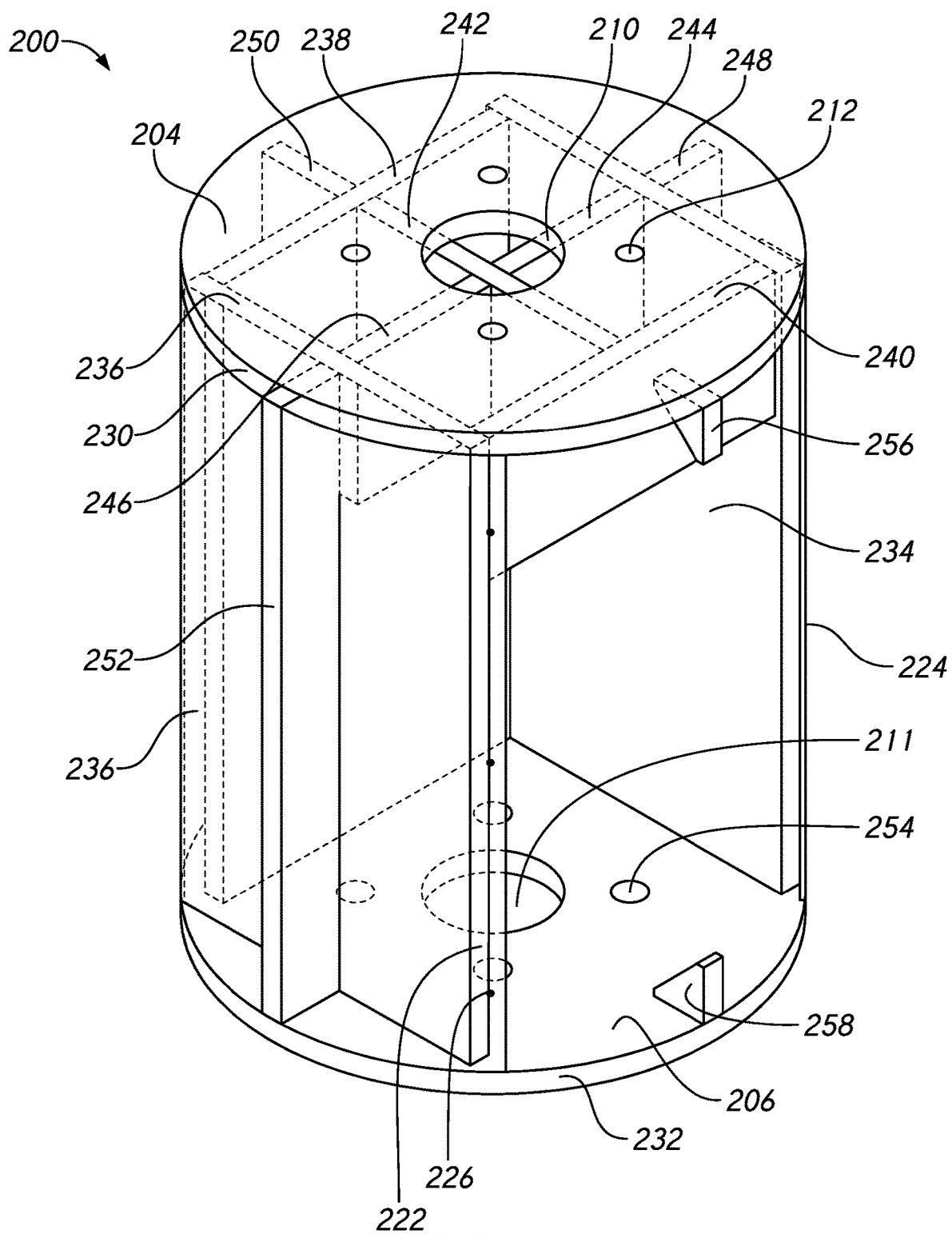
FIG. 4 schematically illustrates a perspective view of the example pole base cabinet of FIG. 2 with the peripheral wall removed.

The top plate 204 and the bottom plate 206 can be offset and/or parallel from each other, as shown in FIG. 4. The top plate 204 and the bottom plate 206 can define ends and/or opposing ends of the pole base cabinet 200. The top plate 204 and the bottom plate 206 can be flat. In a configuration, the top plate 204 and the bottom plate 206 can include recesses, curves, and/or contours. The top plate 204 and the bottom plate 206 can be positioned on a center-longitudinal axis of the pole base cabinet 200. The top plate and the bottom plate 206 can be centered on a center-longitudinal axis of the pole base cabinet 200. In a configuration, the top plate 204 can be the same as the bottom plate 206. This can be advantageous when more wiring or cables are directed into the cavity 220 through the bottom plate 206 than out of the cavity 220 through the top plate 204. In a configuration, the top plate 204 does not have an opening 210 and/or the bottom plate 206 does not have an opening 211.

Figure 3:
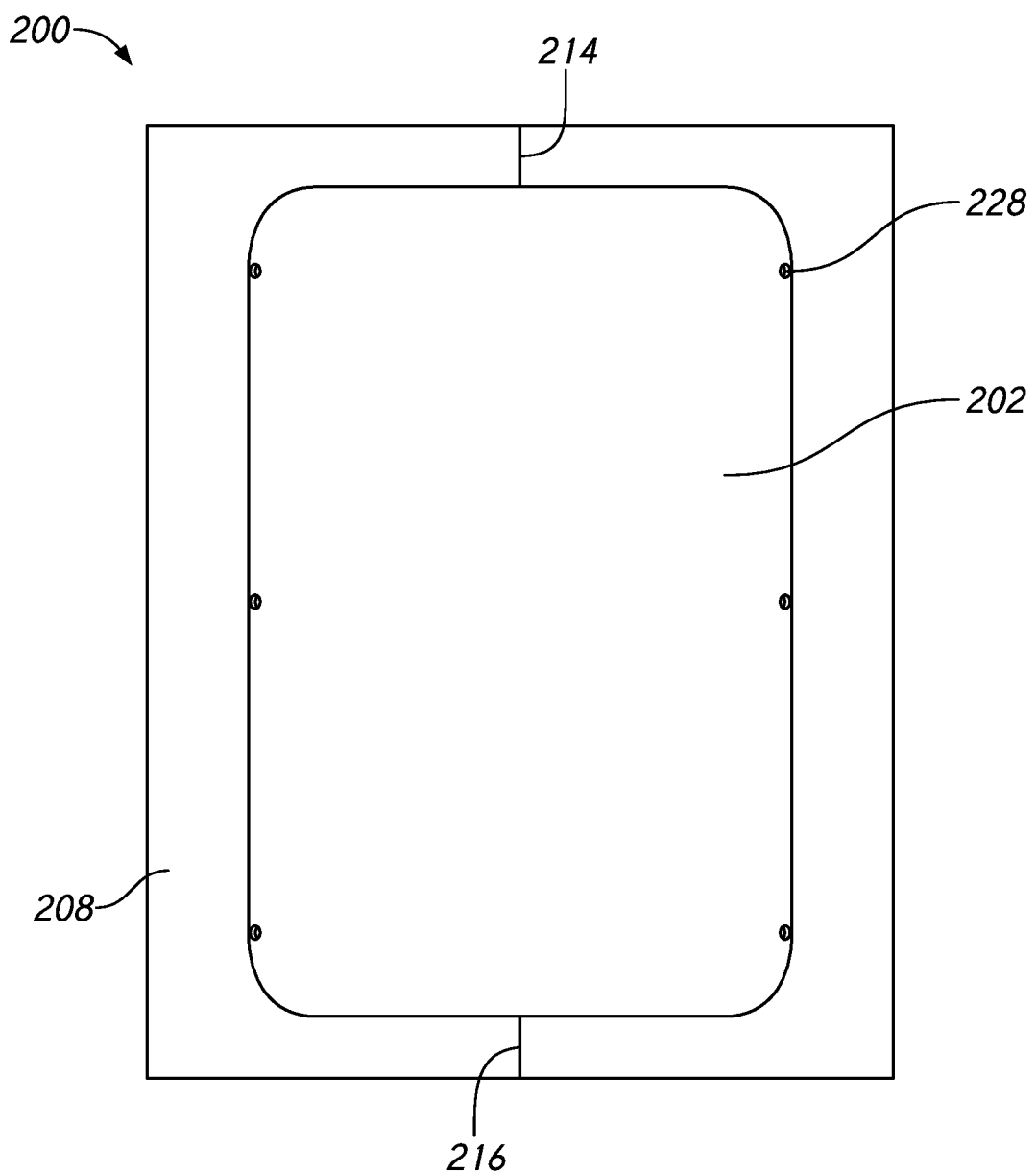
FIG. 3 schematically illustrates a front view of the example pole base cabinet of FIG. 2 with the door coupled to the pole base cabinet.

The pole base cabinet 200 can have a peripheral wall, side, surface 208, which can also be referred to as a skin and/or wall 208, as illustrated in FIGS. 2 and 3. The peripheral wall 208 can extend from and/or be coupled, which can include directly, rigidly, or fixedly connected, to the top plate 204 to the bottom plate 206. The peripheral wall 208 can extend from and/or be coupled, which can include directly, rigidly, or fixedly connected, to the periphery 230 of the top plate 204 to and/or proximate a periphery 232 of the bottom plate 206. The peripheral wall 208 can extend and/or be coupled, which can include directly, rigidly, or fixedly connected, around the periphery 230 of the top plate 204 and/or periphery 232 of the bottom plate 206. The peripheral wall 208 can define a periphery of the pole base cabinet 200, which can be circular, polygonal, irregular, and/or other shapes. The peripheral wall 208 can define a periphery of the pole base cabinet 200 that can be the same as or similar to the shape of the periphery 230 of the top plate 204 and/or periphery 232 of the bottom plate 206. The peripheral wall 208 can define a rounded or circular periphery of the pole base cabinet 200, which can be similar to a tube. In a configuration, the peripheral wall 208 can be manipulated from a disassembled configuration, shown in FIG. 10, to the configuration shown in FIG. 2 by forming the peripheral wall 208 into the rounded tube-like configuration such that the peripheral wall 208 can be coupled to or proximate itself at the top joint, abutment, seam, junction, connection 214 and the bottom joint, abutment, seam, junction, connection 216. In a configuration, the peripheral wall 208 can be manufactured in the configuration illustrated in FIG. 2 such that there is no top joint 214 and/or bottom joint 216.

The peripheral wall 208 can define a main opening 218, as shown in FIG. 2. The main opening 218 can provide access into a cavity 220 of the pole base cabinet 200. The cavity 220 can be centrally located in the pole base cabinet 200. The cavity 220 can house items and/or components, which can include the items and/or components detailed herein. The main opening 218 can be varying sizes and shapes, which can include circular, polygonal, irregular, and/or others. In a configuration, the main opening 218 can be rectangular in shape with rounded corners. The main opening 218 can extend to proximate the top plate 204 and proximate the bottom plate 206.

The main opening 218 can be covered with a door 202, as shown in FIG. 3, permanently or temporarily preventing and/or restricting access to the cavity 220. The door 202 can releasably coupled to the pole base cabinet 200, periphery of the main opening 218, and/or first flange 224 and/or second flange 222. The main opening 218 can be uncovered with the door 202 removed, as shown in FIG. 2, to allow access to the cavity 220. The door 202 can be locked and/or unlocked. The door 202 can include vents. In a configuration, the peripheral wall 208 can include vents. The door 202 can include a plurality of door apertures 228, which can include two, three, four, five, six, seven, eight, or more door apertures 228. The door apertures 228 can be used to couple the door 202 to the pole base cabinet 200. The door apertures 228 can correspond to flange apertures 226 positioned on a first flange, rim, border, frame, lip 224 and/or second flange, rim, border, frame, lip 222 of the pole base cabinet 200. The door 202 can be coupled to the pole base cabinet 200 by placing the door 202 over the main opening 218 such that the door apertures 228 are aligned with the flange apertures 226 and inserting a bolt, screw, rivet, and/or other similar device through the door apertures 228 and the flange apertures 226. In a configuration, the door 202 can be coupled to the pole base cabinet 200 with a hinge allowing the door 202 to be swung open and closed while remaining coupled to the pole base cabinet 200, which can include a hinge positioned on the first flange 224 and/or second flange 222. The door 202 can have a curvature matching a curvature of the peripheral wall 208. The door 202 can have a perimeter or periphery that matches the main opening 218 such that the door 202 can cover the main opening 218. The door 202 can be a thickness matching that of the peripheral wall 208.

Figure 6:
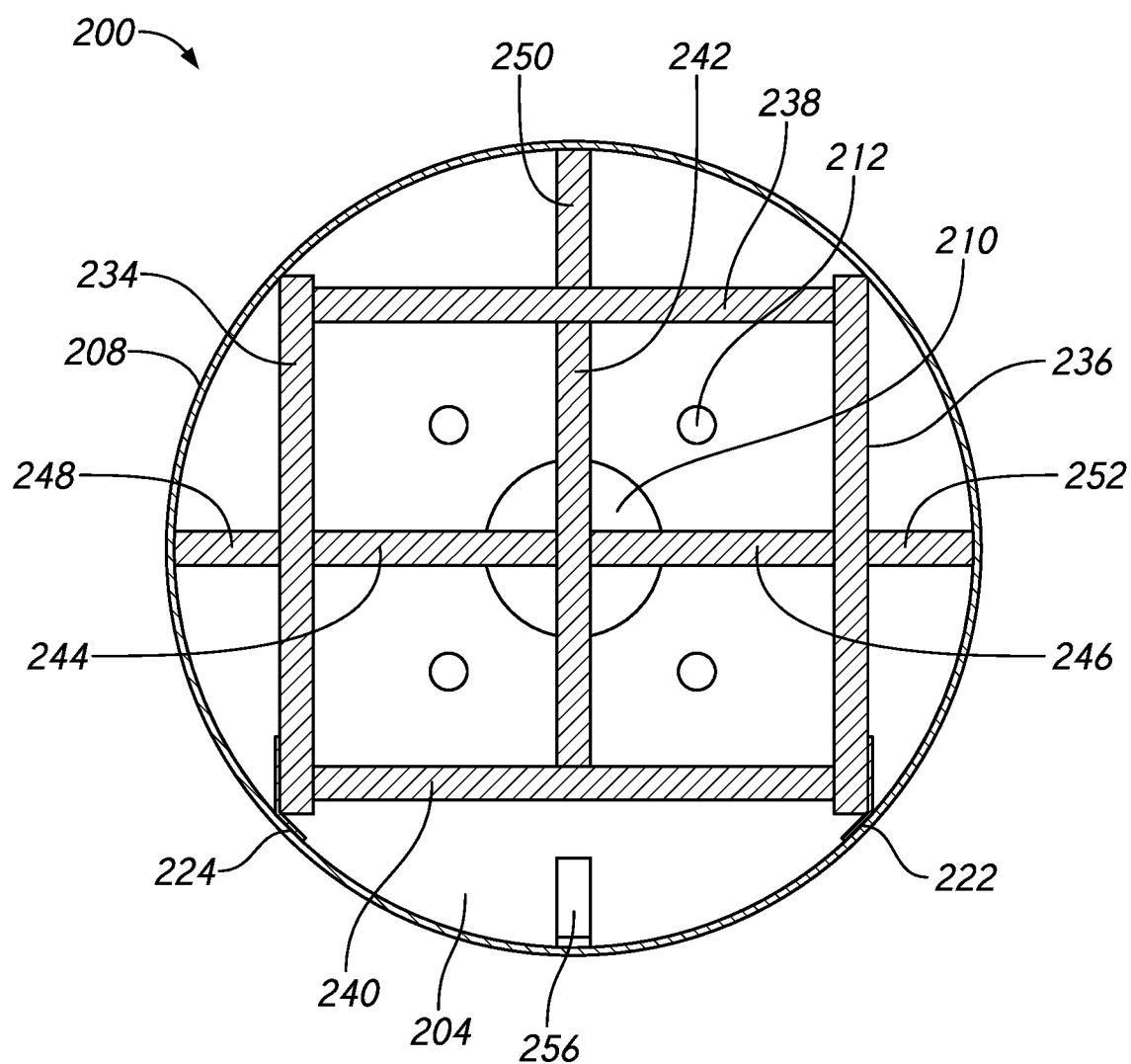
FIG. 6 schematically illustrates a section view of the example pole base cabinet of FIG. 2.

As shown in FIGS. 4, 6, and 8, the pole base cabinet 200 can include a frame providing structural support and/or integrity, wherein the frame can have a plurality of support panels, plurality of internal stiffening panels, and/or a plurality of external stiffening panels. The peripheral wall 208 can be coupled, which can include directly, rigidly, or fixedly connected, to portions of the frame, which can include welded.

The plurality of support panels can include a first support panel, plank, girder, joist, pillar, plank, brace, beam 234, second support panel, plank, girder, joist, pillar, plank, brace, beam 236, and/or a third support panel, plank, girder, joist, pillar, plank, brace, beam 238. As shown in FIG. 4, the first support panel 234, second support panel 236, and/or a third support panel 238 can at least partially define the cavity 220. The first support panel 234, second support panel 236, and/or a third support panel 238 can extend between and/or be coupled, which can include directly, rigidly, or fixedly connected, to the top plate 204 and the bottom plate 206. The first support panel 234, second support panel 236, and/or a third support panel 238 can form three sides of a rectangular-like structure surrounding or at least partially surrounding the cavity 220. The first support panel 234, second support panel 236, and/or a third support panel 238 can be the same, similar, or different size and shape. The first support panel 234, second support panel 236, and/or a third support panel 238 can be rectangular panels. The first support panel 234, second support panel 236, and/or a third support panel 238 can be straight or curved. The first support panel 234 can be offset from and/or parallel to the second support panel 236.

The third support panel 238 can extend between and/or be coupled, which can include directly, rigidly, or fixedly connected, to the first support panel 234 and the second support panel 236. The third support panel 238 can extend between and/or be coupled to, which can include directly, rigidly, or fixedly connected, ends or proximate ends of the first support panel 234 and second support panel 236. The third support panel 238 can extend between and/or be coupled, which can include directly, rigidly, or fixedly connected, to ends or proximate ends of the first support panel 234 and second support panel 236 that are opposite the main opening 218 and/or first flange 224 and/or second flange 222. The third support panel 238 can be positioned opposite the main opening 218. The third support panel 238 can be perpendicular to the first support panel 234 and/or second support panel 236.

The pole base cabinet 200 can include a plurality of internal stiffening panels, planks, girders, joists, pillars, planks, braces, beams, which can include the first internal stiffening panel 240, second internal stiffening panel 242, third internal stiffening panel 244, and/or fourth internal stiffening panel 246. The first internal stiffening panel 240, second internal stiffening panel 242, third internal stiffening panel 244, and/or fourth internal stiffening panel 246 can be coupled, which can include directly, rigidly, or fixedly connected, to the top plate 204. The first internal stiffening panel 240, second internal stiffening panel 242, third internal stiffening panel 244, and/or fourth internal stiffening panel 246 can extend equidistantly or to different distances away from the top plate 204. The first internal stiffening panel 240, second internal stiffening panel 242, third internal stiffening panel 244, and/or fourth internal stiffening panel 246 can extend to a position between the top plate 204 and the bottom plate 206, providing room for items to be store in the cavity 220. The first internal stiffening panel 240, second internal stiffening panel 242, third internal stiffening panel 244, and/or fourth internal stiffening panel 246 can be rectangular, square, and/or other shaped panels. The first internal stiffening panel 240, second internal stiffening panel 242, third internal stiffening panel 244, and/or fourth internal stiffening panel 246 can be straight or curved.

The first internal stiffening panel 240 can extend between and/or be coupled to, which can include directly, rigidly, or fixedly connected, the first support panel 234 and the second support panel 236. The first internal stiffening panel 240 can extend between and/or be coupled to, which can include directly, rigidly, or fixedly connected, ends or proximate ends of the first support panel 234 and the second support panel 236. The first internal stiffening panel 240 can be positioned proximate the main opening 218. The first internal stiffening panel 240 can be positioned opposite the third support panel 238. The first internal stiffening panel 240 can be offset from and/or parallel to the third support panel 238. The first internal stiffening panel 240 can be parallel to the third support panel 238. The opening 210 and/or plurality of apertures 212 can be positioned between the first internal stiffening panel 240 and the third support panel 238. The first internal stiffening panel 240 can be a length that can be longer than that of the second internal stiffening panel 242, third internal stiffening panel 244, and/or fourth internal stiffening panel 246.

The second internal stiffening panel 242 can extend between and/or be coupled to, which can include directly, rigidly, or fixedly connected, the first internal stiffening panel 240 and the third support panel 238. The second internal stiffening panel 242 can extend from and/or be coupled, which can include directly, rigidly, or fixedly connected, to a middle portion of the first internal stiffening panel 240 to a middle portion of the third support panel 238. The second internal stiffening panel 242 can extend through a central longitudinal axis of the pole base cabinet 200. The second internal stiffening panel 242 can extend across the opening 210 of the top plate 204. The second internal stiffening panel 242 can extend between the plurality of apertures 212. The second internal stiffening panel 242 can extend between the plurality of apertures 212, such that two of the plurality of apertures 212 are on one side of the second internal stiffening panel 242 and two of the plurality of apertures 212 are on another side of the second internal stiffening panel 242. The second internal stiffening panel 242 can be positioned between the first support panel 234 and the second support panel 236. The second internal stiffening panel 242 can be offset from and/or parallel to the first support panel 234 and the second support panel 236. The second internal stiffening panel 242 can be equidistantly spaced away from the first support panel 234 and the second support panel 236. The second internal stiffening panel 242 can have a length that can be smaller than that of the first internal stiffening panel 240 and/or longer than that of the third internal stiffening panel 244 and/or fourth internal stiffening panel 246.

The third internal stiffening panel 244 can extend between and/or be coupled to, which can include directly, rigidly, or fixedly connected, the first support panel 234 and the second internal stiffening panel 242. The third internal stiffening panel 244 can extend between and/or be coupled to, which can include directly, rigidly, or fixedly connected, a middle portion of the first support panel 234 and a middle portion of the second internal stiffening panel 242. The third internal stiffening panel 244 can be positioned between the first internal stiffening panel 240 and the third support panel 238. The third internal stiffening panel 244 can be offset from and/or parallel to the first internal stiffening panel 240 and the third support panel 238. The third internal stiffening panel 244 can be equidistantly spaced from the first internal stiffening panel 240 and the third support panel 238. The third internal stiffening panel 244 can couple to the second internal stiffening panel 242 at a position below and/or proximate the opening 210. The third internal stiffening panel 244 can extend between the plurality of apertures 212. The third internal stiffening panel 244 can extend between the plurality of apertures 212, such that one of the plurality of apertures 212 is on one side of the third internal stiffening panel 244 and another of the plurality of apertures 212 is on another side of the third internal stiffening panel 244.

The fourth internal stiffening panel 246 can extend between and/or be coupled to, which can include directly, rigidly, or fixedly connected, the second support panel 236 and the second internal stiffening panel 242. The fourth internal stiffening panel 246 can extend between and/or be coupled to, which can include directly, rigidly, or fixedly connected, a middle portion of the second support panel 236 and a middle portion of the second internal stiffening panel 242. The fourth internal stiffening panel 246 can be positioned between the first internal stiffening panel 240 and the third support panel 238. The fourth internal stiffening panel 246 can be offset from and/or parallel to the first internal stiffening panel 240 and the third support panel 238. The fourth internal stiffening panel 246 can be equidistantly spaced from the first internal stiffening panel 240 and the third support panel 238. The fourth internal stiffening panel 246 can be coupled to, which can include directly, rigidly, or fixedly connected, the second internal stiffening panel 242 at a position below and/or proximate the opening 210. The fourth internal stiffening panel 246 can extend between the plurality of apertures 212. The fourth internal stiffening panel 246 can extend between the plurality of apertures 212, such that one of the plurality of apertures 212 is on one side of the fourth internal stiffening panel 246 and another of the plurality of apertures 212 is on another side of the fourth internal stiffening panel 246. The fourth internal stiffening panel 246 can be positioned on an opposing side of the second internal stiffening panel, relative to the third internal stiffening panel 244. The fourth internal stiffening panel 246 can be the same size and/or shape as the third internal stiffening panel 244.

The pole base cabinet 200 can include a plurality of external stiffening panels, planks, girders, joists, pillars, planks, braces, beams, which can include a first external stiffening panel 248, second external stiffening panel 252, and/or a third external stiffening panel 250. The first external stiffening panel 248, second external stiffening panel 252, and/or a third external stiffening panel 250 can extend between and/or be coupled to, which can include directly, rigidly, or fixedly connected, the top plate 204 and the bottom plate 206. The first external stiffening panel 248, second external stiffening panel 252, and/or a third external stiffening panel 250 can be positioned outside the cavity 220. The first external stiffening panel 248, second external stiffening panel 252, and/or a third external stiffening panel 250 can be the same, similar, or different size and shape. In a configuration, the first external stiffening panel 248, second external stiffening panel 252, and/or a third external stiffening panel 250 can be rectangular panels. In a configuration, the first external stiffening panel 248, second external stiffening panel 252, and/or a third external stiffening panel 250 can be the same length. In a configuration, the first external stiffening panel 248 and second external stiffening panel 252 can be the same size and shape. In a configuration, the third external stiffening panel 250 has a width that can be greater than a width of the first external stiffening panel 248 and/or second external stiffening panel 252.

The first external stiffening panel 248 can extend from and/or be coupled to, which can include directly, rigidly, or fixedly connected, the first support panel 234 to the periphery 230 of the top plate 204 and/or the periphery 232 of the bottom plate 206. The first external stiffening panel 248 can extend between and/or be coupled to, which can include directly, rigidly, or fixedly connected, the first support panel 234 and the peripheral wall 208. The first external stiffening panel 248 can be positioned at and/or be coupled to, which can include directly, rigidly, or fixedly connected, a middle portion of the first support panel 234. The first external stiffening panel 248 can be positioned on and/or be coupled to, which can include directly, rigidly, or fixedly connected, an opposing side of the first support panel 234, relative to the third internal stiffening panel 244.

The second external stiffening panel 252 can extend from and/or be coupled to, which can include directly, rigidly, or fixedly connected, the second support panel 236 to the periphery 230 of the top plate 204 and/or the periphery 232 of the bottom plate 206. The second external stiffening panel 252 can extend between and/or be coupled to, which can include directly, rigidly, or fixedly connected, the second support panel 236 and the peripheral wall 208. The second external stiffening panel 252 can be positioned at and/or be coupled to, which can include directly, rigidly, or fixedly connected, a middle portion of the second support panel 236. The second external stiffening panel 252 can be positioned on and/or be coupled to, which can include directly, rigidly, or fixedly connected, an opposing side of the second support panel 236, relative to the fourth internal stiffening panel 246.

The third external stiffening panel 250 can extend from and/or be coupled to, which can include directly, rigidly, or fixedly connected, the third support panel 238 to the periphery 230 of the top plate 204 and/or the periphery 232 of the bottom plate 206. The third external stiffening panel 250 can extend between the third support panel 238 and the peripheral wall 208. The third external stiffening panel 250 can be positioned at and/or be coupled to, which can include directly, rigidly, or fixedly connected, a middle portion of the third support panel 238. The third external stiffening panel 250 can be positioned on and/or be coupled to, which can include directly, rigidly, or fixedly connected, an opposing side of the third support panel 238, relative to the second internal stiffening panel 242.

Figure 5:
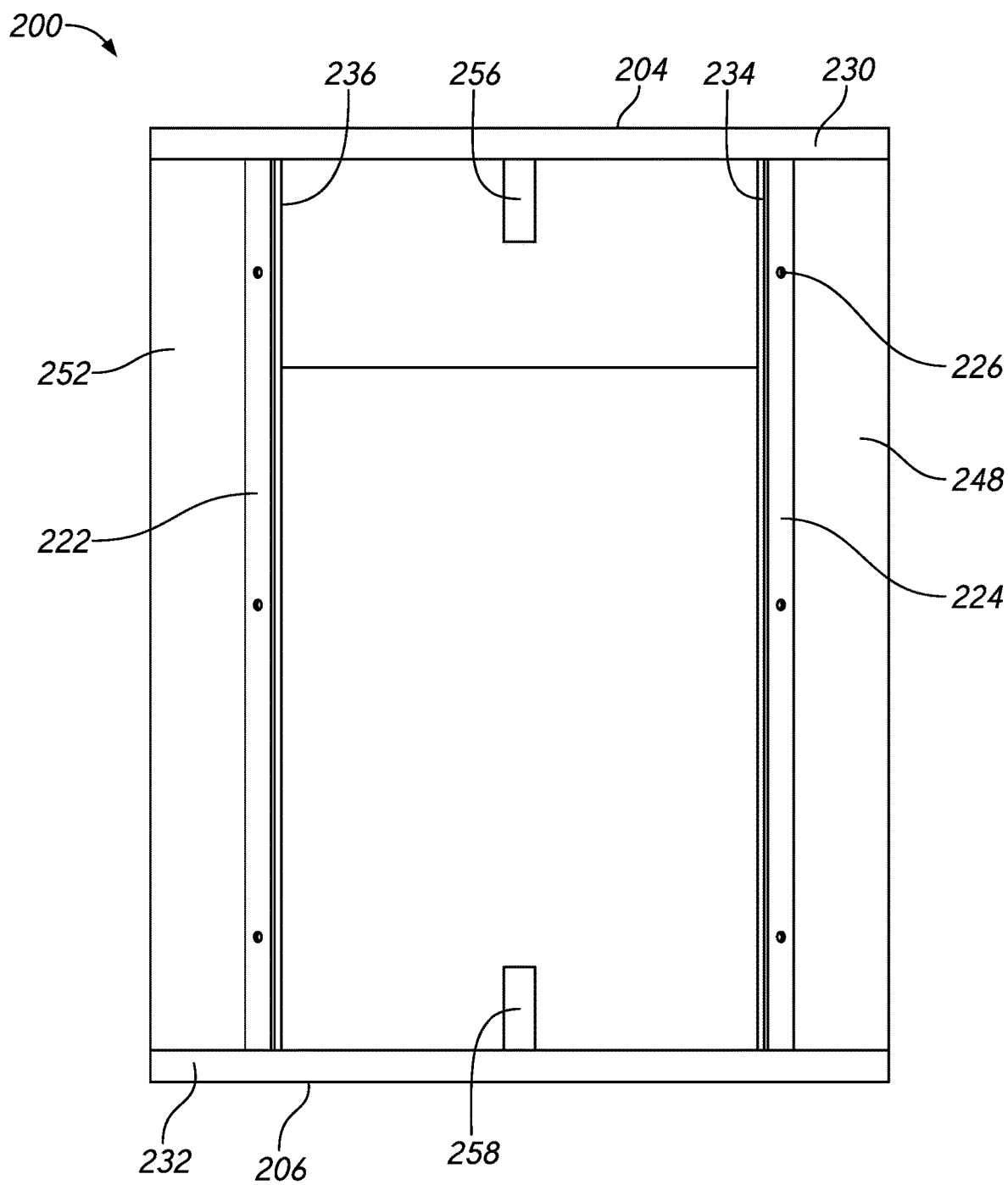
FIG. 5 schematically illustrates a front view of the example pole base cabinet of FIG. 2.

The pole base cabinet 200 can have a top tab, projection, protrusion, boss, stiffener 256 and/or a bottom tab, projection, protrusion, boss, stiffener 258, as shown in FIG. 4. The top tab 256 and bottom tab 258 can be the same or different size and/or shape. The top tab 256 and/or bottom tab 258 can be triangular in shape. The top tab 256 can be coupled to, which can include directly, rigidly, or fixedly connected, the top plate 204. The bottom tab 258 can be coupled to, which can include directly, rigidly, or fixedly connected, the bottom plate 206. As illustrated in FIG. 5, the top tab 256 and/or bottom tab 258 can be equidistantly spaced relative to the first support panel 234 and/or the second support panel 236. The top tab 256 and/or bottom tab 258 can extend to and/or be coupled to, which can include directly, rigidly, or fixedly connected, the peripheral wall 208. The top tab 256 can extend to the periphery 230 of the top plate 204. The bottom tab 258 can extend to the periphery 232 of the bottom plate 206. The top tab 256 can extend into the main opening 218 such that the top tab 256 can engage with the door 202. The bottom tab 258 can extend into the main opening 218 such that the bottom tab 28 can engage with the door 202. The top tab 256 and/or bottom tab 258 can extend to and/or be couple to the peripheral wall 208.

As detailed above, the pole base cabinet can have a first flange 224 and/or second flange 222. The first flange 224 and/or second flange 222 can extend between and/or be coupled to, which can include directly, rigidly, or fixedly connected, the top plate 204 and the bottom plate 206. The first flange 224 and/or second flange 222 be positioned proximate the main opening 218 such that at least a portion of the first flange 224 and/or second flange 222 extends into the main opening 218. The first flange 224 and/or second flange 222 can have flange apertures 226 that correspond to door apertures 228 of the door 202. The first flange 224 and/or the second flange 222 can each have one, two, three, four, five, six, or more flange apertures 226. The first flange 224 can be coupled to, which can include directly, rigidly, or fixedly connected, the first support panel 234. The first flange 224 can be coupled to, which can include directly, rigidly, or fixedly connected, an end or proximate an end of the first support panel 234. The second flange 222 can be coupled to, which can include directly, rigidly, or fixedly connected, the second support panel 236. The second flange 222 can be coupled to, which can include directly, rigidly, or fixedly connected, an end or proximate an end of the second support panel 236. In a configuration, the first flange 224 and/or second flange 222 can be coupled to—such as directly, rigidly, or fixedly connected, proximate, and/or engaging with the peripheral wall 208. In a configuration, the first flange 224 and/or second flange 222 can be coupled to, which can include directly, rigidly, or fixedly connected, external surfaces of the first support panel 434 and the second support panel 436.

The top tab 256, bottom tab 258, second internal stiffening panel 242, and/or third external stiffening panel 250 can be coplanar with a central plane of the pole base cabinet 200. The second external stiffening panel 252, fourth internal stiffening panel 246, third internal stiffening panel 244, and/or first external stiffening panel 248 can be coplanar with another central plane of the pole base cabinet 200. In a configuration, any one or multiple of the first support panel 234, second support panel 236, third support panel 238, first internal stiffening panel 240, second internal stiffening panel 242, third internal stiffening panel 244, fourth internal stiffening panel 246, first external stiffening panel 248, second external stiffening panel 252, third external stiffening panel 250, top tab 256, and/or bottom tab can be omitted from the pole base cabinet 200.

As shown in FIG. 6, the first support panel 234 and second support panel 236 can be positioned such that the ends or a portion of the ends of the first support panel 234 and second support panel 236 engage with, are proximate to, and/or are coupled to, which can include directly, rigidly, or fixedly connected, the peripheral wall 208. The first support panel 234 and second support panel 236 can be positioned such that the ends or a portion of the ends of the first support panel 234 and second support panel 236 extend to the periphery 230 of the top plate 204 and/or bottom plate 206. In a configuration, the first support panel 234 and second support panel 236 can be coupled to, which can include directly, rigidly, or fixedly connected, the peripheral wall 208. The third support panel 238 and/or first internal stiffening panel 240 can be proximate the ends of, which can include inset from the ends, and coupled to, which can include directly, rigidly, or fixedly connected, the first support panel 234 and second support panel 236.

Figure 10:
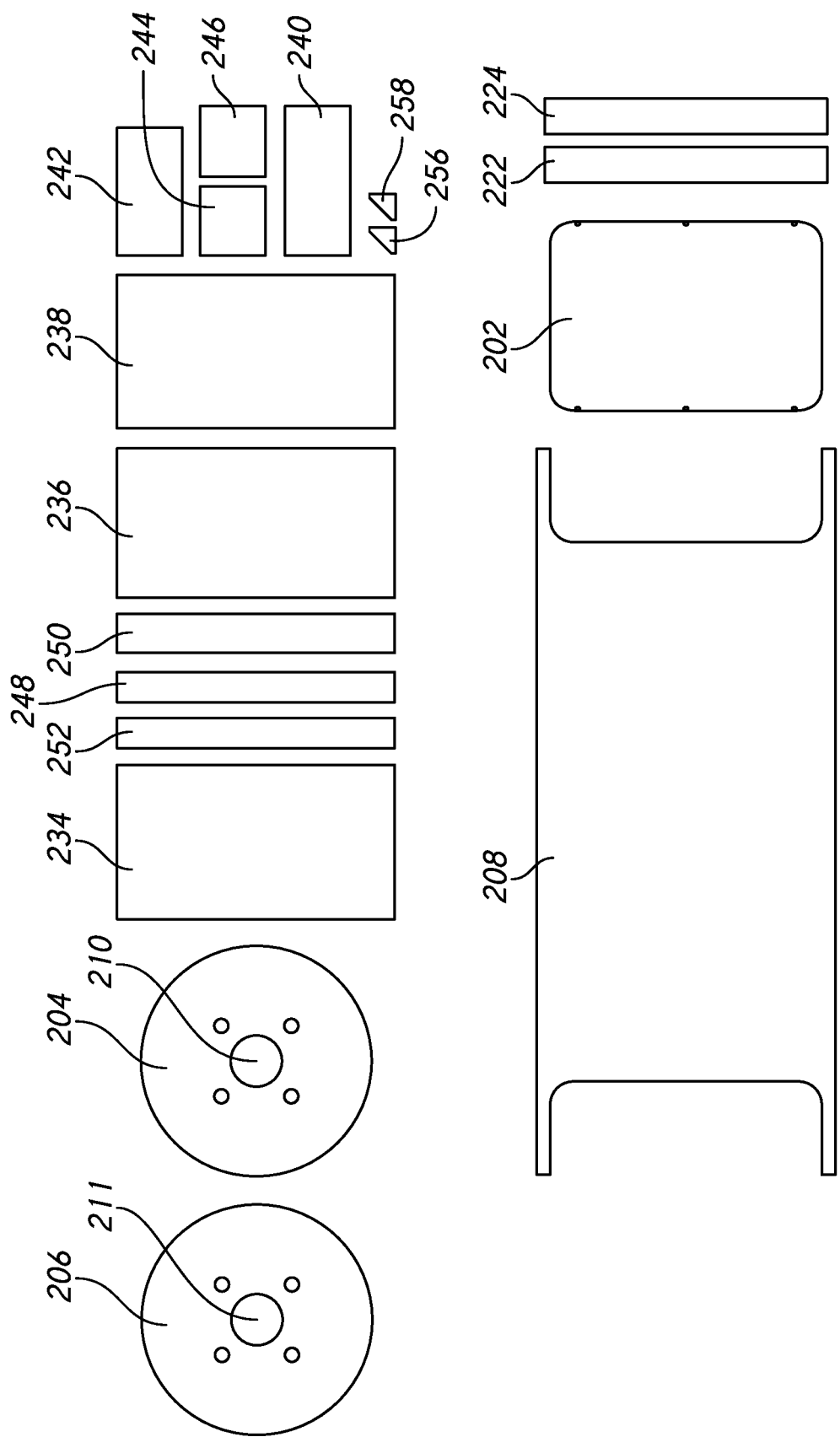
FIG. 10 schematically illustrates a disassembled view of the example pole base cabinet of FIG. 2.

FIG. 10 shows the pole base cabinet 200 in a disassembled state. To manufacture and/or assemble the pole base cabinet 200, the components of the pole base cabinet 200 can be positioned and/or coupled, which can include directly, rigidly, or fixedly connected, together in a configuration described herein. For example, the first support panel 234, second support panel 236, and/or third support panel 238 can be positioned between and/or coupled to, which can include directly, rigidly, or fixedly connected, the top plate 204 and bottom plate 206 in a configuration detailed herein. The first internal stiffening panel 240 can be positioned between and/or coupled to, which can include directly, rigidly, or fixedly connected, the first support panel 234 and second support panel 236 in a configuration detailed herein. The second internal stiffening panel 242 can be positioned between and/or coupled to, which can include directly, rigidly, or fixedly connected, the first internal stiffening panel 240 and the third support panel 238 in a configuration detailed herein. The third internal stiffening panel 244 can be positioned between and/or coupled to the first support panel 234 and the second internal stiffening panel 242 in a configuration detailed herein. The fourth internal stiffening panel 246 can be positioned between and/or coupled to, which can include directly, rigidly, or fixedly connected, the second support panel 236 and the second internal stiffening panel 242 in a configuration detailed herein. The first internal stiffening panel 240, second internal stiffening panel 242, third internal stiffening panel 244, and fourth internal stiffening panel 246 can be coupled to, which can include directly, rigidly, or fixedly connected, the top plate 204 and positioned between the top plate 204 and the bottom plate 206 in a configuration detailed herein.

The first external stiffening panel 248, second external stiffening panel 252, and third external stiffening panel 250 can be positioned between and/or coupled to, which can include directly, rigidly, or fixedly connected, the top plate 204 and the bottom plate 206 in a configuration detailed herein. The first external stiffening panel 248 can be coupled to, which can include directly, rigidly, or fixedly connected, the first support panel 234 in a configuration detailed herein. The second external stiffening panel 252 can be coupled to, which can include directly, rigidly, or fixedly connected, the second support panel 236. The third external stiffening panel 250 can be coupled to, which can include directly, rigidly, or fixedly connected, the third support panel 238 in a configuration detailed herein. The top tab 256 can be coupled to, which can include directly, rigidly, or fixedly connected, the top plate 204 in a configuration detailed herein. The bottom tab 258 can be coupled to, which can include directly, rigidly, or fixedly connected, the bottom plate 206 in a configuration detailed herein. The peripheral wall 208 can be formed, bent, curved, manipulated, deformed, and/or otherwise treated to wrap around the periphery 230 of the top plate 204 and the periphery 232 of the bottom plate 206. The peripheral wall 208 can be fixed in the formed, bent, curved, manipulated, deformed, and/or otherwise treated state by coupling the peripheral wall 208 to itself at top joint 214 and bottom joint 216, as shown in FIG. 2. In a configuration, the peripheral wall 208 can be fixed in the formed, bent, curved, manipulated, deformed, and/or otherwise treated state by coupling the peripheral wall 208 to the top plate 204 and bottom plate 206 such that the peripheral wall can be joined, which can include directly, rigidly, or fixedly connected, or proximate its opposite end at the top joint 214 and/or bottom joint 216. The door 202 can placed over the opening 218. The door 202 can be coupled into place using methods described herein. The coupling, which can include directly, rigidly, or fixedly connected, of the components of the pole base cabinet 200 or other pole base cabinets disclosed herein can be accomplished with welding, adhesion, riveting, threaded connections, press fits, snap fits, and/or other similar methods.

The thickness and/or material of the varying components of the pole base cabinet 200 can vary depending on the desired structural integrity. For example, materials such as metals (such as steel, high strength steel, aluminum, and/or others), metal alloys, polymers (such as plastic), ceramics, and/or others can be used. For example, each of the plurality of support panels can have a thickness of less than $\frac{1}{16}$, $\frac{1}{16}$-$\frac{1}{4}$, $\frac{1}{4}$-$\frac{1}{2}$, $\frac{1}{2}$-$\frac{3}{4}$, $\frac{3}{4}$-1, 1-1$\frac{1}{4}$, 1$\frac{1}{4}$-1$\frac{1}{2}$, 1$\frac{1}{2}$-1$\frac{3}{4}$, 1$\frac{3}{4}$-2, 2-2$\frac{1}{4}$, 2$\frac{1}{4}$-2$\frac{1}{2}$, 2$\frac{1}{2}$-2$\frac{3}{4}$, 2$\frac{3}{4}$-3, 3-3$\frac{1}{4}$, 3$\frac{1}{4}$-3$\frac{1}{2}$, 3$\frac{1}{2}$-3$\frac{3}{4}$, 3$\frac{3}{4}$-4, and/or greater than 4 inches. Each of the plurality of internal stiffening panels can have a thickness of less than $\frac{1}{16}$, $\frac{1}{16}$-$\frac{1}{4}$, $\frac{1}{4}$-$\frac{1}{2}$, $\frac{1}{2}$-$\frac{3}{4}$, $\frac{3}{4}$-1, 1-1$\frac{1}{4}$, 1$\frac{1}{4}$-1$\frac{1}{2}$, 1$\frac{1}{2}$-1$\frac{3}{4}$, 1$\frac{3}{4}$-2, 2-2$\frac{1}{4}$, 2$\frac{1}{4}$-2$\frac{1}{2}$, 2$\frac{1}{2}$-2$\frac{3}{4}$, 2$\frac{3}{4}$-3, 3-3$\frac{1}{4}$, 3$\frac{1}{4}$-3$\frac{1}{2}$, 3$\frac{1}{2}$-3$\frac{3}{4}$, 3$\frac{3}{4}$-4, and/or greater than 4 inches. Each of the plurality of external stiffening panels can have a thickness of less than $\frac{1}{16}$, $\frac{1}{16}$-$\frac{1}{4}$, $\frac{1}{4}$-$\frac{1}{2}$, $\frac{1}{2}$-$\frac{3}{4}$, $\frac{3}{4}$-1, 1-1$\frac{1}{4}$, 1$\frac{1}{4}$-1$\frac{1}{2}$, 1$\frac{1}{2}$-1$\frac{3}{4}$, 1$\frac{3}{4}$-2, 2-2$\frac{1}{4}$, 2$\frac{1}{4}$-2$\frac{1}{2}$, 2$\frac{1}{2}$-2$\frac{3}{4}$, 2$\frac{3}{4}$-3, 3-3$\frac{1}{4}$, 3$\frac{1}{4}$-3$\frac{1}{2}$, 3$\frac{1}{2}$-3$\frac{3}{4}$, 3$\frac{3}{4}$-4, and/or greater than 4 inches. The peripheral wall can have a thickness of less than $\frac{1}{16}$, $\frac{1}{16}$-$\frac{1}{4}$, $\frac{1}{4}$-$\frac{1}{2}$, $\frac{1}{2}$-$\frac{3}{4}$, $\frac{3}{4}$-1, 1-1$\frac{1}{4}$, 1$\frac{1}{4}$-1$\frac{1}{2}$, 1$\frac{1}{2}$-1$\frac{3}{4}$, 1$\frac{3}{4}$-2, 2-2$\frac{1}{4}$, 2$\frac{1}{4}$-2$\frac{1}{2}$, 2$\frac{1}{2}$-2$\frac{3}{4}$, 2$\frac{3}{4}$-3, 3-3$\frac{1}{4}$, 3$\frac{1}{4}$-3$\frac{1}{2}$, 3$\frac{1}{2}$-3$\frac{3}{4}$, 3$\frac{3}{4}$-4, and/or greater than 4 inches. Each of the plurality of tabs can have a thickness of less than $\frac{1}{16}$, $\frac{1}{16}$-$\frac{1}{4}$, $\frac{1}{4}$-$\frac{1}{2}$, $\frac{1}{2}$-$\frac{3}{4}$, $\frac{3}{4}$-1, 1-1$\frac{1}{4}$, 1$\frac{1}{4}$-1$\frac{1}{2}$, 1$\frac{1}{2}$-1$\frac{3}{4}$, 1$\frac{3}{4}$-2, 2-2$\frac{1}{4}$, 2$\frac{1}{4}$-2$\frac{1}{2}$, 2$\frac{1}{2}$-2$\frac{3}{4}$, 2$\frac{3}{4}$-3, 3-3$\frac{1}{4}$, 3$\frac{1}{4}$-3$\frac{1}{2}$, 3$\frac{1}{2}$-3$\frac{3}{4}$, 3$\frac{3}{4}$-4, and/or greater than 4 inches. The top plate and/or bottom plate can have thicknesses of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Relatedly, the components listed above can have varying widths, heights, and/or lengths to provide a desired size. For example, the pole base cabinet 200 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches and/or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Second Pole Base Cabinet Configuration—FIGS. 11-17

With reference to FIGS. 11-17, a pole base cabinet, casing, housing, enclosure, locker 300 is described. Pole base cabinet 300 can include substantially the same or similar features described or shown herein in reference to other configurations of pole base cabinets. Similarly numbered features can be the same or similar.

Figure 11:
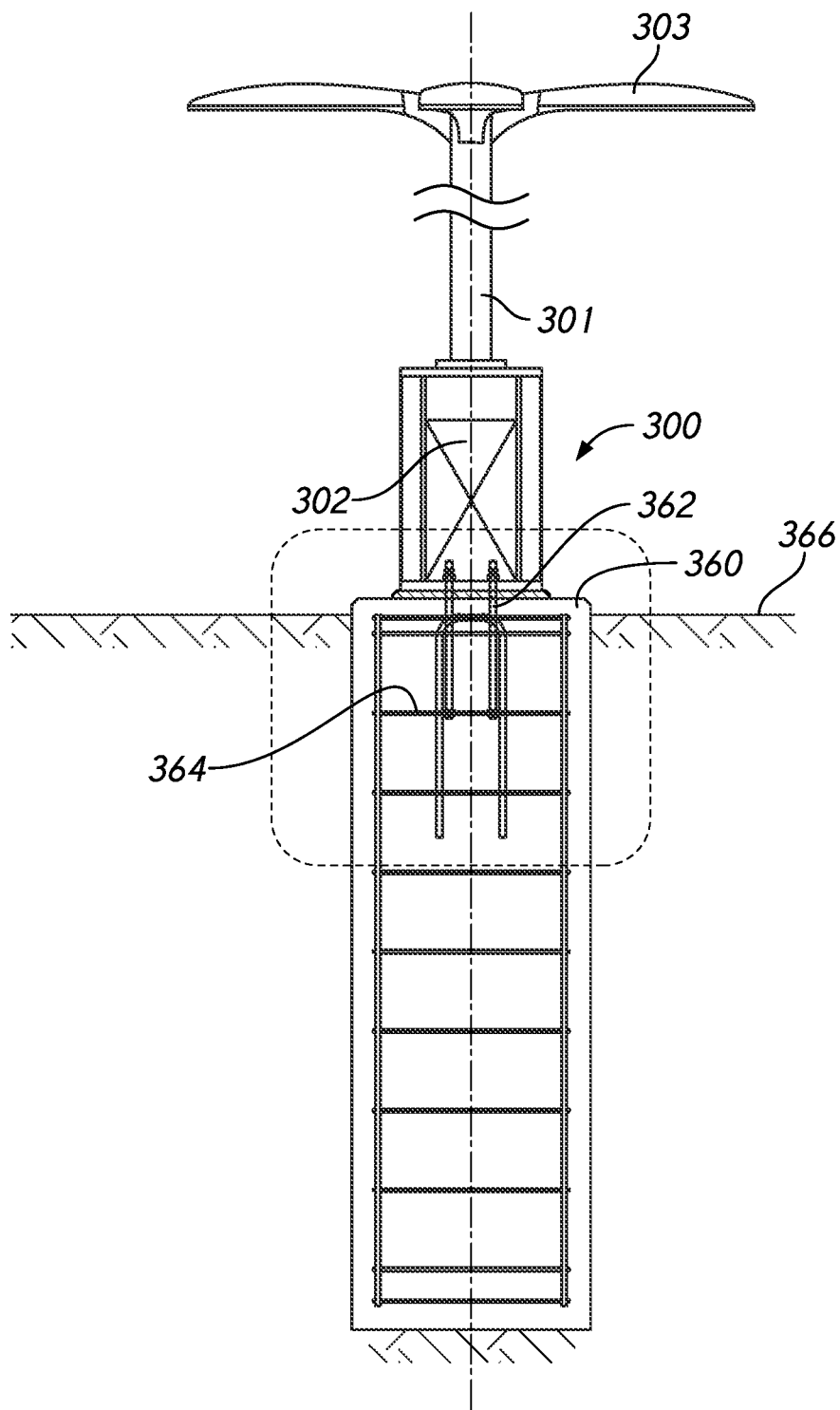
FIG. 11 schematically illustrates an example pole base cabinet positioned between a footing and pole.

As shown in FIG. 11, a pole 301 can be mounted onto the pole base cabinet 300 to support a light source 303 at an elevated height. The pole base cabinet 300 can have a cavity in which items can be stored. A door 302 can be opened and/or closed, such as releasably coupled, to obstruct or provide access to the cavity. The pole base cabinet 300 can be secured to a footing, base 360. Specifically, the pole base cabinet 300 can be coupled to anchors 362 extending into the footing 360. In a configuration, the anchors 362 can be coupled to or retained by rebar 364 in the footing 360. The footing 360 can be positioned at, proximate, above, and/or below grade 366.

Figure 12:
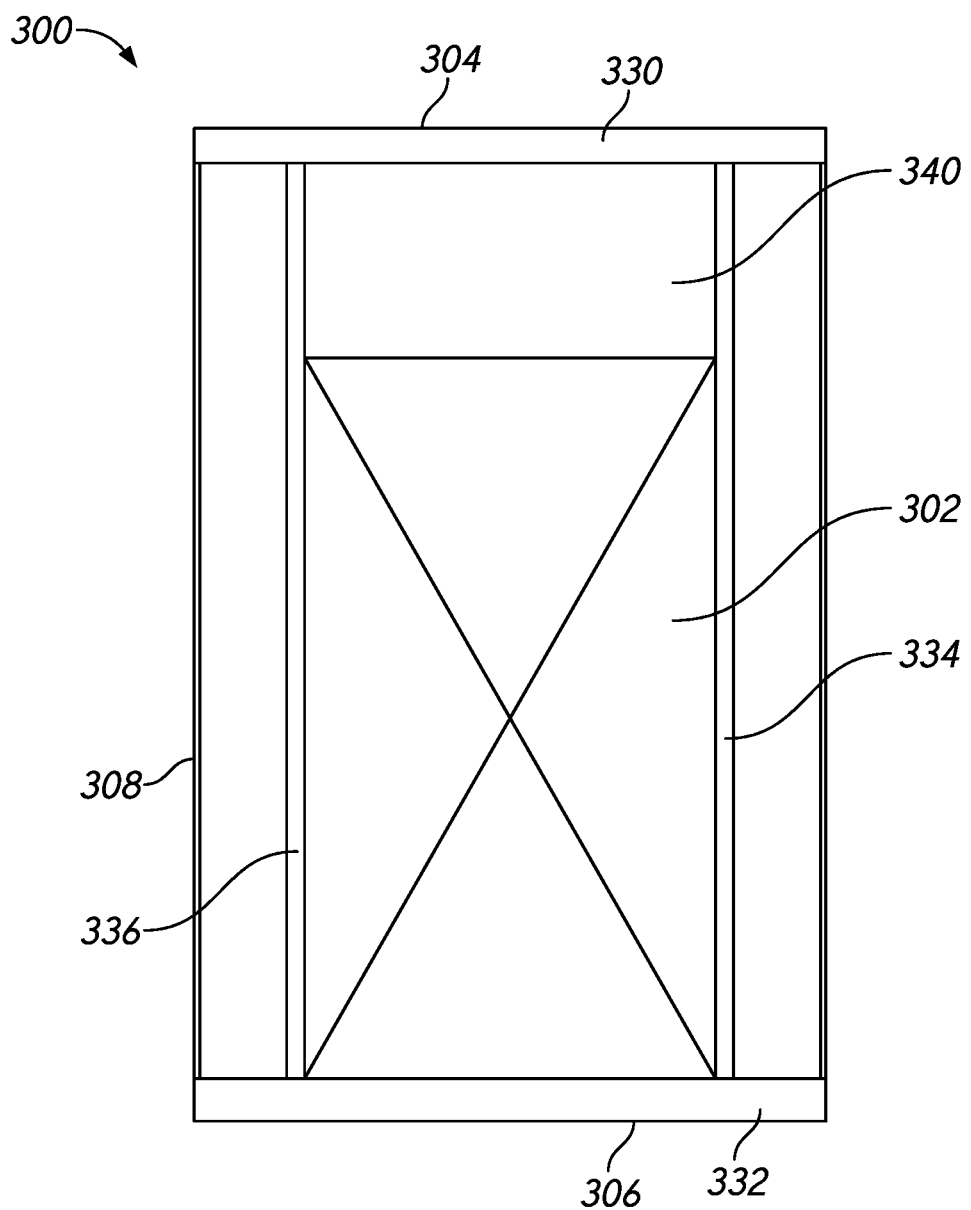
FIG. 12 schematically illustrates the example pole base cabinet of FIG. 11.
Figure 13:
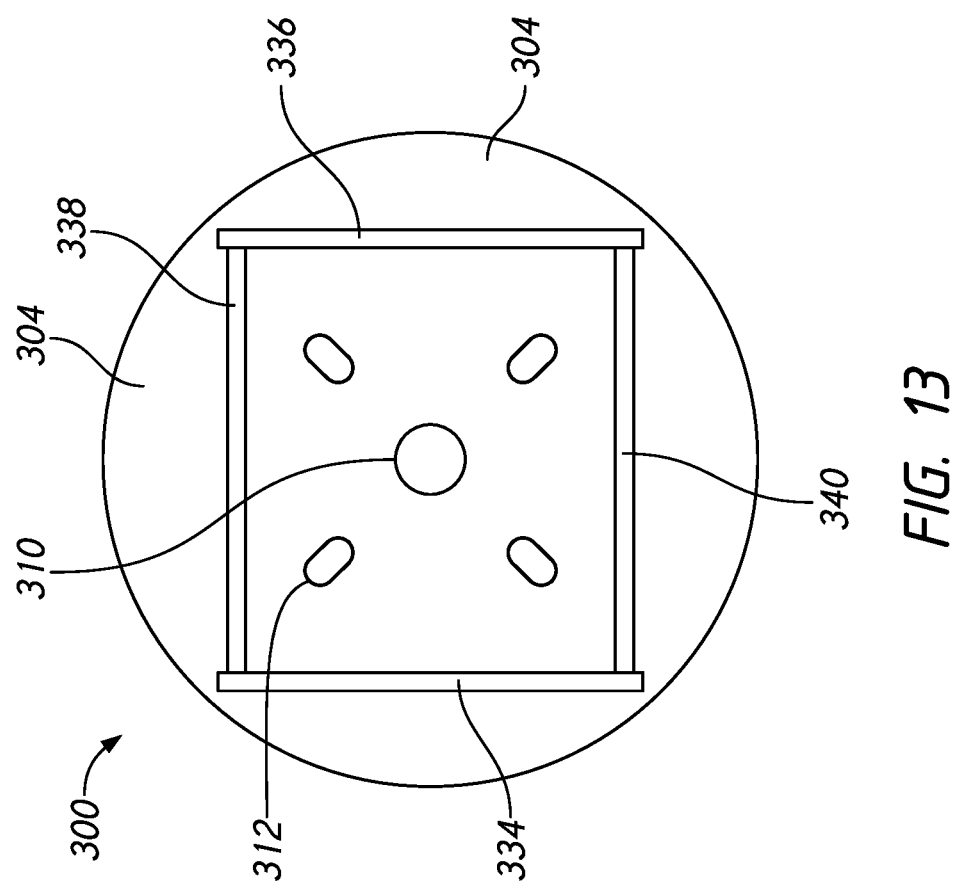
FIG. 13 schematically illustrates a section view of the example pole base cabinet of FIG. 11.

As shown in FIG. 12, the pole base cabinet 300 can have a top or first plate, disc, sheet 304. The top plate 304 can have a periphery 330 that is circular, as shown in FIG. 13, or polygonal, irregular, and/or others. The top plate 304 can have a plurality of apertures 312, which can include two, three, four, five, six, or more apertures 312. The apertures 312 can have a circular, polygonal, irregular, and/or other shape. The aperture 312 can be elongate with rounded ends. The apertures 312 can all be the same or having varying shapes and/or sizes. The apertures 312 can be arranged in different configurations. For example, the apertures 312 can cooperate to form a square with each aperture 312 forming a corner thereof. The apertures 312 can cooperate to form a circular, polygonal, irregular, and/or other shape depending on what configuration is required or desired to couple to a corresponding pole base and/or is needed for structural integrity. The apertures 312 can be used to secure the top plate 204 to a pole base, such as a pole base plate, which can include utilizing bolts. The apertures 312 can be oversized relative to a bolt that will extend therethrough. Having over-sized apertures 312 relative to the bolt can be advantageous for convenient alignment. Apertures 312 can be oversized relative to corresponding apertures of a pole base or pole base plate, which can be advantageous for convenient alignment.

The top plate 304 can have an opening 310. The opening 310 can used to allow wiring, cords, optical fibers, and/or other devices through the top plate 304 and into and/or out of a cavity of the pole base cabinet 300. The opening 310 can be centrally located. In a configuration, the opening 310 can be located at any position on the top plate 304. The opening 310 can have a circular, polygonal, irregular, and/or other shape. In a configuration, a periphery defining the opening 310 can be rounded to reduce abrasion on devices extending therethrough. In a configuration, a periphery defining the opening 310 can be coated or covered with a non-abrasive material to reduce abrasion on devices extending therethrough. In a configuration, the apertures 312 can be distributed around the opening 310, which can include circumferentially or radially distributed. In a configuration, the opening 310 can be located centered relative to the plurality of apertures 312. The opening 310 can be larger than each of the apertures 312.

Figure 14:
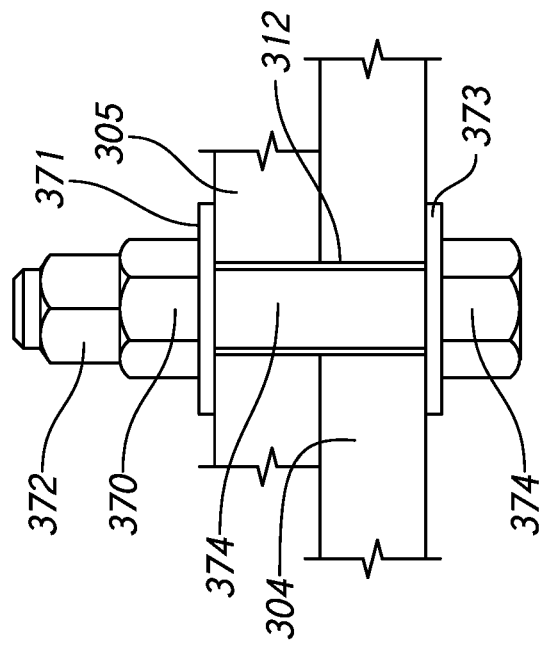
FIG. 14 schematically illustrates an enlarged view of the top plate of the example pole base cabinet of FIG. 11 coupled to a pole base plate.

For example, as shown in FIG. 14, a pole base plate 305 can be positioned on the top plate 304. An aperture 312 of the top plate 304 can be aligned with a corresponding aperture of the pole base plate, base plate 305. A bolt 374 can extend through the aperture 312 of the top plate 304 and the corresponding aperture of the pole base plate 305. A washer 373 can be positioned between the head of the bolt 374 and the top plate 304. The washer 373 can protect the top plate 304 and/or enable the apertures 312 to be oversized relative to the head of the bolt 374 for at least the advantages explained above. A first nut 370 can be secured on the end of the bolt 374 proximate the pole base plate 305 to securely couple the top plate 304 and pole base plate 305 together. A second nut 372 can be secured on the end of the bolt 374 proximate the first nut 370 to securely couple the top plate 304 and pole base plate 305 together. A washer 371 can be positioned between the first nut 370 and the pole base plate 305. The washer 371 can be used for similar advantages as detailed for the washer 373. Any other suitable fasteners and fastener system may be used.

Figure 15:
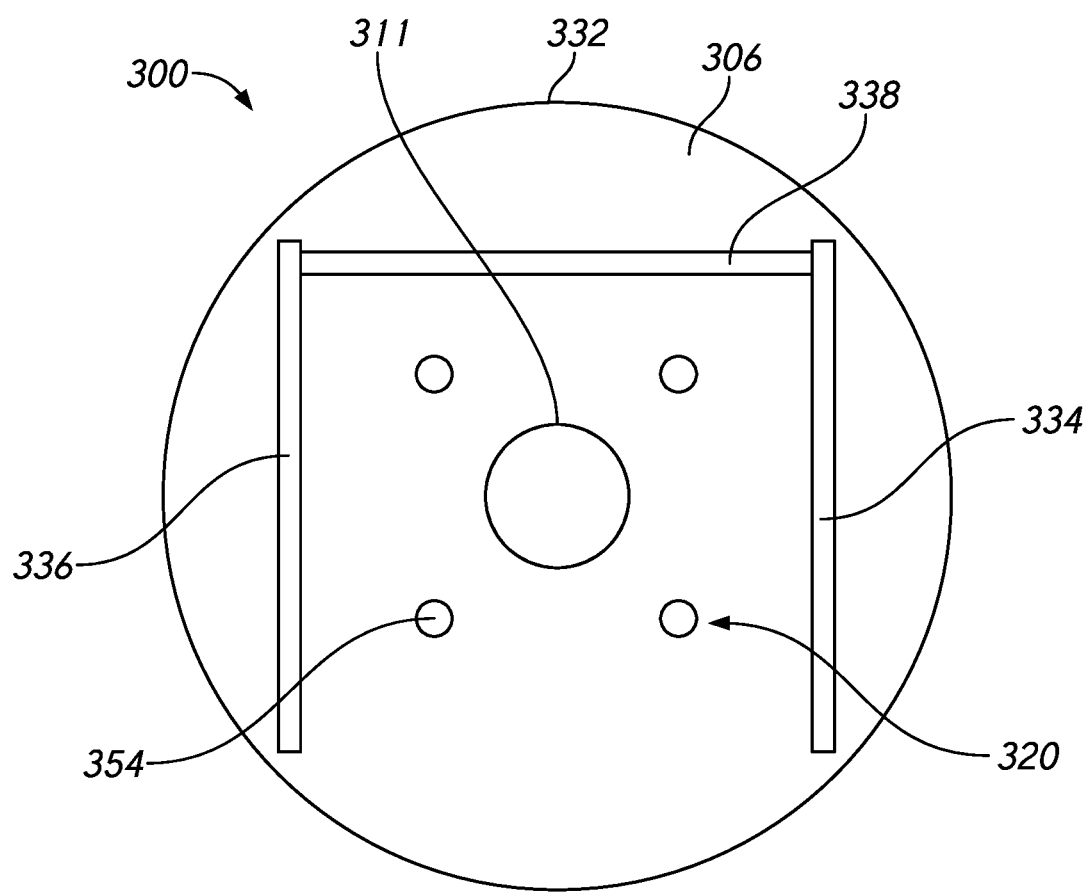
FIG. 15 schematically illustrates a section view of the example pole base cabinet of FIG. 11.

As shown in FIG. 12, the pole base cabinet 300 can have a bottom or second plate, disc, sheet 306. The bottom plate 306 can have a periphery 332 that is circular, as shown in FIG. 15, or polygonal, irregular, and/or others. The bottom plate 306 can have a plurality of apertures 354, which can include two, three, four, five, six, or more apertures 354. The apertures 354 can have a circular, polygonal, irregular, and/or other shape. In a configuration, the apertures 354 can be elongate with rounded ends. In a configuration, the apertures 354 can be the same as or similar to the apertures 312. The apertures 354 can all be the same or having varying shapes and/or sizes. The apertures 354 can be arranged in different configurations. For example, the apertures 354 can cooperate to form a square with each aperture 354 forming a corner thereof. The apertures 354 can cooperate to form a circular, polygonal, irregular, and/or other shape depending on what configuration is required or desired to couple to a corresponding pole base and/or is needed for structural integrity. The apertures 354 can be used to secure the bottom plate 306 to the footing 360.

The bottom plate 306 can have an opening 311. The opening 311 can used to allow wiring, cords, optical fibers, and/or other devices through the bottom plate 306 and into and/or out of the cavity 320 of the pole base cabinet 300. For example, wiring and/or cables can be routed through conduits in a footing or base upon which the pole base cabinet 300 is mounted and extend through the opening 311 and into the cavity. The wiring and/or cables can be used to supply electrical power to components/items stored in the cavity, components/items stored outside the cavity, and/or a light source mounted on a pole that is coupled to the pole base cabinet 300. The opening 311 can be centrally located. In a configuration, the opening 311 can be located at any position on the bottom plate 306. The opening 311 can have a circular, polygonal, irregular, and/or other shape. In a configuration, a periphery defining the opening 311 can be rounded to reduce abrasion on devices extending therethrough. In a configuration, a periphery defining the opening 311 can be coated or covered with a non-abrasive material to reduce abrasion on devices extending therethrough. In a configuration, the apertures 354 can be distributed around the opening 311, which can include circumferentially or radially distributed. In a configuration, the opening 311 can be located centered relative to the plurality of apertures 354. The opening 311 can be larger than each of the apertures 354. The opening 311 can be the same as or different than the opening 310. In a configuration, the opening 311 is larger than the opening 310.

The top plate 304 and the bottom plate 306 can be offset and/or parallel from each other. The top plate 304 and the bottom plate 306 can define ends and/or opposing ends of the pole base cabinet 300. The top plate 304 and the bottom plate 306 can be flat. In a configuration, the top plate 304 and the bottom plate 306 can include recesses, curves, and/or contours. The top plate 304 and the bottom plate 306 can be positioned on a center-longitudinal axis of the pole base cabinet 300. The top plate and the bottom plate 306 can be centered on a center-longitudinal axis of the pole base cabinet 300. In a configuration, the top plate 304 can be the same as the bottom plate 306. This can be advantageous when more wiring or cables are directed into the cavity through the bottom plate 306 than out of the cavity through the top plate 306. In a configuration, the top plate 304 does not have an opening 310 and/or the bottom plate 306 does not have an opening 311.

Figure 16:
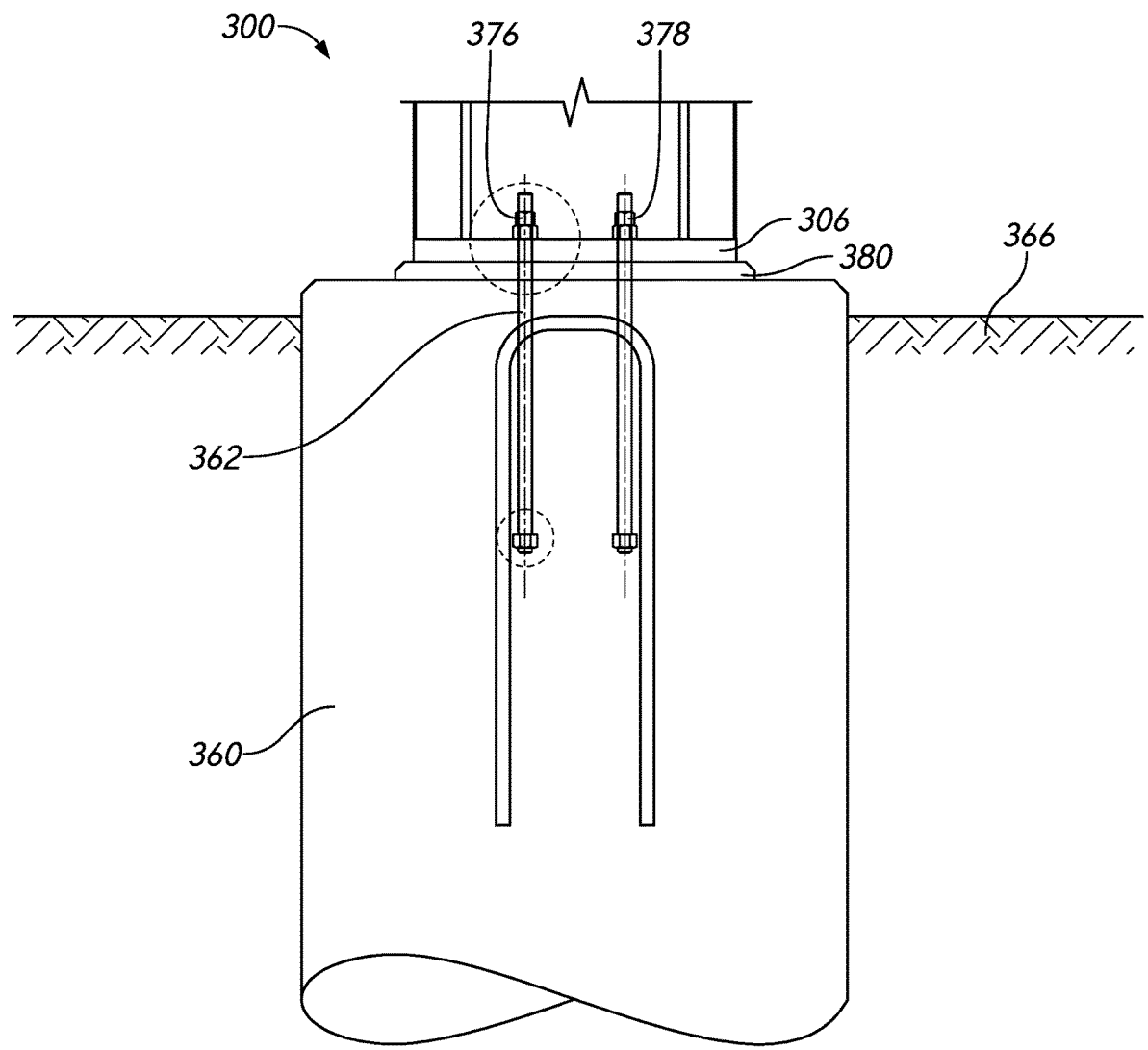
FIG. 16 schematically illustrates an enlarged view of the example pole base cabinet of FIG. 11 coupled to the footing.
Figure 17:
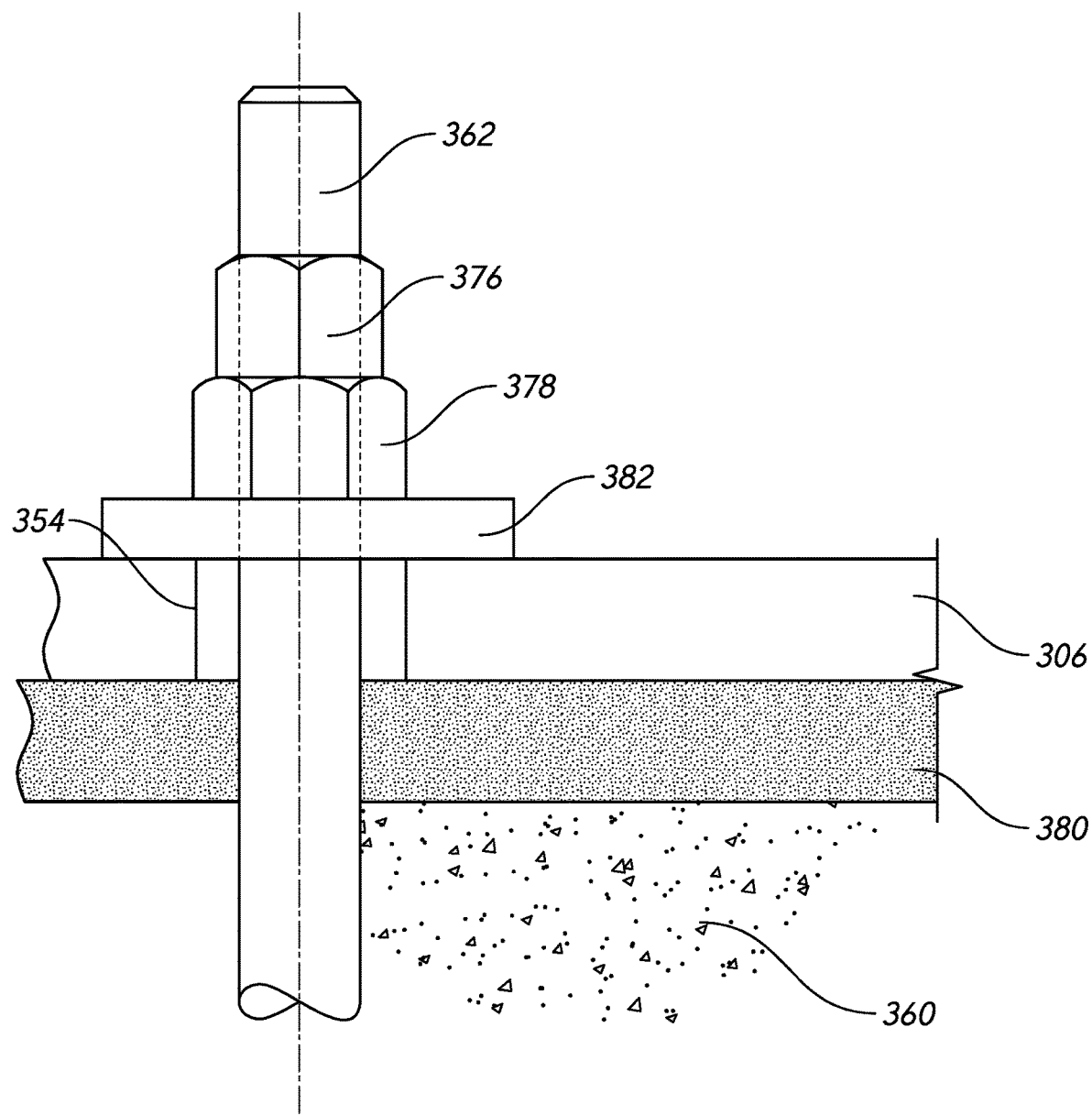
FIG. 17 schematically illustrates an enlarged view of the bottom plate of the example pole base cabinet of FIG. 11 coupled to the footing.

As shown in FIGS. 16 and 17, the bottom plate 306 can be coupled to the footing 360. The footing can have an anchor 362 with a portion of the anchor 362 extending out of the footing 360. The anchor 362 can extend through one of the apertures 354 of the bottom plate 306. An intermediate layer 380 can be positioned between the bottom plate 306 and the footing 360. The intermediate layer 380 can be grout, which can include a non-shrink grout. A first nut 378 can be secured on the anchor 362 to securely couple the bottom plate 306 to the footing 360. A washer 382 can be positioned between the first nut 378 and the bottom plate 306. A second nut 376 can be secured on the anchor 362 to securely couple the bottom plate 306 to the footing 360. The level of the pole base cabinet 300 can be adjusted by adjusting each of the nuts to be higher or lower. In a configuration, the level of the pole can be adjusted in a similar manner.

The pole base cabinet 300 can have a peripheral wall, side, surface 308, which can also be referred to as a skin and/or wall 308. The peripheral wall 308 can extend and/or be coupled to, which can include directly, rigidly, or fixedly connected, from the top plate 304 to the bottom plate 306. The peripheral wall 308 can extend from and/or be coupled to, which can include directly, rigidly, or fixedly connected, the periphery 330 of the top plate 304 to and/or proximate a periphery 332 of the bottom plate 306. The peripheral wall 308 can extend from a bottom surface of the top plate 304 to a top surface of the bottom plate 306. The peripheral wall 308 can define a periphery of the pole base cabinet 300, which can be circular, polygonal, irregular, and/or other shapes. The peripheral wall 308 can define a periphery of the pole base cabinet 300 that can be the same as or similar to the shape of the periphery 330 of the top plate 204 and/or periphery 332 of the bottom plate 306. The peripheral wall 308 can define a rounded periphery of the pole base cabinet 300, which can be similar to a tube. The peripheral wall 308 can define a main opening. The main opening can provide access into a cavity of the pole base cabinet 300. The cavity can be centrally located in the pole base cabinet 300. The cavity can house items and/or components, which can include the items and/or components detailed herein. The main opening can be varying sizes and shapes, which can include circular, polygonal, irregular, and/or others. In a configuration, the main opening can be rectangular in shape. The main opening can extend to or proximate the top plate 304 and proximate the bottom plate 306.

The main opening can be covered with a door 302, as shown in FIG. 12, permanently or temporarily preventing and/or restricting access to the cavity. The main opening can be uncovered by the door 302 to allow access to the cavity. In a configuration, the door 302 can be releasably or fixedly coupled to the pole base cabinet 300 with a hinge allowing the door 302 to be swung open and closed while remaining coupled to the pole base cabinet 300. The door 302 can have a curvature matching a curvature of the peripheral wall 308. The door 302 can have a perimeter or periphery that matches the main opening such that the door 302 can cover the main opening. The door 302 can be a thickness matching that of the peripheral wall 308.

The pole base cabinet 300 can have a frame which can include a plurality of support panels and/or one or more internal stiffening panels. In a configuration, the peripheral wall 308 can be coupled to the frame, which can include being coupled, which can include directly, rigidly, or fixedly connected, such as being welded and spot welded to the portions of the frame. The plurality of support panels can include a first support panel, plank, girder, joist, pillar, plank, brace, beam 334, second support panel, plank, girder, joist, pillar, plank, brace, beam 336, and/or a third support panel, plank, girder, joist, pillar, plank, brace, beam 338, as shown in FIGS. 12, 15, and 13. The first support panel 334, second support panel 336, and/or a third support panel 338 of pole base cabinet 300 can be the same as or similar to the first support panel 234, second support panel 236, and/or a third support panel 238 of the pole base cabinet 200.

The first support panel 334, second support panel 336, and/or a third support panel 338 can at least partially define a cavity, similar to cavity 220. The first support panel 334, second support panel 336, and/or a third support panel 338 can extend between and/or be coupled to, which can include directly, rigidly, or fixedly connected, the top plate 304 and the bottom plate 306. The first support panel 334, second support panel 336, and/or a third support panel 338 can form three sides of a rectangular-like structure surrounding or at least partially surrounding the cavity. The first support panel 334, second support panel 336, and/or a third support panel 338 can be the same or similar size and shape. The first support panel 334, second support panel 336, and/or a third support panel 338 can be different sizes and shapes. The first support panel 334, second support panel 336, and/or a third support panel 338 can be rectangular panels. The first support panel 334 can be offset from the second support panel 336. The first support panel 334 and second support panel 336 can be parallel to each other. The third support panel 338 can extend between and/or be coupled to, which can include directly, rigidly, or fixedly connected, the first support panel 334 and second support panel 336. The third support panel 338 can extend between and/or be coupled to, which can include directly, rigidly, or fixedly connected, ends or proximate ends of the first support panel 334 and second support panel 336. The third support panel 338 can extend between and/or be coupled to, which can include directly, rigidly, or fixedly connected, ends or proximate ends of first support panel 334 and second support panel 336 that are opposite a main opening. The third support panel 238 can be positioned opposite the main opening. As shown in FIG. 13, the third support panel 338 can be proximate the ends, which can include inset from the ends, of the first support panel 234 and second support panel 336.

The frame of the pole base cabinet 300 can have one more internal stiffening panels, which can include a first internal stiffening panel, plank, girder, joist, pillar, plank, brace, beam 340, as shown in FIGS. 12 and 13. The first internal stiffening panel 340 of pole base cabinet 300 can be the same as or similar to the first internal stiffening panel 240. In a configuration, the first support panel 334, second support panel 336, third support panel 338, and/or first internal stiffening panel 340 is spaced away from the peripheral wall 308. The peripheral wall 308, and others described herein, can be non-load bearing.

The first internal stiffening panel 340 can be coupled to, which can include directly, rigidly, or fixedly connected, the top plate 304. The first internal stiffening panel 340 can extend perpendicularly away from the top plate 304. The first internal stiffening panel 340 can extend to a position between the top plate 304 and the bottom plate 306, providing room for items to be store in the cavity. The first internal stiffening panel 340 can be a rectangular panel. The first internal stiffening panel 240 can be straight or curved. The first internal stiffening panel 340 can extend between, which can include directly, rigidly, or fixedly connected, the first support panel 334 and the second support panel 336. The first internal stiffening panel 340 can extend between and/or be coupled to, which can include directly, rigidly, or fixedly connected, ends or proximate ends of the first support panel 334 and the second support panel 336. The first internal stiffening panel 340 can be positioned proximate the main opening and/or door 302. The first internal stiffening panel 340 can be positioned opposite the third support panel 338. The first internal stiffening panel 340 can be offset from and/or parallel to the third support panel 338. The plurality of apertures 312 can be positioned between the first internal stiffening panel 340 and the third support panel 338. The first internal stiffening panel 340 can be a width that is the same as the third support panel 338. As shown in FIG. 13, the first internal stiffening panel 340 can be proximate the ends, which can include inset from the ends, of the first support panel 334 and second support panel 336.

The thickness and/or material of the varying components of the pole base cabinet 300 can vary depending on the desired structural integrity. For example, materials such as metals (such as steel, high strength steel, aluminum, and/or others), metal alloys, polymers (such as plastic), ceramics, and/or others can be used. For example, each of the plurality of support panels can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The internal stiffening panel can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The peripheral wall can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The top plate and/or bottom plate can have thicknesses of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Relatedly, the components listed above can have varying widths, heights, and/or lengths to provide a desired size. For example, the pole base cabinet 300 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Third Pole Base Cabinet Configuration—FIGS. 18-22

With reference to FIGS. 18-22, a pole base cabinet, casing, housing, enclosure, locker 400 is described. Pole base cabinet 400 can include substantially the same or similar features described or shown herein in reference to other configurations of pole base cabinets. Similarly numbered features can be the same or similar. The top half of the pole base cabinet 400 can mirror the bottom half. A lateral half of the pole base cabinet 400 can mirror the other lateral half.

Figure 18:
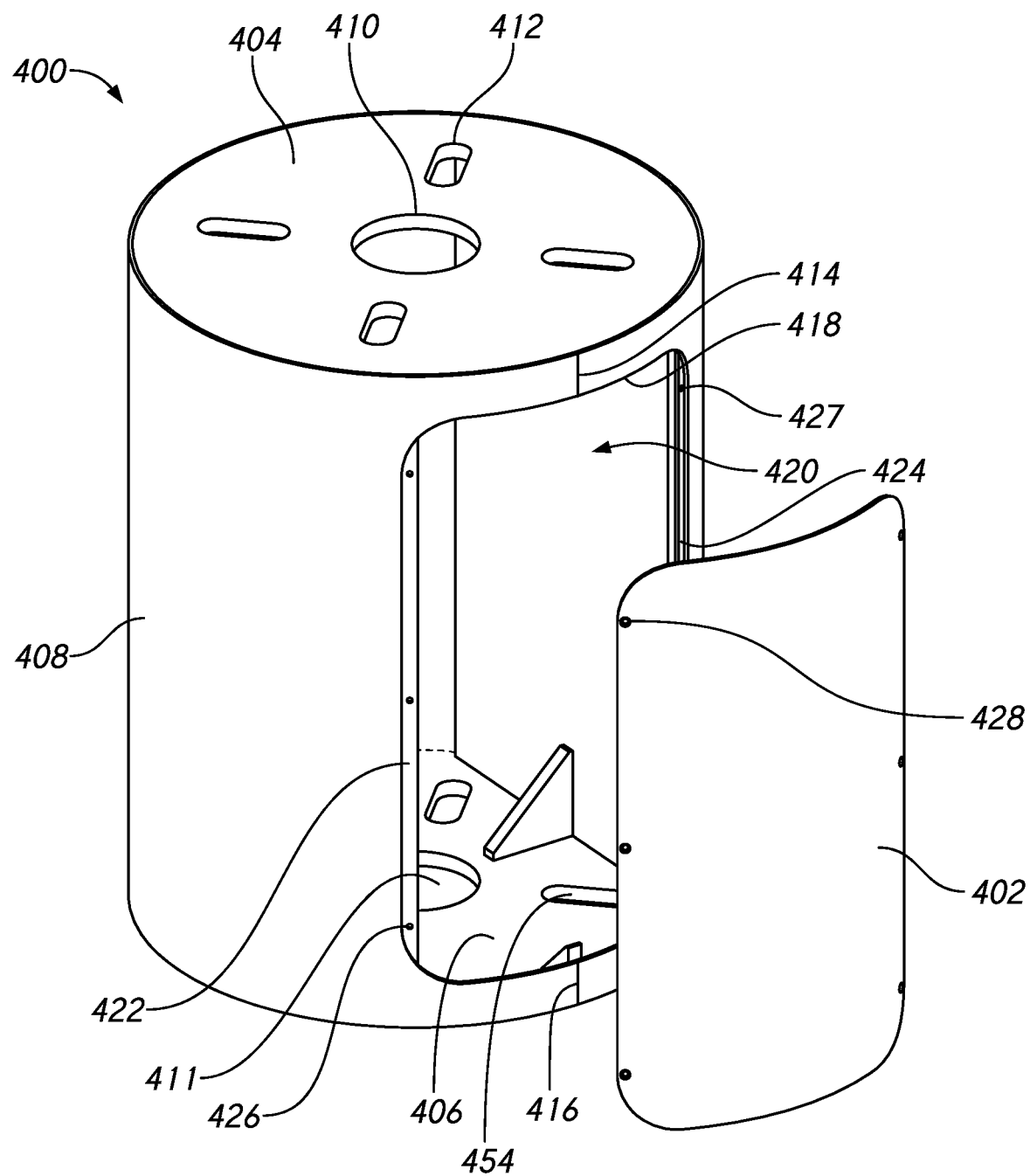
FIG. 18 schematically illustrates a perspective view of an example pole base cabinet with the door removed.
Figure 20:
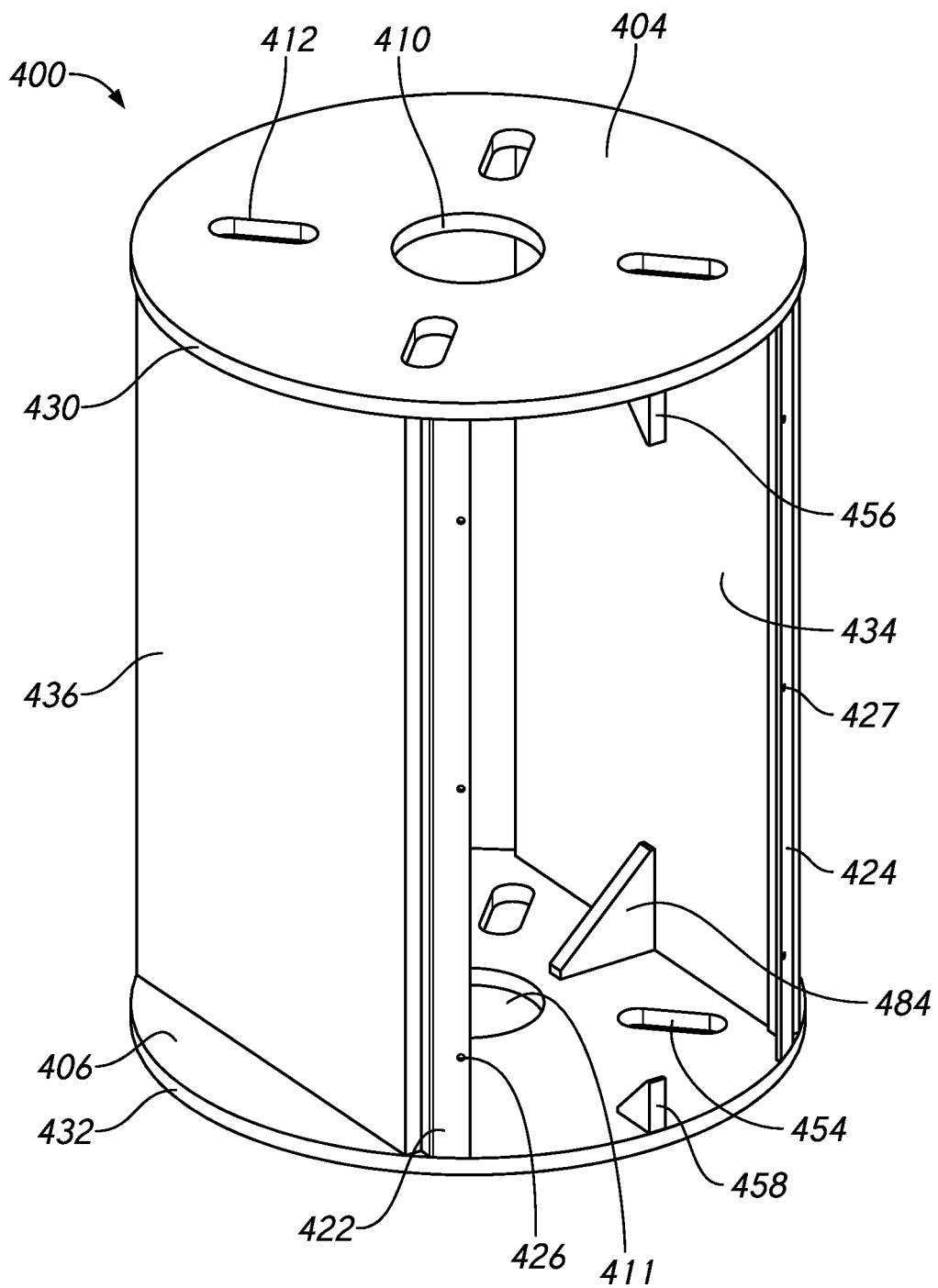
FIG. 20 schematically illustrates a perspective view of the example pole base cabinet of FIG. 18 with the peripheral wall removed.

As shown in FIG. 18, the pole base cabinet 400 can have a top or first plate, disc, sheet 404. The top plate 404 can have an opening 410. The top plate 404 can have a plurality of apertures 412. The top plate 404 can have a periphery 430, as shown in FIG. 20.

The pole base cabinet 400 can have a bottom plate or second, disc, sheet 406. The bottom plate 406 can be the same or similar to the top plate 404. The bottom plate 406 can have an opening 411. The bottom plate 406 can have a periphery 432, as shown in FIG. 20.

The pole base cabinet 400 can have a peripheral wall, side, surface 408. The peripheral wall 408 can extend from and/or be coupled to, which can include directly, rigidly, or fixedly connected, the top plate 404 to the bottom plate 406. The peripheral wall 408 can extend from and/or be coupled to, which can include directly, rigidly, or fixedly connected, the periphery 430 of the top plate 404 to the periphery 432 of the bottom plate 406. The peripheral wall 408 can define a periphery of the pole base cabinet 400, which can be circular, polygonal, irregular, and/or other shapes. In a configuration, similar to the peripheral wall 208, the peripheral wall 408 can be manipulated from a disassembled state to the treated or manipulated state shown in FIG. 18 by forming the peripheral wall 208 into the rounded tube-like configuration such that the peripheral wall 408 can be coupled to, which can include directly, rigidly, or fixedly connected, or proximate itself at the top joint 414 and the bottom joint 416. In a configuration, the peripheral wall 408 can be manufactured in the configuration illustrated in FIG. 18 such that there is no top joint 414 and/or bottom joint 416.

The peripheral wall 408 can define a main opening 418. The main opening 418 can provide access into a cavity 420 of the pole base cabinet 400. The cavity 420 can house or contain items and/or components, which can include the items and components detailed herein.

Figure 19:
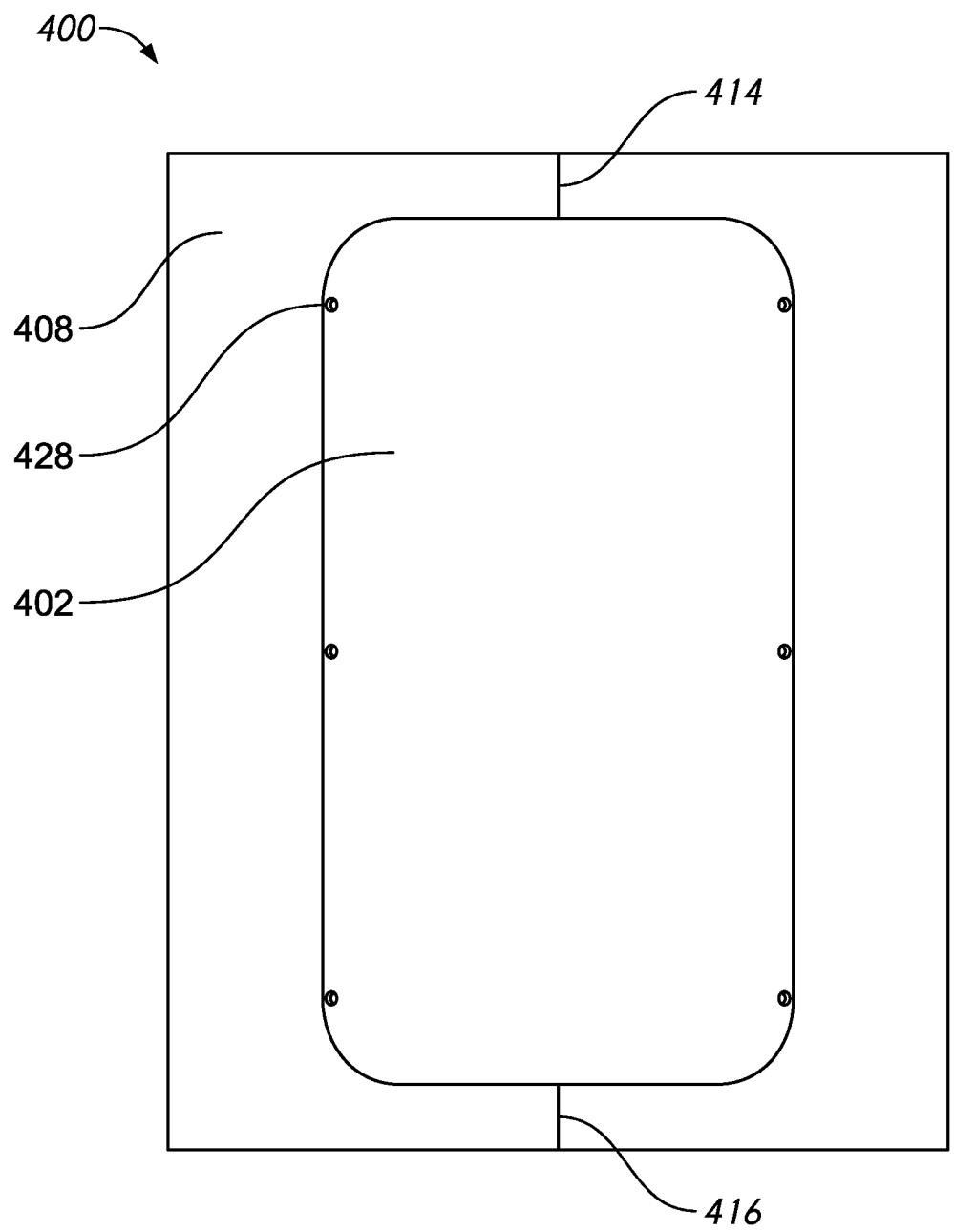
FIG. 19 schematically illustrates a front view of the example pole base cabinet of FIG. 18 with the door coupled to the pole base cabinet.

The main opening 418 can be covered with a door 402, as shown in FIG. 19, permanently or temporarily preventing and/or restricting access to the cavity 420, which can include by releasably coupling. The main opening 418 can be uncovered with the door 402 removed, as shown in FIG. 18, to allow access to the cavity 420. The door 402 can include a plurality of door apertures 428. The door apertures can be used to couple the door 402 to the pole base cabinet 400. The door apertures 428 can correspond to flange apertures 426, 427 positioned on a first flange, rim, border, frame, lip 424 and/or a second flange, rim, border, frame, lip 422 of the pole base cabinet. The door can be coupled to the pole base cabinet 400 by placing the door 402 over the main opening 418 such that the door apertures 428 are aligned with the flange apertures 426, 427 and inserting a bolt, screw, rivet, and/or other similar device 492 through the door apertures 428 and the flange apertures 426, 427. The first flange 424 and/or the second flange 422 can be similar or the same as to the first flange 224 and/or the second flange 222. In a configuration, as shown in FIG. 22, the first flange 424 and/or the second flange 422 can be coupled to internal surfaces of the first support panel 434 and the second support panel 436, respectively.

As shown in FIGS. 18 and 20-22, the pole base cabinet 400 can include a frame that can include a plurality of support panels. The plurality of support panels can include a first support panel, plank, girder, joist, pillar, plank, brace, beam 434 and a second support panel, plank, girder, joist, pillar, plank, brace, beam 436. The first support panel 434 and the second support panel 436 can be configured the same as or similar to the first support panel 434 and the second support panel 236 the pole base cabinet 200. The peripheral wall 408 can be coupled, which can include directly, rigidly, or fixedly connected, to the ends or proximate the ends of the first support panel 434 and the second support panel 436.

Figure 22:
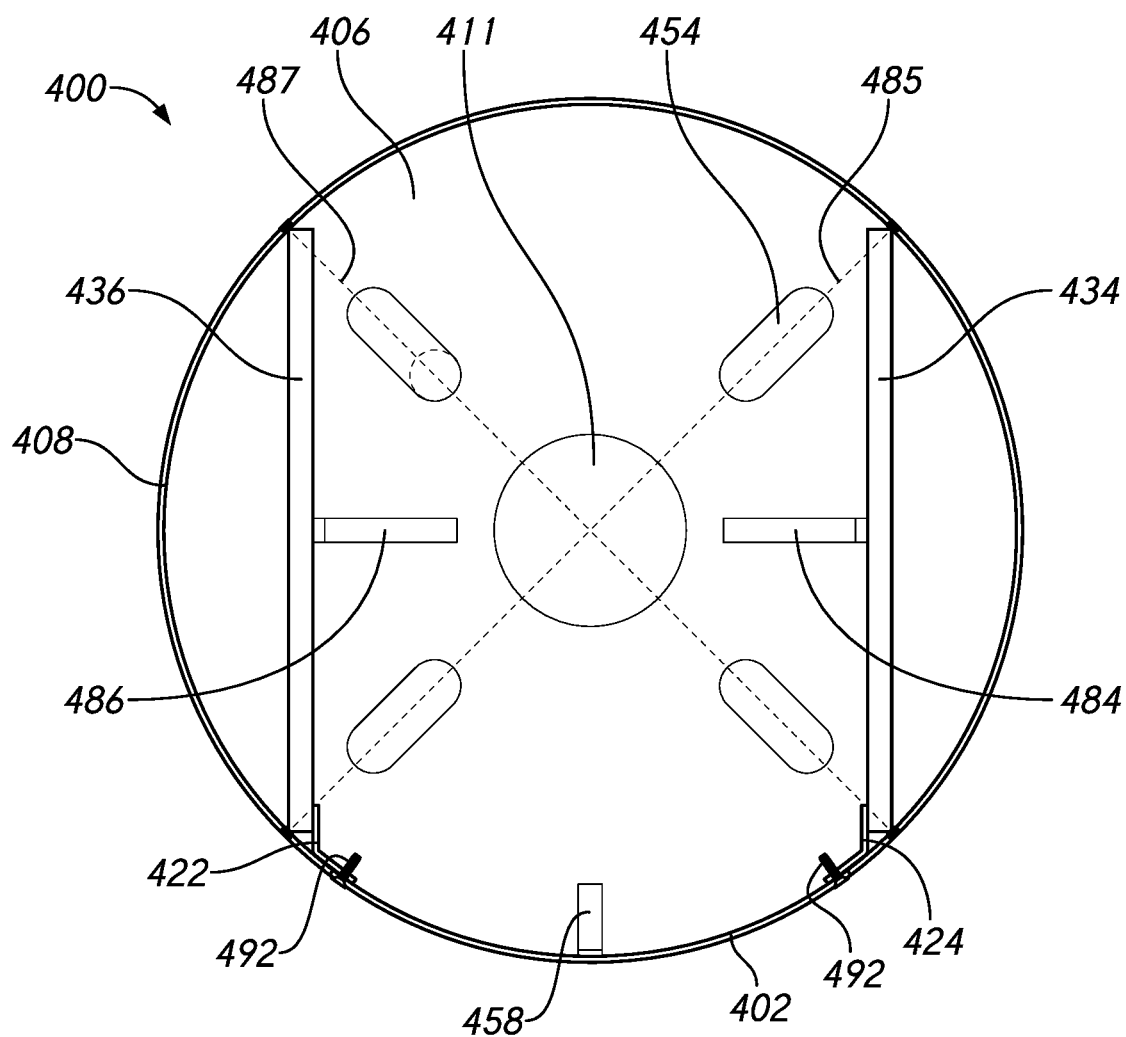
FIG. 22 schematically illustrates a top view of the example pole base cabinet of FIG. 18.

As shown in FIG. 22, a first plane 485 can extend through where the first support panel 434 is coupled to the peripheral wall 208, two of the plurality of apertures 454, the opening 411, and where the second support panel 436 is coupled to the peripheral wall 208. A second plane 487 can extend through where the first support panel 434 is coupled to the peripheral wall 208, two of the plurality of apertures 454, the opening 411, and where the second support panel 436 is coupled to the peripheral wall 208. The first plane 485 can be perpendicular to the second plane 487. The first plane 485 and the second plane 487 can intersect at the opening 411.

Figure 21:
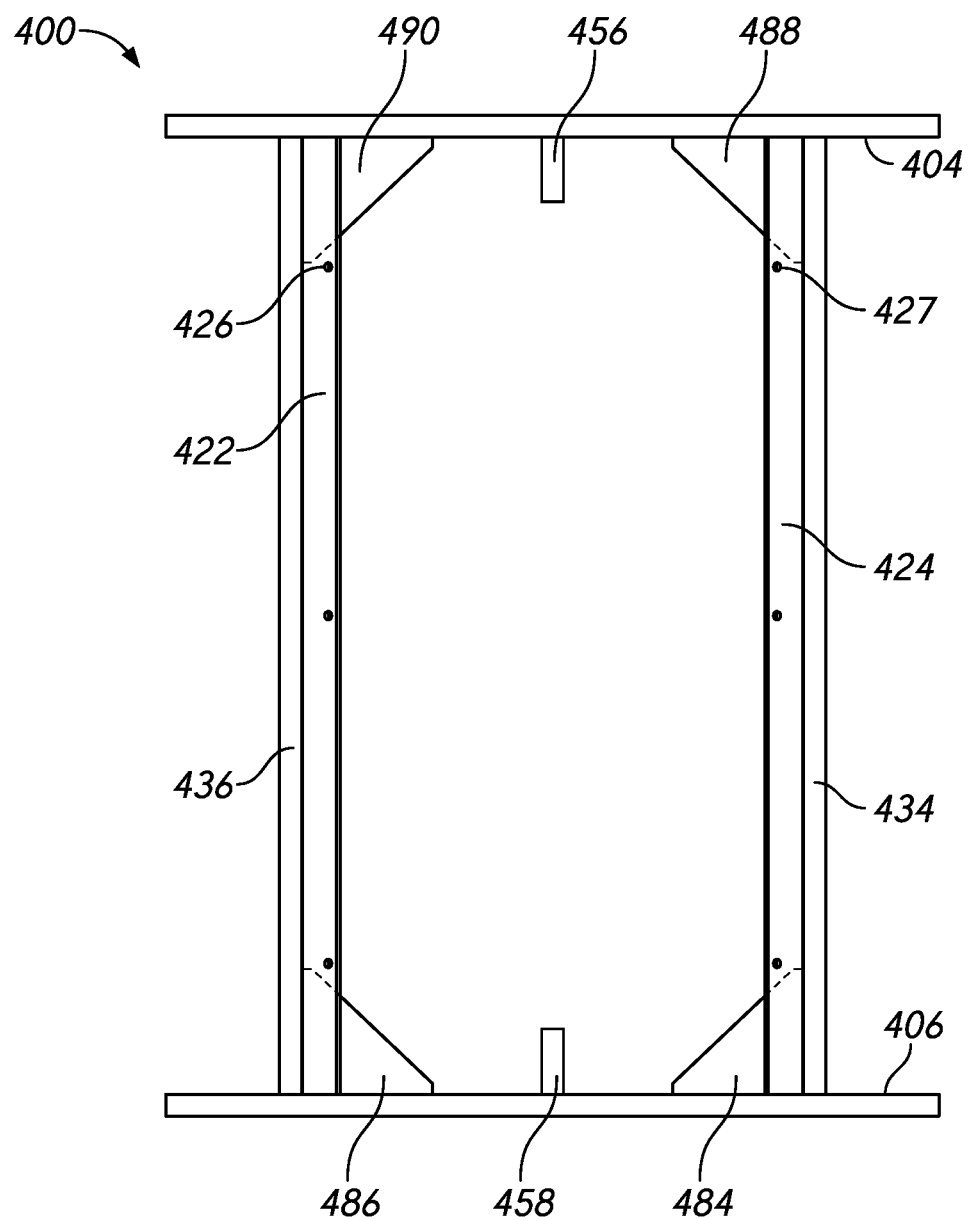
FIG. 21 schematically illustrates a front view of the example pole base cabinet of FIG. 18 with the peripheral wall removed.

As shown in FIG. 21, the pole base cabinet 400 can have a plurality of support tabs, projections, protrusions, bosses, stiffeners, which can include a first top support tab 488, second top support tab 490, first bottom support tab 484, and/or second bottom support tab 486. The first top support tab 488, second top support tab 490, first bottom support tab 484, and/or second bottom support tab 486 can be the same or different size and shape. The first top support tab 488, second top support tab 490, first bottom support tab 484, and/or second bottom support tab 486 can be triangular.

The first top support tab 488 can be coupled to, which can include directly, rigidly, or fixedly connected, the top plate 404. The first top support tab 488 can be coupled to, which can include directly, rigidly, or fixedly connected, the first support panel 434. As shown in FIG. 22, the first top support tab 488 can be positioned at and/or be coupled to, which can include directly, rigidly, or fixedly connected, a middle portion of the first support panel 434. The first top support tab 488 can be centered in the width direction of the first support panel 434.

The second top support tab 490 can be coupled to, which can include directly, rigidly, or fixedly connected, the top plate 404. The second top support tab 490 can be coupled to, which can include directly, rigidly, or fixedly connected, the second support panel 436. As shown in FIG. 22, the second top support tab 490 can be positioned at and/or be coupled to, which can include directly, rigidly, or fixedly connected, a middle portion of the second support panel 436. The second top support tab 490 can be centered in the width direction of the second support panel 436.

The first bottom support tab 484 can be coupled to, which can include directly, rigidly, or fixedly connected, the bottom plate 406. The first bottom support tab 484 can be coupled to, which can include directly, rigidly, or fixedly connected, the first support panel 434. As shown in FIG. 20, the first bottom support tab 484 can be positioned at a middle portion of the first support panel 434. The first bottom support tab 484 can be centered in the width direction of the first support panel 434.

The second bottom support tab 486 can be coupled to, which can include directly, rigidly, or fixedly connected, the bottom plate 406. The second bottom support tab 486 can be coupled to, which can include directly, rigidly, or fixedly connected, the second support panel 436. The second bottom support tab 486 can be positioned at a middle portion of the second support panel 436. The second bottom support tab 486 can be centered in the width direction of the second support panel 436.

The pole base cabinet 400 can have a top tab projection, protrusion, boss, stiffener 456 and/or a bottom tab projection, protrusion, boss, stiffener 458, as shown in FIG. 20. The top tab 456 and/or bottom tab 458 can be configured as the top tab 256 and/or bottom tab 258 of pole base cabinet 200.

The thickness and/or material of the varying components of the pole base cabinet 400 can vary depending on the desired structural integrity. For example, each of the plurality of support panels can have a thickness of less than $1/16$, $1/16$-$1/4$, $1/4$-$1/2$, $1/2$-$3/4$, $3/4$-1, 1-$1 1/4$, $1 1/4$-$1 1/2$, $1 1/2$-$1 3/4$, $1 3/4$-2, 2-$2 1/4$, $2 1/4$-$2 1/2$, $2 1/2$-$2 3/4$, $2 3/4$-3, 3-$3 1/4$, $3 1/4$-$3 1/2$, $3 1/2$-$3 3/4$, $3 3/4$-4, and/or greater than 4 inches. Each of the plurality of support tabs can have a thickness of less than $1/16$, $1/16$-$1/4$, $1/4$-$1/2$, $1/2$-$3/4$, $3/4$-1, 1-$1 1/4$, $1 1/4$-$1 1/2$, $1 1/2$-$1 3/4$, $1 3/4$-2, 2-$2 1/4$, $2 1/4$-$2 1/2$, $2 1/2$-$2 3/4$, $2 3/4$-3, 3-$3 1/4$, $3 1/4$-$3 1/2$, $3 1/2$-$3 3/4$, $3 3/4$-4, and/or greater than 4 inches. The peripheral wall can have a thickness of less than $1/16$, $1/16$-$1/4$, $1/4$-$1/2$, $1/2$-$3/4$, $3/4$-1, 1-$1 1/4$, $1 1/4$-$1 1/2$, $1 1/2$-$1 3/4$, $1 3/4$-2, 2-$2 1/4$, $2 1/4$-$2 1/2$, $2 1/2$-$2 3/4$, $2 3/4$-3, 3-$3 1/4$, $3 1/4$-$3 1/2$, $3 1/2$-$3 3/4$, $3 3/4$-4, and/or greater than 4 inches. Each of the plurality of tabs can have a thickness of less than $1/16$, $1/16$-$1/4$, $1/4$-$1/2$, $1/2$-$3/4$, $3/4$-1, 1-$1 1/4$, $1 1/4$-$1 1/2$, $1 1/2$-$1 3/4$, $1 3/4$-2, 2-$2 1/4$, $2 1/4$-$2 1/2$, $2 1/2$-$2 3/4$, $2 3/4$-3, 3-$3 1/4$, $3 1/4$-$3 1/2$, $3 1/2$-$3 3/4$, $3 3/4$-4, and/or greater than 4 inches. The top plate and/or bottom plate can have thicknesses of less than $1/16$, $1/16$-$1/4$, $1/4$-$1/2$, $1/2$-$3/4$, $3/4$-1, 1-$1 1/4$, $1 1/4$-$1 1/2$, $1 1/2$-$1 3/4$, $1 3/4$-2, 2-$2 1/4$, $2 1/4$-$2 1/2$, $2 1/2$-$2 3/4$, $2 3/4$-3, 3-$3 1/4$, $3 1/4$-$3 1/2$, $3 1/2$-$3 3/4$, $3 3/4$-4, and/or greater than 4 inches. Relatedly, the components listed above can have varying widths, heights, and/or lengths to provide a desired size. For example, the pole base cabinet 400 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches and/or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Fourth Pole Base Cabinet Configuration—FIGS. 23-28

With reference to FIGS. 23-28, a pole base cabinet, casing, housing, enclosure, locker 500 is described. Pole base cabinet 500 can include substantially the same or similar features described or shown herein in reference to other configurations of pole base cabinets. Similarly numbered features can be the same or similar.

Figure 25:
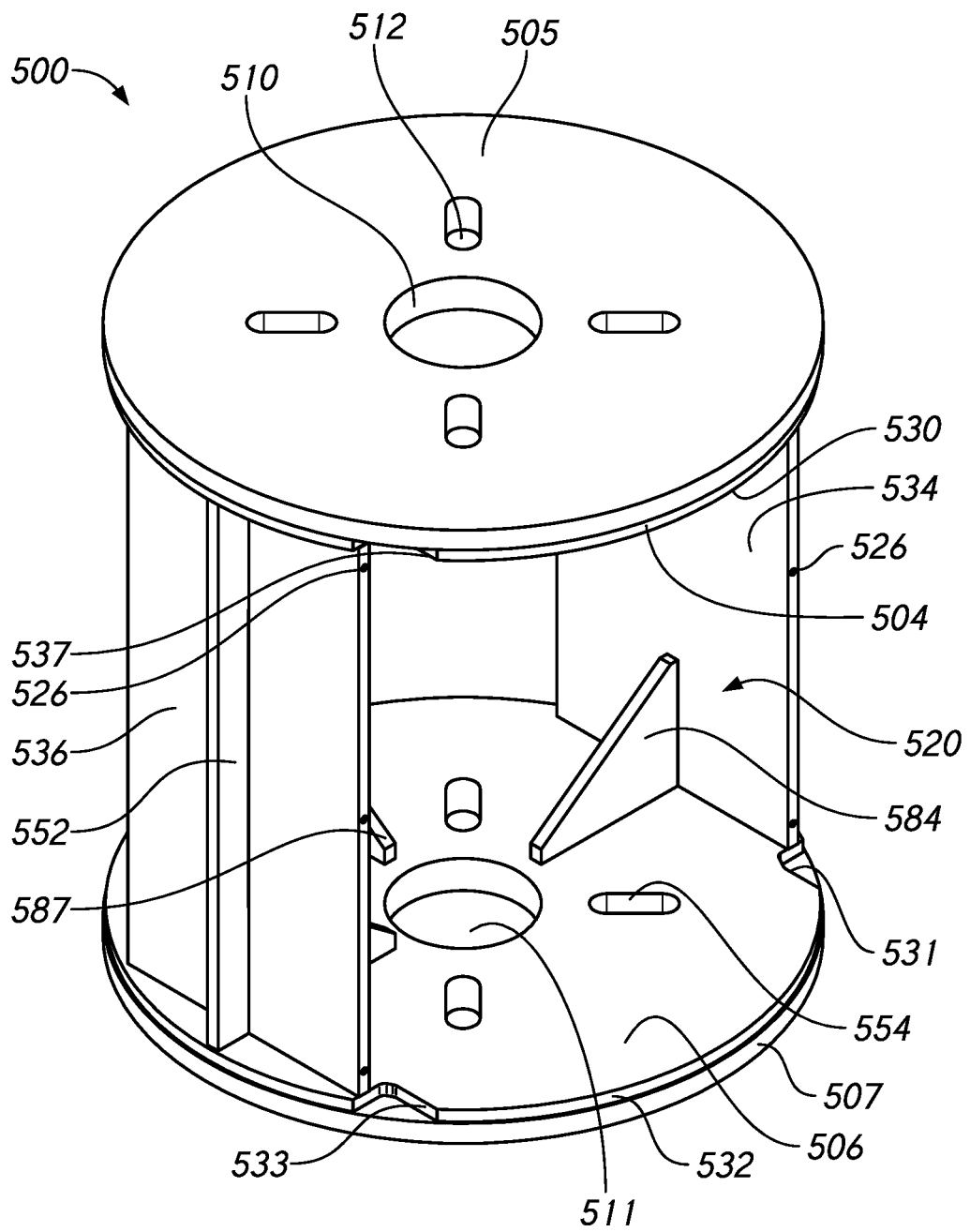
FIG. 25 schematically illustrates a perspective view of the example pole base cabinet of FIG. 23 with the peripheral wall removed.

As shown in FIG. 25, the pole base cabinet 500 can have a top or first plate, disc, sheet 504. The top plate 504 can be the same as the top plate 404 except that the top plate 504 is thinner and/or can have a first cutout 539 and/or second cutout 537. The top plate 504 can have an opening 510 and/or a plurality of apertures 512. The first top cutout 539 and the second top cutout 537 can be notches in the periphery 530 of the top plate 504. The first top cutout 539 and the second top cutout 537 can be positioned proximate the main opening and/or door 520. A secondary top plate 505 that is the same as the top plate 404 can be positioned above the top plate 504.

The pole base cabinet 500 can have a bottom or second plate, disc, sheet 506. The bottom plate 506 can be the same as the top plate 504, having a first bottom cutout 531 and/or second bottom cutout 533. The bottom plate 506 can have an opening 511 and/or a plurality of apertures 554. The first bottom cutout 531 and/or second bottom cutout 533 can be notches in the periphery 532 of the bottom plate 506. The first top cutout 539, the second top cutout 537, first bottom cutout 531, and/or second bottom cutout 533 can receive ends of a first flange, rim, border, frame, lip 524 and/or second flange, rim, border, frame, lip 522, shown in FIG. 28. The door 502 can be releasably coupled to the pole base plate 500 and/or first flange 524 and/or the second flange 522. The door 502, shown in FIG. 23, can be secured to the first flange 524 and/or the second flange 522 with fasteners 521, which can be rivets, screws, bolts, and/or other similar devices. A secondary bottom plate 507 that is the same as the secondary top plate 505 can be positioned below the bottom plate 506.

A peripheral wall, side, surface 508 can extend between and/or be coupled to, which can include directly, rigidly, or fixedly connected, the top plate 504 and the bottom plate 506. Specifically, the peripheral wall 508 can extend from and/or be coupled to, which can include directly, rigidly, or fixedly connected, the periphery 530 of the top plate 504 to the periphery 532 of the bottom plate 506. The peripheral wall 508 can extend from and/or be coupled to, which can include directly, rigidly, or fixedly connected, a bottom surface of the secondary top plate 505 to a top surface of the secondary bottom plate 507.

Figure 26:
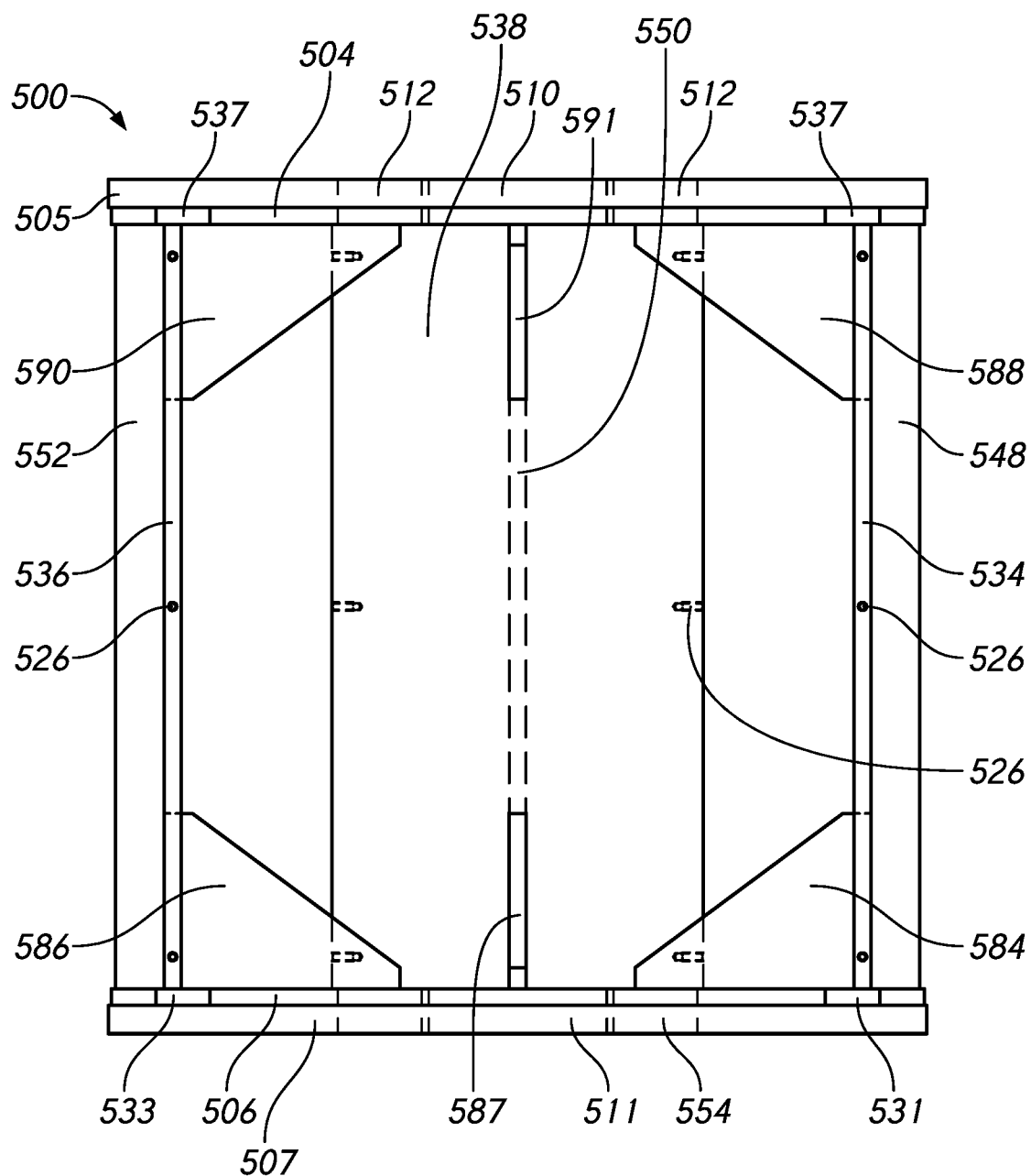
FIG. 26 schematically illustrates a front view of the example pole base cabinet of FIG. 23 with the peripheral wall removed.

As shown in FIGS. 24-26, the pole base cabinet 500 can have a frame to provide structure support that can include a plurality of support panels and/or external stiffening panels. The plurality of support panels can include a first support panel, plank, girder, joist, pillar, plank, brace, beam 534, second support panel, plank, girder, joist, pillar, plank, brace, beam 536, and/or the third support panel, plank, girder, joist, pillar, plank, brace, beam 538. The first support panel 534, second support panel 536, and/or the third support panel 538 can extend between and/or be coupled to, which can include directly, rigidly, or fixedly connected, the top plate 504 and the bottom plate 506. The first support panel 534, second support panel 536, and/or the third support panel 538 can be the same or different sizes and shapes. The first support panel 534, second support panel 536, and/or the third support panel 538 can be rectangular panels. The first support panel 534, second support panel 536, and/or the third support panel 538 can be positioned proximate the peripheral wall 508, the periphery 530 of the top plate 504, and/or the periphery 532 of the bottom plate 506. The first support panel 534, second support panel 536, and/or the third support panel 538 can all have openings 526 which can be used for coupling. The first support panel 534 and/or second support panel 536 can be offset and/or parallel to each other. The third support panel 538 can be oriented perpendicularly relative to the first support panel 534 and second support panel 536. The first support panel 534 and second support panel 536 can be on opposing side of the main opening and/or door 502.

The plurality of external stiffening panels can include a first external stiffening panel, plank, girder, joist, pillar, plank, brace, beam 548, second external stiffening panel, plank, girder, joist, pillar, plank, brace, beam 552, and/or a third external stiffening panel, plank, girder, joist, pillar, plank, brace, beam 550. The first external stiffening panel 548, second external stiffening panel 552, and/or a third external stiffening panel 550 can be configured the same as the first external stiffening panel 248, second external stiffening panel 252, and/or a third external stiffening panel 250 of the pole base cabinet 200. The first external stiffening panel 548, second external stiffening panel 552, and/or a third external stiffening panel 550 can each, respectively, be connected to a side of the first support panel 534, second support panel 536, and/or the third support panel 538 that is opposite another side upon which the plurality of top support tabs (first top support tab 588, second top support tab 590, and/or third top support tab 591) and the plurality of bottom support tabs (first bottom support tab 584, second bottom support tab 586, and/or third bottom support tab 587) are connected.

Figure 27:
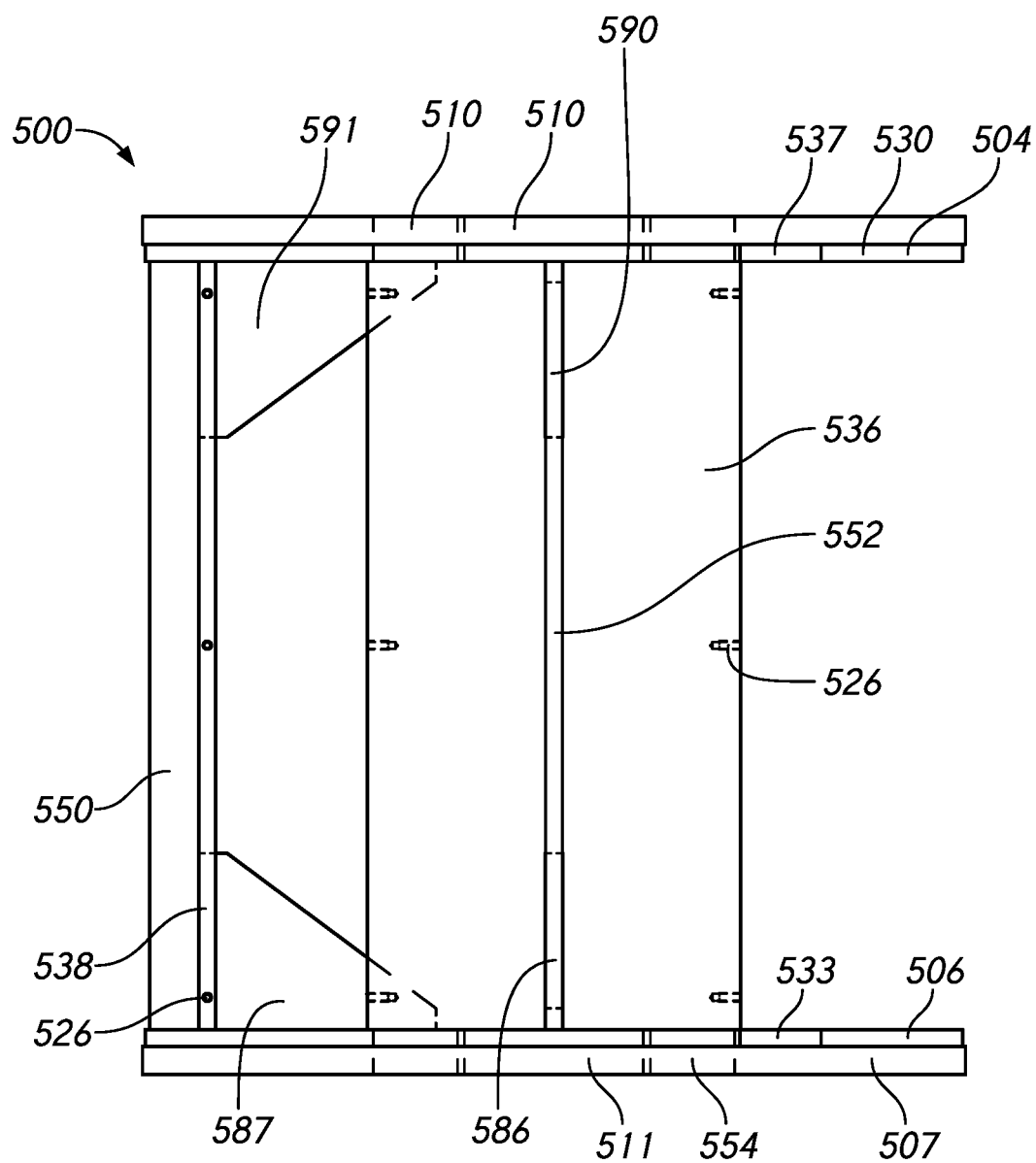
FIG. 27 schematically illustrates a side view of the example pole base cabinet of FIG. 23 with the peripheral wall removed.
Figure 28:
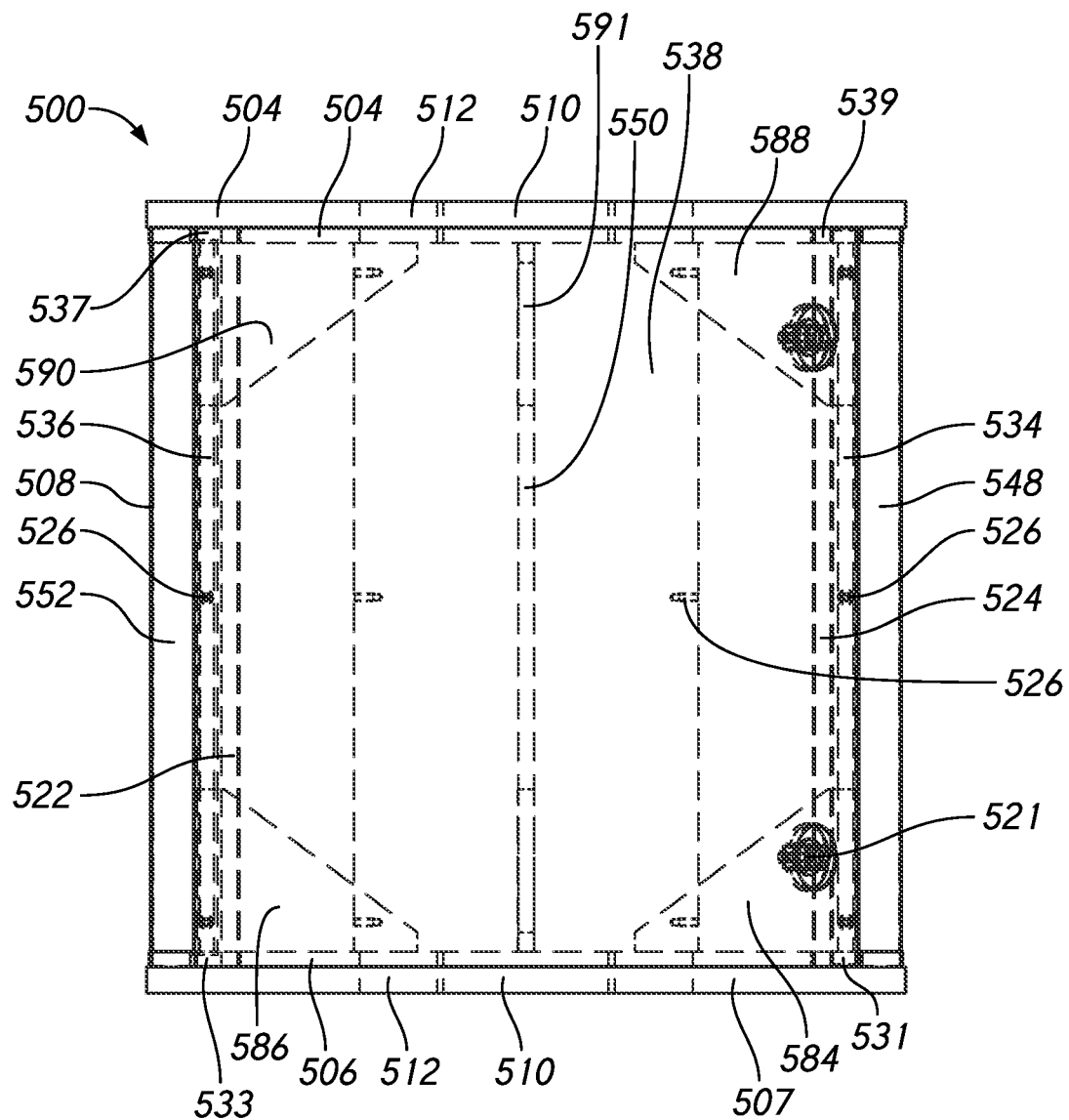
FIG. 28 schematically illustrates a view of the example pole base cabinet of FIG. 23.

As shown in FIGS. 26 and 27, the pole base cabinet 500 can have a plurality of support tabs, projections, protrusions, bosses, stiffeners, which can include a first top support tab 588, second top support tab 590, third top support tab 591, first bottom support tab 584, second bottom support tab 586, and/or third bottom support tab 587. The first top support tab 588, second top support tab 590, third top support tab 591, first bottom support tab 584, second bottom support tab 586, and/or third bottom support tab 587 can be the same or different size and shape. The first top support tab 588, second top support tab 590, third top support tab 591, first bottom support tab 584, second bottom support tab 586, and/or third bottom support tab 587 can be triangular. The first top support tab 588, second top support tab 590, third top support tab 591, first bottom support tab 584, second bottom support tab 586, and/or third bottom support tab 587 can extend radially inward toward a central longitudinal axis of the pole base cabinet 500. The third top support tab 591 and the third bottom support tab 587 can be oriented perpendicularly to the first top support tab 588, second top support tab 590, first bottom support tab 584, and/or the second bottom support tab 586.

The first top support tab 588 can be coupled to, which can include directly, rigidly, or fixedly connected, the top plate 504. The first top support tab 588 can be coupled to, which can include directly, rigidly, or fixedly connected, the first support panel 534. As shown in FIG. 24, the first top support tab 588 can be positioned at a middle portion of the first support panel 534. The first top support tab 588 can be centered in the width direction of the first support panel 534.

The second top support tab 590 can be coupled to, which can include directly, rigidly, or fixedly connected, the top plate 504. The second top support tab 590 can be coupled to, which can include directly, rigidly, or fixedly connected, the second support panel 536. As shown in FIG. 24, the second top support tab 590 can be positioned at a middle portion of the second support panel 536. The second top support tab 590 can be centered in the width direction of the second support panel 536.

The third top support tab 591 can be coupled to, which can include directly, rigidly, or fixedly connected, the top plate 504. The third top support tab 591 can be coupled to, which can include directly, rigidly, or fixedly connected, the third support panel 538. As shown in FIG. 24, the third top support tab 591 can be positioned at a middle portion of the third support panel 538. The third top support tab 591 can be centered in the width direction of the third support panel 538.

The first bottom support tab 584 can be coupled to, which can include directly, rigidly, or fixedly connected, the bottom plate 506. The first bottom support tab 584 can be coupled to, which can include directly, rigidly, or fixedly connected, the first support panel 534. The first bottom support tab 584 can be positioned at a middle portion of the first support panel 534. The first bottom support tab 584 can be centered in the width direction of the first support panel 534.

The second bottom support tab 586 can be coupled to, which can include directly, rigidly, or fixedly connected, the bottom plate 506. The second bottom support tab 586 can be coupled to, which can include directly, rigidly, or fixedly connected, the second support panel 536. The second bottom support tab 586 can be positioned at a middle portion of the second support panel 536. The second bottom support tab 586 can be centered in the width direction of the second support panel 536.

The third bottom support tab 587 can be coupled to, which can include directly, rigidly, or fixedly connected, the bottom plate 506. The third bottom support tab 587 can be positioned at a middle portion of the third support panel 538. The third bottom support tab 587 can be centered in the width direction of the third support panel 538.

The thickness and/or material of the varying components of the pole base cabinet 500 can vary depending on the desired structural integrity. For example, each of the plurality of support panels can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Each of the plurality of support tabs can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Each of the plurality of external stiffening panels can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The peripheral wall can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The top plate and/or bottom plate can have thicknesses of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Relatedly, the components listed above can have varying widths, heights, and/or lengths to provide a desired size. For example, the pole base cabinet 500 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches and/or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Fifth Pole Base Cabinet Configuration—FIGS. 29-33

With reference to FIGS. 29-33, a pole base cabinet, casing, housing, enclosure, locker 600 is described. Pole base cabinet 600 can include substantially the same or similar features described or shown herein in reference to other configurations of pole base cabinets. Similarly numbered features can be the same or similar.

Figure 29:
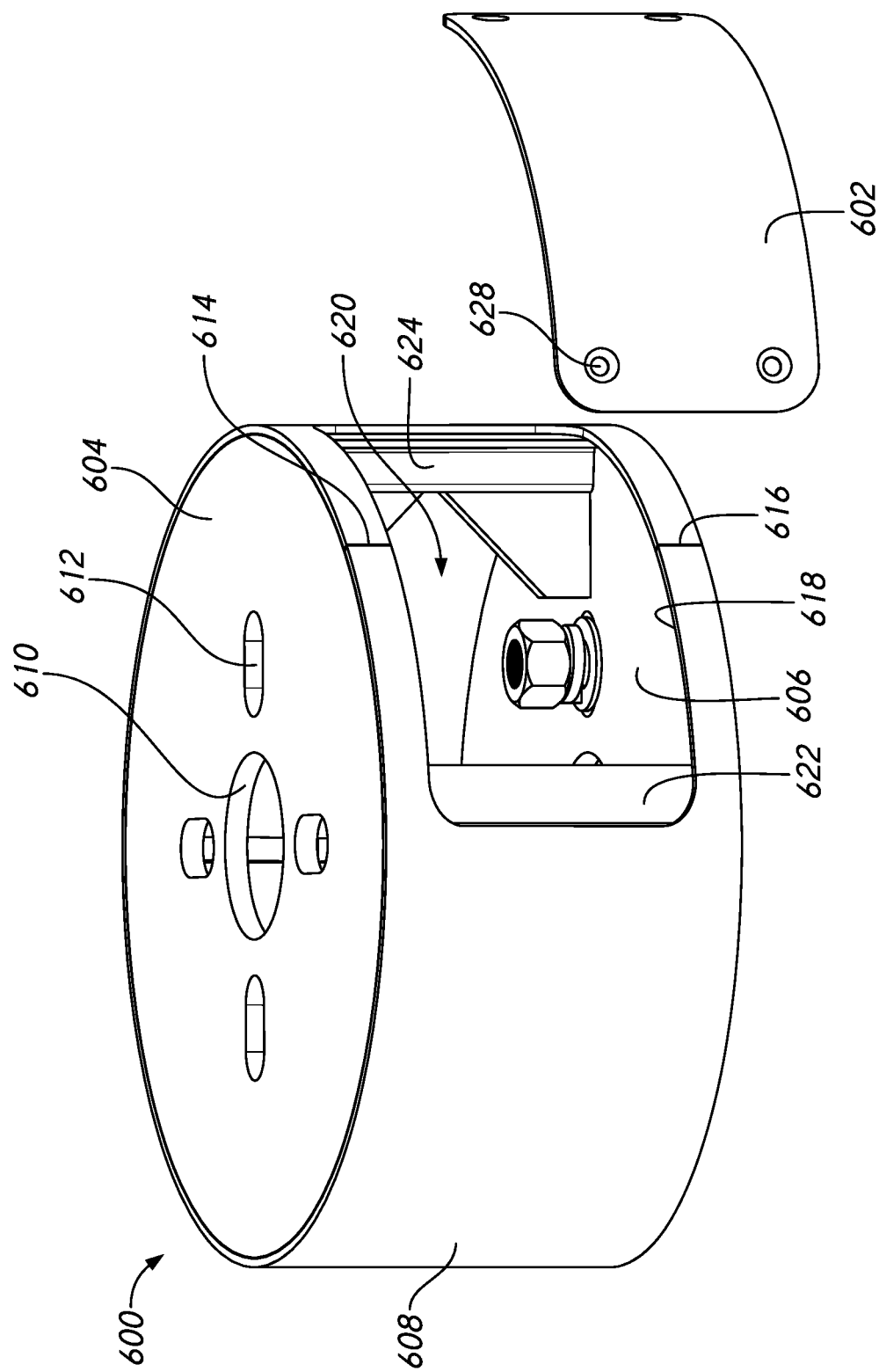
FIG. 29 schematically illustrates a perspective view of an example pole base cabinet.
Figure 30:
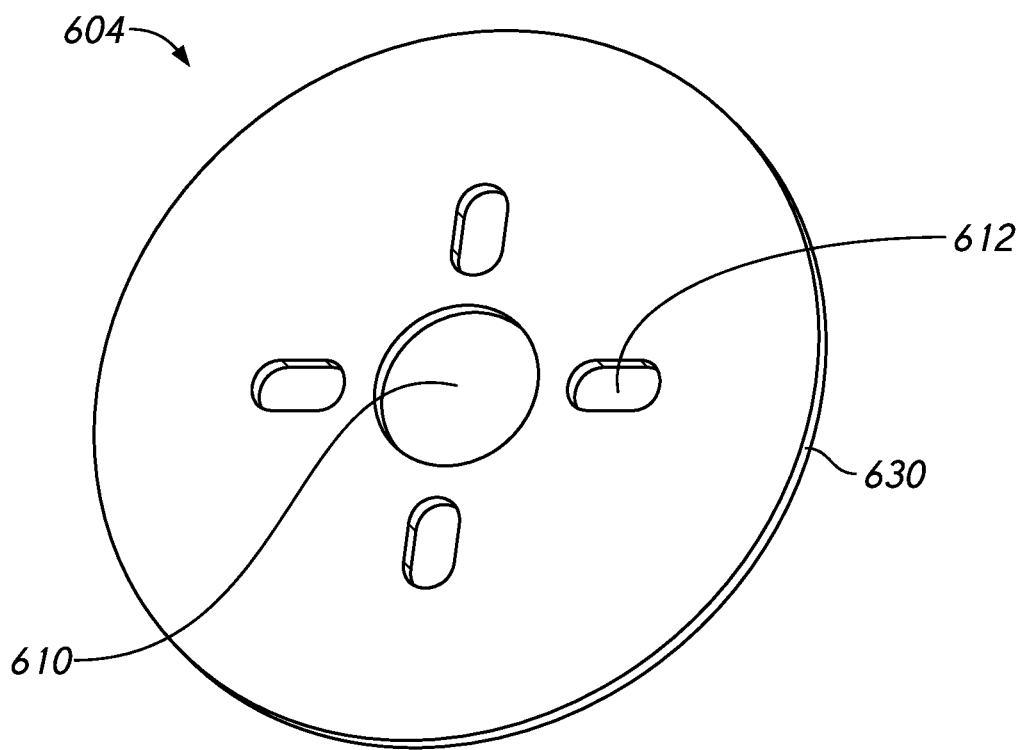
FIG. 30 schematically illustrates a top plate of the example pole base cabinet of FIG. 29.
Figure 31:
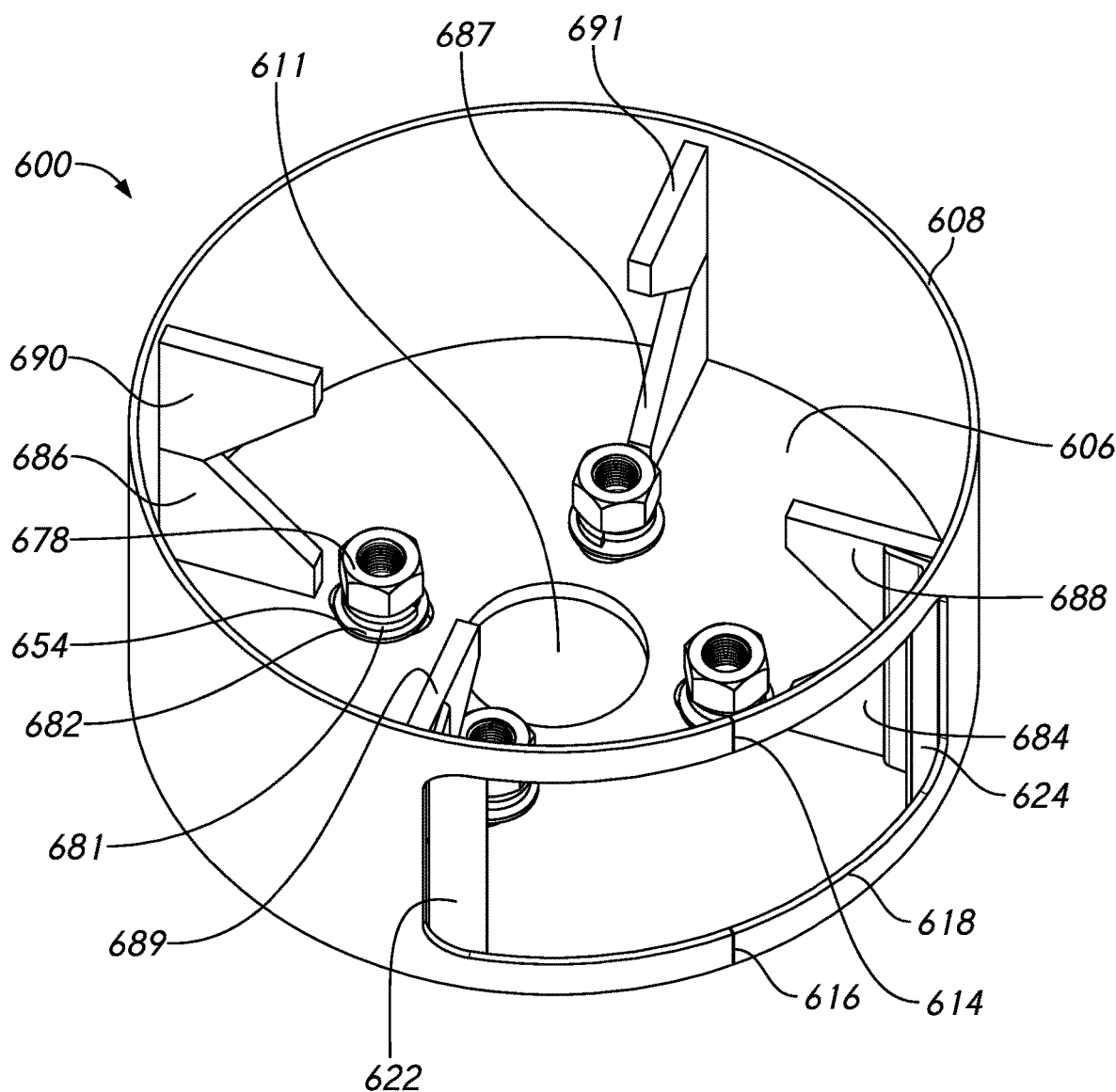
FIG. 31 schematically illustrates the example pole base cabinet of FIG. 29 with the top plate removed.
Figure 32:
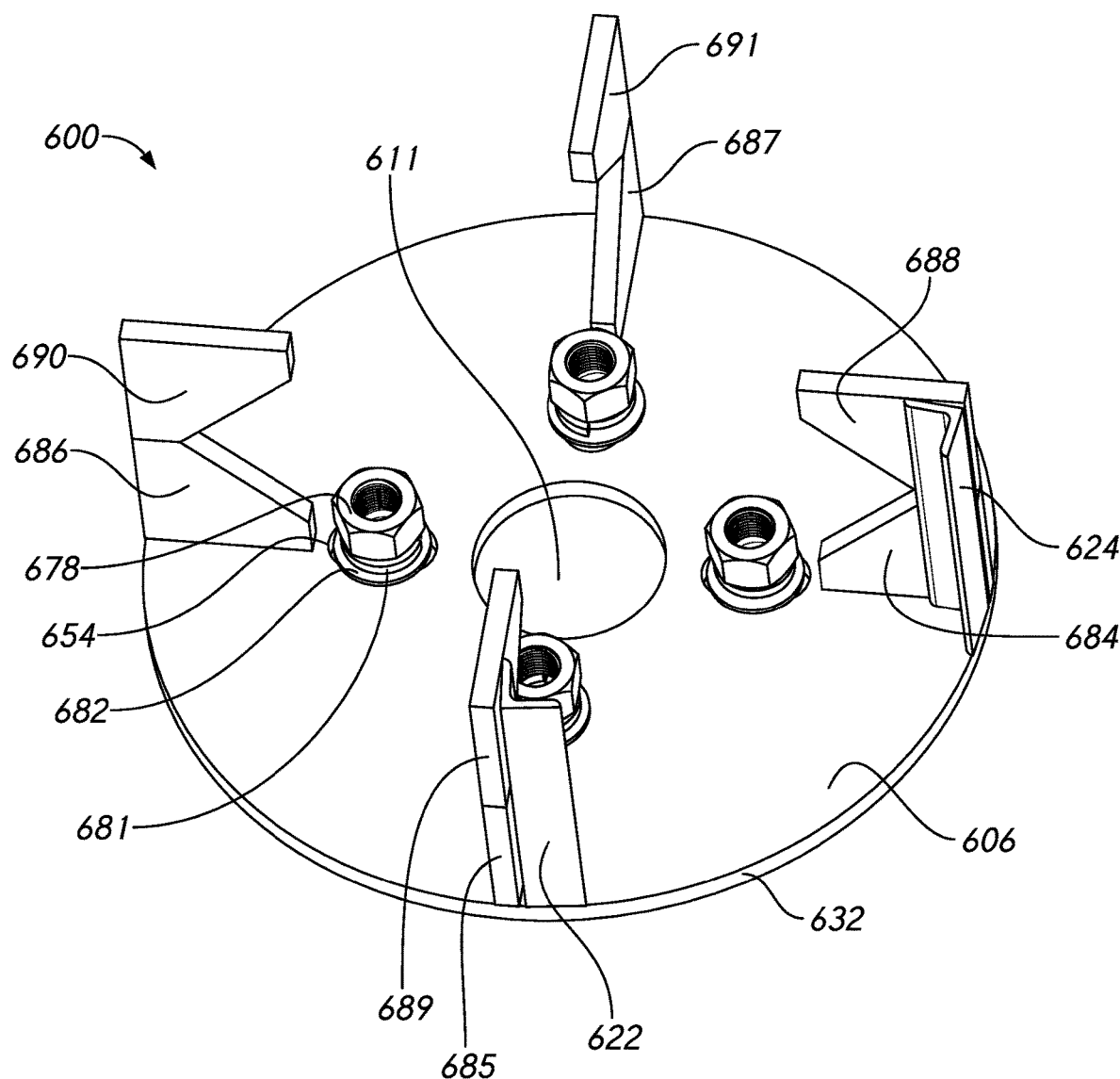
FIG. 32 schematically illustrates the example pole base cabinet of FIG. 29 with the top plate and peripheral wall removed.

As shown in FIG. 29, the pole base cabinet 600 can have a top or first plate, disc, sheet 604. The top plate 604 can have a periphery 630, as shown in FIG. 30. The top plate 604 can have an opening 610. The top plate 604 can have a plurality of apertures 612 used to couple the top plate 604 to a pole base. The top plate 604 can be similar to the top plate 204 but the plurality of apertures 612 can be elongate apertures with rounded ends. The pole base cabinet 600 can have a bottom or second plate, disc, sheet 606. The bottom plate 606, as shown in FIGS. 31 and 32, can be the same as the top plate 604. A washer 682, lock nut 681, and/or nut 678 can be used to couple the bottom plate 606 or top plate 604 to a bolt or anchor extending through the apertures 654 or 612.

A peripheral wall, side, surface 608 can extend between and/or be coupled to, which can include directly, rigidly, or fixedly connected, the top plate 604 and the bottom plate 606. The peripheral wall 608 can define a main opening 618 that allows access to a cavity 620. The peripheral wall 608 can be formed in a similar manner described in reference to the peripheral wall 208, resulting in the top joint 614 and/or the bottom joint 616. In a configuration, the peripheral wall 608 is manufactured or formed without creating a top joint 614 and/or bottom joint 616.

The main opening 618 can be covered by a door 602. The door 602 can releasably couple to the pole base cabinet 600, periphery of the main opening 618, and/or first flange, rim, border, frame, lip 624 and/or the second flange, rim, border, frame, lip 622. The door 602 can cover the main opening 618, restricting access to the cavity 620. The door 602 can uncover the main opening 618, as illustrated in FIG. 29, to allow access to the cavity 620. The door 602 can include door apertures 628. The door apertures 628 can be used to couple the door 602 to the pole base cabinet 600. Specifically, the door apertures 628 can be used to couple the door 602 to the first flange 624 and/or the second flange 622, described in more detail below.

The pole base cabinet, as shown in FIGS. 31 and 30, can include a plurality of support tabs, projections, protrusions, bosses, stiffeners, which can include a first top support tab 688, second top support tab 691, third top support tab 690, fourth top support tab 689, first bottom support tab 684, second bottom support tab 687, third bottom support tab 686, and/or fourth bottom support tab 685. The first top support tab 688, second top support tab 691, third top support tab 690, and/or fourth top support tab 689 can be coupled to, which can include directly, rigidly, or fixedly connected, the top plate 604. The first top support tab 688, second top support tab 691, third top support tab 690, and/or fourth top support tab 689 can be equally and/or unequally spaced apart from each other and/or distributed around the top plate 604, which can include being equally and/or unequally spaced apart and/or distributed around the opening 610 of the top plate 604, the top plate 604, and/or a central axis of the top plate 604. The first bottom support tab 684, second bottom support tab 687, third bottom support tab 686, and/or fourth bottom support tab 685 can be coupled to, which can include directly, rigidly, or fixedly connected, the bottom plate 606. The first bottom support tab 684, second bottom support tab 687, third bottom support tab 686, and/or fourth bottom support tab 685 can be equally and/or unequally spaced apart from each other and/or distributed around the bottom plate 606, which can include being equally and/or unequally spaced apart from each other and/or distributed around the bottom plate 606, the opening 611, and/or a central axis of the bottom plate 606.

The first top support tab 688, second top support tab 691, third top support tab 690, and/or fourth top support tab 689 can extend radially inward from the periphery 630 of the top plate 604. The first bottom support tab 684, second bottom support tab 687, third bottom support tab 686, and/or fourth bottom support tab 685 can extend radially inward from the periphery 632 of the bottom plate 606.

The first top support tab 688 can be coupled to, which can include directly, rigidly, or fixedly connected, the first bottom support tab 684 such that the first top support tab 688 and first bottom support tab 684 together extend between the top plate 604 and the bottom plate 606. The second top support tab 691 can be coupled to, which can include directly, rigidly, or fixedly connected, the second bottom support tab 687 such that the second top support tab 691 and the second bottom support tab 687 together extend between the top plate 604 and the bottom plate 606. The third top support tab 690 can be coupled to, which can include directly, rigidly, or fixedly connected, the third bottom support tab 686 such that the third top support tab 690 and the third bottom support tab 686 together extend between the top plate 604 and the bottom plate 606. The fourth top support tab 689 and the fourth bottom support tab 685 can be coupled together, which can include directly, rigidly, or fixedly connected, such that the fourth top support tab 689 and the fourth bottom support tab 685 together extend between the top plate and the bottom plate 606.

The first top support tab 688, first bottom support tab 684, third top support tab 690, and/or third bottom support tab 686 can be coplanar. A first plane can extend through the first top support tab 688, first bottom support tab 684, third top support tab 690, third bottom support tab 686, and/or two of the apertures 654. The second top support tab 691, second bottom support tab 687, fourth top support tab 689, and/or fourth bottom support tab 685 can be coplanar. A second plane can extend through the second top support tab 691, second bottom support tab 687, fourth top support tab 689, fourth bottom support tab 685 and/or two of the apertures 654. The first plane and the second plane can be perpendicularly oriented relative to each other.

The first top support tab 688 and first bottom support tab 684 can be positioned proximate the main opening 618, as shown in FIG. 31. The fourth top support tab 689 and fourth bottom support tab 685 can be positioned proximate the main opening 618, as shown in FIG. 31. The main opening 618 can separate and/or extend between the first top support tab 688 and first bottom support tab 684, and the fourth top support tab 689 and fourth bottom support tab 685.

The first flange 624 can be coupled to, which can include directly, rigidly, or fixedly connected, the first top support tab 688 and first bottom support tab 684. The second flange 622 can be coupled to the fourth top support tab 689 and fourth bottom support tab 685. The first flange 624 and the second flange 622 can extend into the opening 618. The first flange 624 and the second flange 622 extend between the top plate 604 and the bottom plate 606. The first flange 624 and/or the second flange 622 can be coupled to, which can include directly, rigidly, or fixedly connected, the top plate 604 and/or the bottom plate 606. The first flange 624 and/or the second flange 622 can be positioned proximate the periphery 630 of the top plate 604 and/or the periphery 632 of the bottom plate 606. The first flange 624 and the second flange 622 can be the same size and shape.

Figure 33:
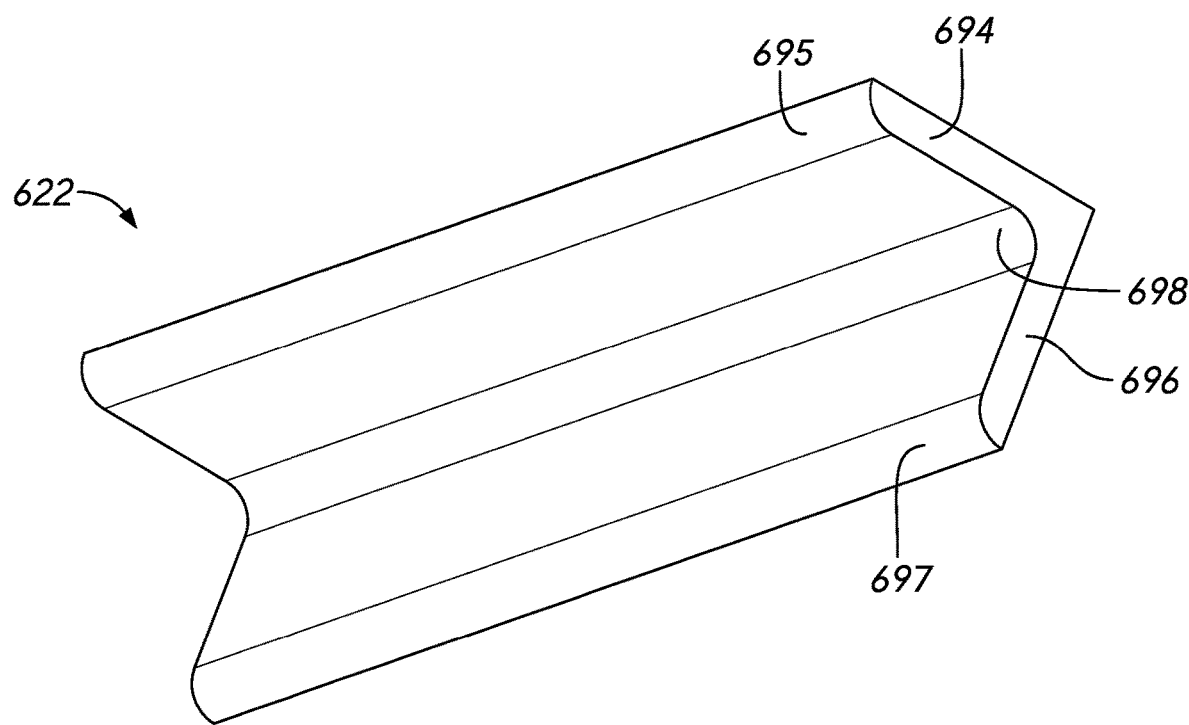
FIG. 33 schematically illustrates the first or second flange of the example pole base cabinet of FIG. 29.

As shown in FIG. 33, the first flange 624 and the second flange 622 can have a first side 694 and a second side 696. The first side 694 and/or the second side 696 can be coupled to, which can include directly, rigidly, or fixedly connected, the first top support tab 688, first bottom support tab 684, fourth top support tab 689, and fourth bottom support tab 685. The first side 694 and the second side 696 can be perpendicularly oriented relative to each other. The first side 694 has an end 695 that can be curved. The second side 696 has an end 697 that can be curved. A curve 698 can extend between the first side 694 and the second side 696.

The thickness and/or material of the varying components of the pole base cabinet 600 can vary depending on the desired structural integrity. For example, each of the plurality of support tabs can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The peripheral wall can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The top plate and/or bottom plate can have thicknesses of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Relatedly, the components listed above can have varying widths, heights, and/or lengths to provide a desired size. For example, the pole base cabinet 600 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches and/or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Figure 34:
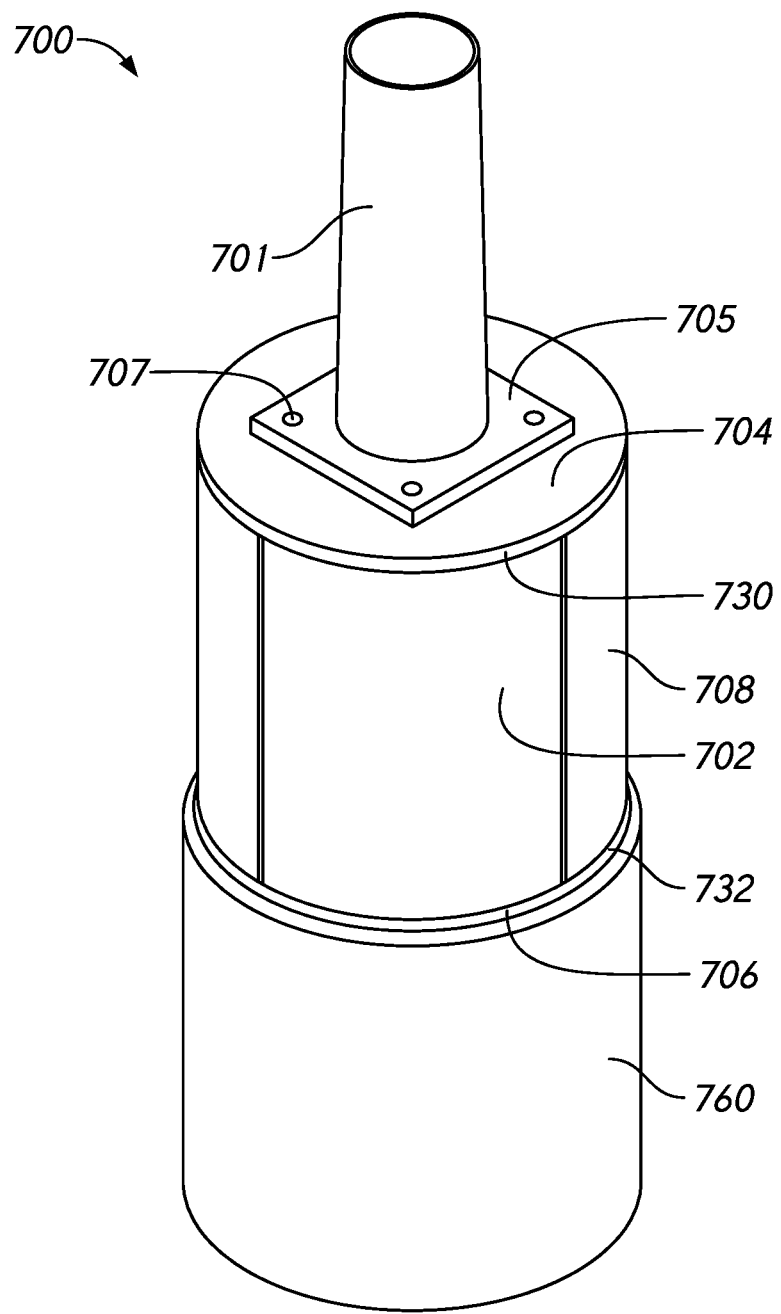
FIG. 34 schematically illustrates an example pole base cabinet positioned between a footing and pole.
Figure 35:
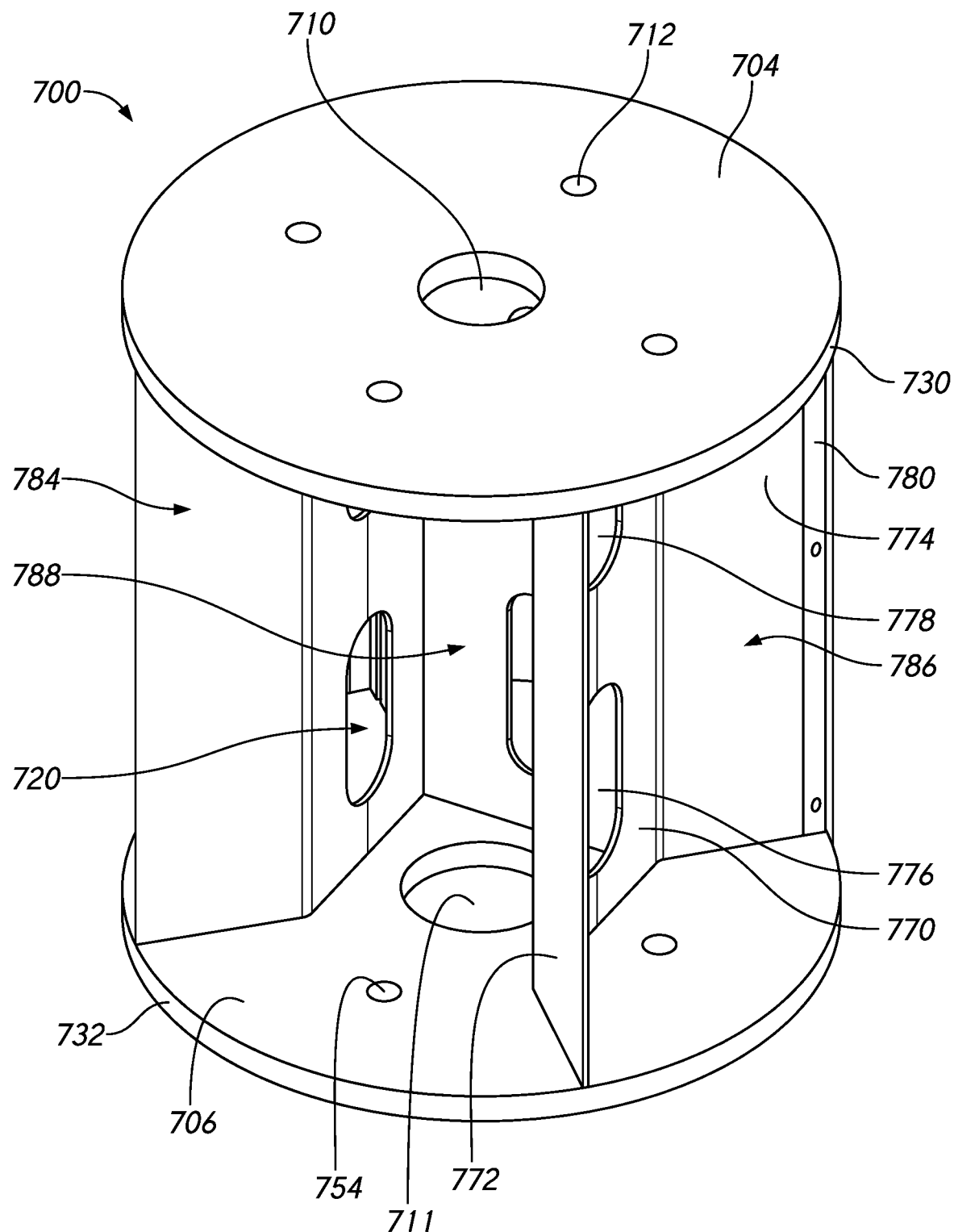
FIG. 35 schematically illustrates the example pole base cabinet of FIG. 34 with the peripheral wall removed.

Sixth Pole Base Cabinet Configuration—FIGS. 34-35

With reference to FIGS. 36-37, a pole base cabinet, casing, housing, enclosure, locker 700 is described. Pole base cabinet 700 can include substantially the same or similar features described or shown herein in reference to other configurations of pole base cabinets. Similarly numbered features can be the same or similar.

As shown in FIG. 34, a pole 701 can be mounted onto the pole base cabinet 700. Specifically, a pole base plate, baseplate 705 can be coupled to a top or first plate, disc, sheet 704 of the pole base cabinet 700. The baseplate 705 can have a plurality of apertures 707 that facilitate coupling the top plate 704 to the baseplate 705, using methods described herein (for example, using bolts, nuts, and/or washers). The top plate 704 can have a periphery 730. The pole base cabinet 700 can have a bottom plate 706. The bottom or second plate, disc, sheet 706 can have a periphery 732. A peripheral wall, side, surface 708 can extend between and/or be coupled to the top plate 704 and the bottom plate 706. The peripheral wall 708 can extend from and/or be coupled to, which can include directly, rigidly, or fixedly connected, the periphery 730 of the top plate 704 to the periphery 732 of the bottom plate 706. The peripheral wall 708 can extend from and/or be coupled to, which can include directly, rigidly, or fixedly connected, a bottom surface of the top plate 704 that is proximate the periphery 730 to a top surface of bottom plate 706 that is proximate the periphery 732. The peripheral wall 708 can define a main opening providing access into a cavity of the pole base cabinet 700 in which items can be stored. A door 702 can cover and/or uncover the main opening to restrict or provide access to the cavity. The pole base cabinet 700 can be secured to a footing 760. Specifically, the bottom plate 706 can be coupled to the footing 760.

As shown in FIG. 35, the top plate, disc, sheet 704 can be the same as the top plate 204 but with the plurality of apertures 712 spaced farther away from the opening 710 than the spacing between the apertures 212 and the opening 210. The bottom plate, disc, sheet 706 can be the same as the top plate 704. The bottom plate 706 can have an opening 711 that is larger than the opening 710.

The pole base cabinet 700 can have a frame for structural support which can include a plurality of support structures or structural supports, which can include a first support structure, support structure 786, second support structure, support structure 784, and/or third support structure, support structure 788. The first support structure 786, second support structure 784, and/or third support structure 788 can be the same or different size and shape. The first support structure 786, second support structure 784, and/or third support structure 788 can at least partially define the cavity of the pole base cabinet. The first support structure 786, second support structure 784, and/or third support structure 788 can extend between the top plate 704 and the bottom plate 706. The first support structure 786, second support structure 784, and/or third support structure 788 can be coupled to, which can include directly, rigidly, or fixedly connected, the top plate 704 and/or the bottom plate 706.

The first support structure 786, second support structure 784, and third support structure 788 can each include a center panel, plank, girder, joist, pillar, plank, brace, beam 770, a first panel wing, plank, girder, joist, pillar, plank, brace, beam 772, and a second panel wing, plank, girder, joist, pillar, plank, brace, beam 774. The center panel 770 can extend between the first panel wing 772 and the second panel wing 774. The center panel 770 of each of the first support structure 786, second support structure 784, and third support structure 788 can cooperate to define a square or rectangular shape that at least partially defines a cavity 720 of the pole base cabinet 700. The center panel 770 of each of the first support structure 786, second support structure 784, and third support structure 788 can be offset from and/or at least partially surround the opening 711 of the bottom plate 706 and opening 710 of the top plate. The center panel 770 of the first support structure 786 can be offset from and/or parallel to the center panel 770 of the second support structure 784. The center panel 770 of the third support structure 788 can extended between the center panels 770 of the first support structure 786 and the second support structure 784. The center panel 770 of the third support structure 788 can be perpendicular to the center panel 770 of each of the first support structure 786 and the second support structure 784. The center panel 770 can have a top opening 778 and/or a bottom opening 776. The top opening 778 and/or bottom opening 776 can be elongate openings with rounded ends. The top opening 778 and/or the bottom opening 776 can enable wires, cords, optical fibers, and other similar devices to be routed therethrough.

The first panel wing, first wing panel 772 and the second panel wing, second panel wing 774 can extend away from the center/central panel 770 at an angle, which can be the same or different angle. In a configuration, the first panel wing 772 and the second panel wing 774 extend to or proximate the periphery 730 of the top plate 704 and the periphery 732 of the bottom plate 706. In a configuration, the first panel wing 772 and the second panel wing 774 extend, couple (such as directly, rigidly, or fixedly connected), or be proximate to the peripheral wall 708. In a configuration, the top plate 704, bottom plate 706, first panel wing 772 of the first support structure 786, and second panel wing 774 of the second support structure 784 define the main opening of the pole base cabinet 700. In a configuration, the peripheral wall 708 extends from and/or can be coupled to (which can include directly, rigidly, or fixedly connected) the first panel wing 772 of the first support structure 786 to the second panel wing 774 of the second support structure 784 to define a periphery of the pole base cabinet 700 and/or the main opening. One of the plurality of apertures 712 and/or one of the plurality of apertures 754 can be positioned between the first panel wing 772 and the second panel wing 774 of each of the support structures.

The first support structure 786, second support structure 784, and third support structure 788 can be proximate and/or coupled to, which can include directly, rigidly, or fixedly connected, each other. The second panel wing 774 of the first support structure 786 and the first panel wing 772 of the third support structure 788 can be proximate, adjacent, and/or coupled to, which can include directly, rigidly, or fixedly connected, each other. The second panel wing 774 of the second support structure 784 and the first panel wing 772 of the third support structure 788 can be proximate, adjacent, and/or coupled to, which can include directly, rigidly, or fixedly connected, each other. In a configuration, a fastener or clip 780 can be used to join the first support structure 786, second support structure 784, and/or third support structure 788. In a configuration, the first support structure 786, second support structure 784, and/or third support structure 788 can be coupled, which can include directly, rigidly, or fixedly connected, via welding, a threaded connection, rivets, adhesion, and/or other similar mechanisms.

The thickness and/or material of the varying components of the pole base cabinet 700 can vary depending on the desired structural integrity. For example, each of the plurality of structural supports can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The peripheral wall can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The top plate and/or bottom plate can have thicknesses of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Relatedly, the components listed above can have varying widths, heights, and/or lengths to provide a desired size. For example, the pole base cabinet 700 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches and/or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Seventh Pole Base Cabinet Configuration—FIGS. 36-37

With reference to FIGS. 36-37, a pole base cabinet 800 is described. Pole base cabinet 800 can include substantially the same or similar features described or shown herein in reference to other configurations of pole base cabinets. Similarly numbered features can be the same or similar.

The pole base cabinet 400 can have a top or first plate, disc, sheet 804. The top plate 804 can include a plurality of apertures 812 that can be used to couple the top plate 804 to the base of a pole, such as a pole base plate. The top plate 804 can have a periphery 830. The top plate 804 can have one or more openings 809, which can include one, two, three, four, five, six, and/or more openings 809. The one or more openings 809 can be similar to the opening 210. The one or more openings 809 can be at any position of the top plate 804. The one or more openings 809, similar to opening 210, can be used to allow wiring, cords, optical fibers, and/or other devices through the top plate 804 and into a cavity 820 of the pole base cabinet 800.

The pole base cabinet 800 can have a bottom or second plate, disc, sheet 806. The bottom plate 806 can be the same as the top plate 804. The bottom plate 806 has a plurality of apertures 854 that can be used to couple the bottom plate 806 to a footing (also referred to as a base). The bottom plate 806 can have one or more openings 819, which can include one, two, three, four, five, six, and/or more openings 819. The one or more openings 819 can be similar to the opening 211 and/or one or more openings 809. The one or more openings 819 can be at any position of the bottom plate 806. The one or more openings 819, similar to opening 211, can be used to allow wiring, cords, optical fibers, and/or other devices through the bottom plate 806 and into a cavity 820 of the pole base cabinet 800.

The pole base cabinet 800 can have a peripheral wall, side, surface 808 that can extend from and/or be coupled to, which can include directly, rigidly, or fixedly connected, the top plate 804 to the bottom plate 806. The peripheral wall 808 can extend from and/or be coupled to, which can include directly, rigidly, or fixedly connected, the periphery 830 of the top plate 804 to the periphery of the bottom plate 806. The peripheral wall 808 can have a main opening that is covered and uncovered by the door 802 allowing access into the cavity 820.

The pole base cabinet 800 can have a column 813. The column 813 can have a cross-section that is circular, polygonal, irregular, and/or another shape. The column 813 can extend from and/or be coupled to, which can include directly, rigidly, or fixedly connected, the bottom plate 806 to the top plate 804. A central longitudinal axis of the pole base cabinet 800 can extend through the column 813. The column 813 can extend from and/or be coupled to, which can include directly, rigidly, or fixedly connected, a center of the top plate 804 to the bottom plate 806. In a configuration, the column 813 is not positioned along the central longitudinal axis of the pole base cabinet 800 or at the center of the top plate 804 and/or the bottom plate 806. The column 813 can be a load bearing feature of the pole base cabinet 800.

The thickness and/or material of the varying components of the pole base cabinet 800 can vary depending on the desired structural integrity. For example, the column 813 can have a diameter or cross-sectional width of less than 1, 1-1½, 1½-2, 2-2½, 2½-3, 3-3½, 3½-4, 4-4½, 4½-5, 5-5½, 5½-6, 6½-7, 7½-8, 8½-9, 9½-10, or greater than 10 inches. The peripheral wall can have a thickness of less than ⅟₁₆, ⅟₁₆-¼, ¼-½, ½-¾, ¾-1, 1-1¼, 1¼-1½, 1½-1¾, 1¾-2, 2-2¼, 2¼-2½, 2½-2¾, 2¾-3, 3-3¼, 3¼-3½, 3½-3¾, 3¾-4, and/or greater than 4 inches. The top plate and/or bottom plate can have thicknesses of less than ⅟₁₆, ⅟₁₆-¼, ¼-½, ½-¾, ¾-1, 1-1¼, 1¼-1½, 1½-1¾, 1¾-2, 2-2¼, 2¼-2½, 2½-2¾, 2¾-3, 3-3¼, 3¼-3½, 3½-3¾, 3¾-4, and/or greater than 4 inches. Relatedly, the components listed above can have varying widths, heights, and/or lengths to provide a desired size. For example, the pole base cabinet 800 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches and/or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Figure 39:
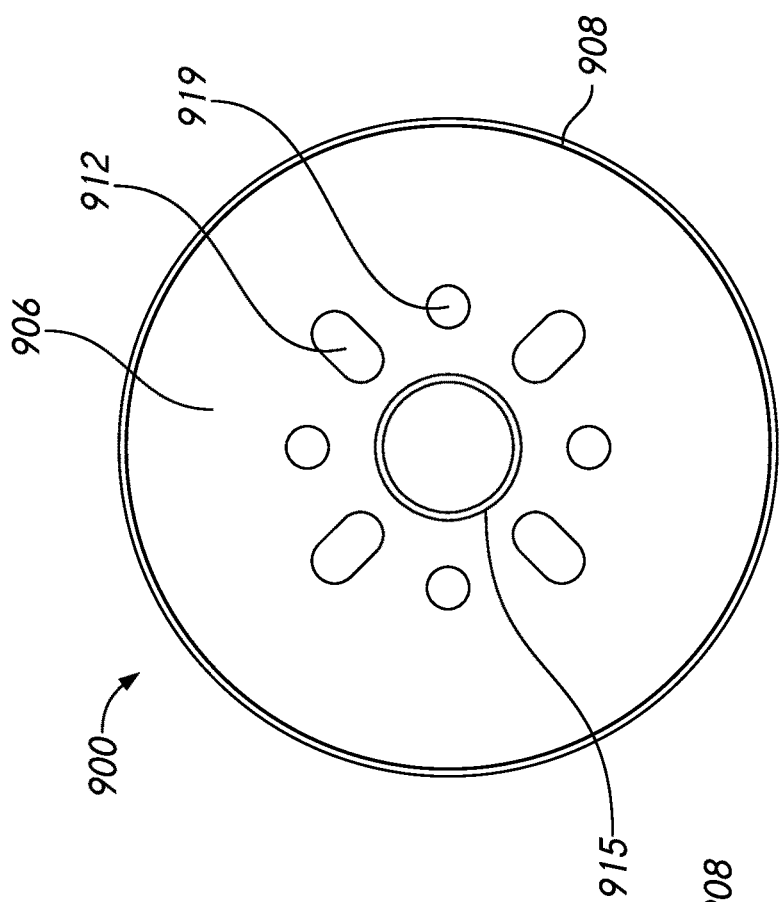
FIG. 39 schematically illustrates a top view of the example pole base cabinet of FIG. 38 with the top plate removed.
Figure 38:
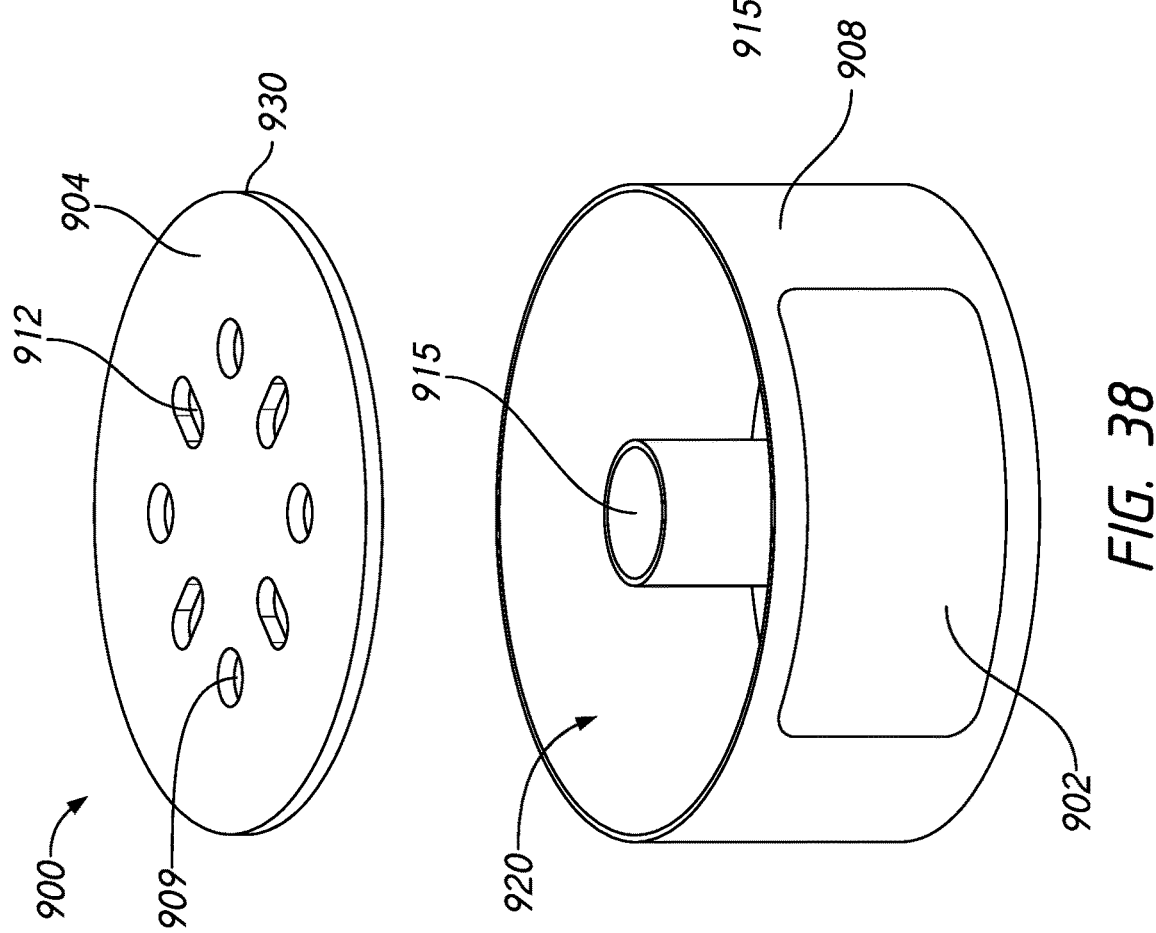
FIG. 38 schematically illustrates an example pole base cabinet with the top plate removed.

Eighth Pole Base Cabinet Configuration—FIGS. 38-39

With reference to FIGS. 38-39, a pole base cabinet, casing, housing, enclosure, locker 900 is described. Pole base cabinet 900 is substantially the same or similar as pole base cabinet 800 apart from the differences detailed below. The pole base cabinet 900 can have a top or first plate, disc, sheet 904, which can have a periphery 930, plurality of apertures 912, a door 902, one or more openings 909, and/or one or more openings 919. The pole base cabinet 900 can have a bottom or second plate, disc, sheet 906, which can include a plurality of apertures 912 and/or one or more openings 919. The pole base cabinet 900 can have a peripheral wall, side, surface 908 that extends between and/or is coupled to, which can include directly, rigidly, or fixedly connected, the top plate 904 and/or the bottom plate 906. The pole base cabinet 900 has a tube 915, instead of a column 813. The tube 915 is hollow, having a central cavity. The tube 915 can be positioned the same as described in reference to the column 813 as described above. The tube 915 can be a load bearing feature of the pole base cabinet 900. The pole base cabinet 900 can have a door 902 providing access to a cavity 920.

The thickness and/or material of the varying components of the pole base cabinet 900 can vary depending on the desired structural integrity. For example, the tube 915 can have an outer diameter or cross-sectional width of less than 1, 1-1½, 1½-2, 2-2½, 2½-3, 3-3½, 3½-4, 4-4½, 4½-5, 5-5½, 5½-6, 6½-7, 7½-8, 8½-9, 9½-10, or greater than 10 inches and/or a tubular wall thickness of less than ⅟₁₆, ⅟₁₆-¼, ¼-½, ½-¾, ¾-1, 1-1¼, 1¼-1½, 1½-1¾, 1¾-2, 2-2¼, 2¼-2½, 2½-2¾, 2¾-3, 3-3¼, 3¼-3½, 3½-3¾, 3¾-4, and/or greater than 4 inches. The peripheral wall can have a thickness of less than ⅟₁₆, ⅟₁₆-¼, ¼-½, ½-¾, ¾-1, 1-1¼, 1¼-1½, 1½-1¾, 1¾-2, 2-2¼, 2¼-2½, 2½-2¾, 2¾-3, 3-3¼, 3¼-3½, 3½-3¾, 3¾-4, and/or greater than 4 inches. The top plate and/or bottom plate can have thicknesses of less than ⅟₁₆, ⅟₁₆-¼, ¼-½, ½-¾, ¾-1, 1-1¼, 1¼-1½, 1½-1¾, 1¾-2, 2-2¼, 2¼-2½, 2½-2¾, 2¾-3, 3-3¼, 3¼-3½, 3½-3¾, 3¾-4, and/or greater than 4 inches. Relatedly, the components listed above can have varying widths, heights, and/or lengths to provide a desired size. For example, the pole base cabinet 900 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Figure 41:
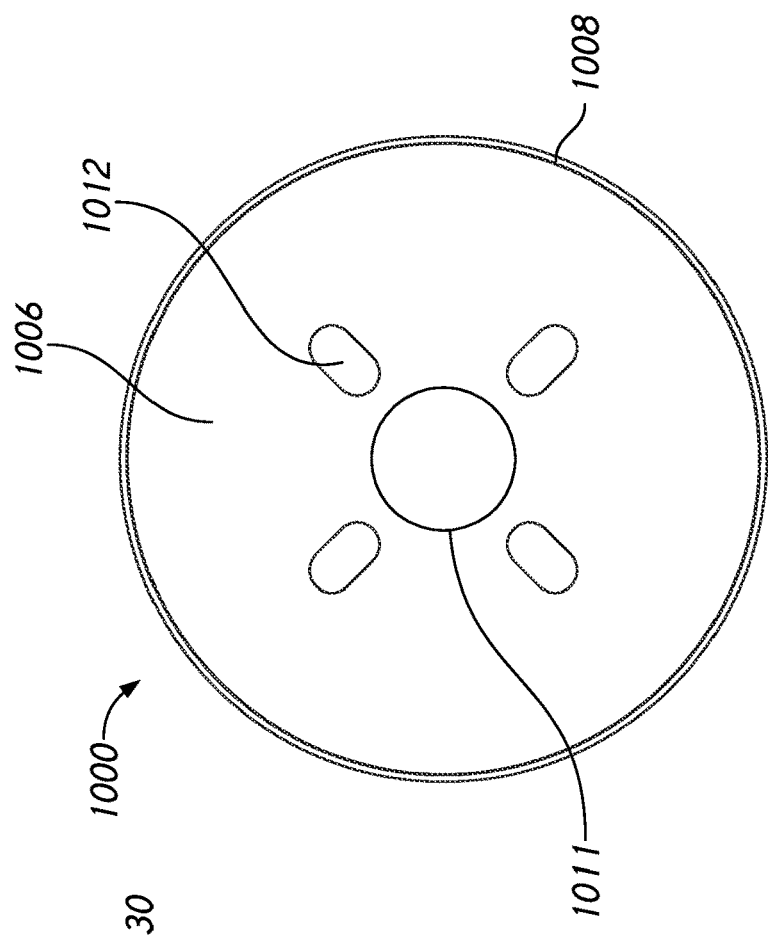
FIG. 41 schematically illustrates a top view of the example pole base cabinet of FIG. 40 with the top plate removed.
Figure 40:
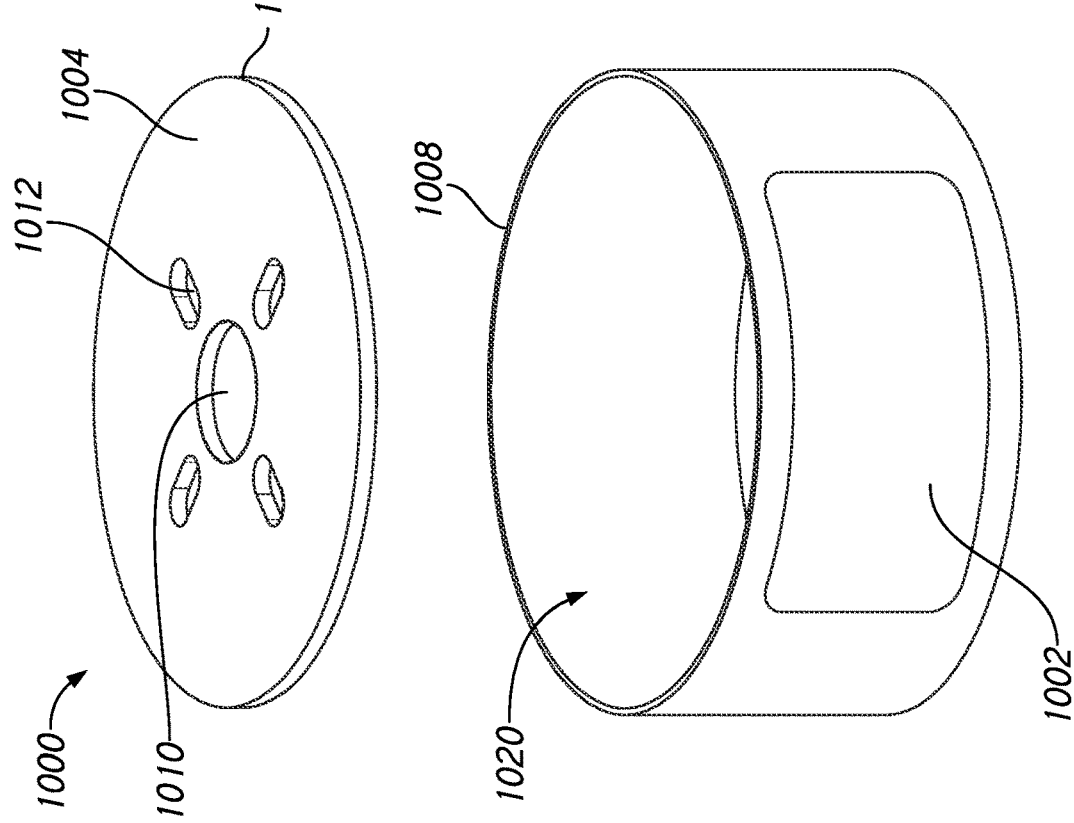
FIG. 40 schematically illustrates an example pole base cabinet with the top plate removed.

Ninth Pole Base Cabinet Configuration—FIGS. 40-41

With reference to FIGS. 40-41, a pole base cabinet, casing, housing, enclosure, locker 1000 is described. Pole base cabinet 1000 is substantially the same or similar as pole base cabinet 800 apart from the differences detailed below. The pole base cabinet 1000 does not have a column 813 or tube 915 for structural support. Instead, the peripheral wall, side, surface 1008 is made of a high-load bearing material, such as high-strength steel, high-density steel, and/or hollow structural steel and/or tubing, for structural support. Not having internal support structures can advantageously provide more storage space in the cavity 1020. The pole base cabinet 1000 can have a door 1002 providing access to the cavity 1020. The top or first plate, disc, sheet 1004 can be the same as the top plate 604 of pole base cabinet 600. The top plate 1004 can have an opening 1010, a periphery 1030, and/or a plurality of apertures. The pole base cabinet 1000 can have bottom or second plate, disc, sheet 1006, which can have a plurality of apertures 1012 and/or opening 1011. The pole base cabinet 1000 can have a peripheral wall, side, surface 1008 that extends between and/or is coupled to, which can include directly, rigidly, or fixedly connected, the top plate 1004 and/or the bottom plate 1006. The peripheral wall 1008 can define or have a circular periphery and/or define a circular periphery of the pole base cabinet 1000.

The thickness and/or material of the varying components of the pole base cabinet 1000 can vary depending on the desired structural integrity. The peripheral wall can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The top plate and/or bottom plate can have thicknesses of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Relatedly, the components listed above can have varying widths, heights, and/or lengths to provide a desired size. For example, the pole base cabinet 1000 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

Tenth Pole Base Cabinet Configuration—FIGS. 42A-51

With reference to FIGS. 42A-51, a pole base cabinet, casing, housing, enclosure, locker 2000 is described. Pole base cabinet 2000 can include substantially the same or similar features described or shown herein in reference to other configurations of pole base cabinets. Similarly numbered features can be the same or similar.

As shown in FIGS. 42A, 42B, 43, and 45, the pole base cabinet 2000 can have a top or first plate, disc, sheet 2004. The top plate 2004 can have a periphery, perimeter 2030 that is circular, as shown, or polygonal, irregular, and/or others. The top plate 2004 can have a plurality of apertures 2012, which can include two, three, four, five, six, or more apertures 2012. The apertures 2012 can be used to secure the top plate 2004 to a pole base, such as a pole base plate. For example, bolts attached to a pole base can extend through the apertures 2012 and be secured with nuts, washers, and/or other similar devices, coupling the top plate 2004 and pole base cabinet 2000 to the pole base and pole. The apertures 2012 can have a circular, polygonal, irregular, and/or other shape. The apertures 2012 can all be the same or have varying shapes and/or sizes. The apertures 2012 can cooperate to form a circular, polygonal, irregular, and/or other shape depending on what configuration is required or desired to couple to a corresponding pole base and/or is needed for structural integrity. The apertures 2012 can cooperate to form a square with each aperture 2012 forming a corner thereof. The aperture 2012 can be elongate with rounded ends. The apertures 2012 can be oversized relative to a bolt that will extend therethrough. Having over-sized apertures 2012 relative to the bolt can be advantageous for convenient alignment. Apertures 2012 can be oversized relative to corresponding apertures of a pole base or pole base plate, which can be advantageous for convenient alignment.

The top plate 2004 can have an opening 2010. The opening 2010 can used to allow wiring, cords, optical fibers, and/or other devices through the top plate 2004 and into and/or out of a cavity 2020 of the pole base cabinet 2000. The opening 2010 can be centrally located. In a configuration, the opening 2010 can be located at any position on the top plate 2004. The opening 2010 can have a circular, polygonal, irregular, and/or other shape. In a configuration, a periphery defining the opening 2010 can be rounded to reduce abrasion on devices extending therethrough. In a configuration, a periphery defining the opening 2010 can be coated or covered with a non-abrasive material to reduce abrasion on devices extending therethrough. In a configuration, the apertures 2012 can be distributed around the opening 2010, which can include circumferentially or radially distributed. In a configuration, the opening 2010 can be located centered relative to the plurality of apertures 2012. The opening 2010 can be larger than each of the apertures 2012.

As shown in FIGS. 42A, 42B, 43, and 46, the pole base cabinet 2000 can have a bottom or second plate, disc, sheet 2006. The bottom plate 2006 can have a periphery 2032 that is circular, as shown, or polygonal, irregular, and/or others. The periphery 2032 of the bottom plate 2006 can be the same as the periphery 2030 of the top plate 2004. The periphery 2032 of the bottom plate 2006 can be different than the periphery 2030 of the top plate 2004. The bottom plate 2006 can have a plurality of apertures 2054, which can include two, three, four, five, six, or more apertures 2054. The apertures 2054 can be used to secure the bottom plate 2006 to a footing or base, such as a concrete base or other support or structure, which can include a footing above grade or below grade. For example, bolts or an anchor attached to the footing and/or rebar can extend through the apertures 2054 and be secured with nuts, washers, and/or other similar devices, coupling the bottom plate 2006 and the pole base cabinet 2000 to the footing. The plurality of apertures 2054 can be the same as the plurality of apertures 2012. The apertures 2054 can have a circular, polygonal, irregular, and/or other shape. The apertures 2054 can all be the same or have varying shapes and/or sizes.

The apertures 2054 can be arranged in different configurations. The apertures 2054 can cooperate to form a square with each aperture 2054 forming a corner thereof. The apertures 2054 can cooperate to form a circular, polygonal, irregular, and/or other shape depending on what configuration is required to couple to a corresponding footing or bolt arrangement. In a configuration, the top plate 2004 can be the same as the bottom plate 2006. The apertures 2054 can be elongate with rounded ends. The apertures 2054 can be oversized relative to a bolt that will extend therethrough. Having over-sized apertures 2054 relative to the bolt can be advantageous for convenient alignment. Apertures 2054 can be oversized relative to corresponding apertures of a footing or base, such as a concrete base or other support or structure (e.g., a footing above grade or below grade), which can be advantageous for convenient alignment.

The bottom plate 2006 can have a plurality of apertures 2055, which can include two, three, four, five, six, or more apertures 2055. The apertures 2055 can be used to secure the bottom plate 2006 to a footing or base, such as a concrete base or other support or structure, which can include a footing above grade or below grade. In some embodiments, conduits, tubing, and/or wiring extend through apertures 2055 and into the cavity 2020. In some embodiments, bolts or an anchor attached to the footing and/or rebar can extend through the apertures 2055 and be secured with nuts, washers, and/or other similar devices, coupling the bottom plate 2006 and the pole base cabinet 2000 to the footing. The apertures 2055 can have a circular, polygonal, irregular, and/or other shape. The apertures 2055 can all be the same or have varying shapes and/or sizes. The apertures 2055 can be arranged in different configurations. Each of the apertures 2055 can be positioned between adjacent apertures 2054. Each of the apertures 2055 can be positioned along a side of a square defined by the apertures 2054. In some embodiments, each of the apertures 2055 can be positioned along a side of a square defined by the apertures 2054, excluding the side closest to a door 2002 and/or main opening 2018 of the pole base cabinet 2000. In some embodiments, a longitudinal axis of each of the apertures 2055 can be perpendicular to each other. In some embodiments, a longitudinal axis of each of the apertures 2055 can be respectively parallel to a first support panel 2034, second support panel 2036, and third support panel 2038 of the pole base cabinet 2000.

The apertures 2055 can cooperate to form a circular, polygonal, irregular, and/or other shape depending on what configuration is required to couple to a corresponding footing or bolt arrangement. The apertures 2055 can be elongate with rounded ends. The apertures 2055 can be oversized relative to a bolt that will extend therethrough. Having over-sized apertures 2055 relative to the bolt can be advantageous for convenient alignment. Apertures 2055 can be oversized relative to corresponding apertures of a footing or base, such as a concrete base or other support or structure (e.g., a footing above grade or below grade), which can be advantageous for convenient alignment. In some embodiments, apertures 2055 can be larger than apertures 2054.

The bottom plate 2006 can have an opening 2011. The opening 2011 can be used to allow wiring, cords, optical fibers, and/or other devices through the bottom plate 2006 and into and/or out of the cavity 2020 of the pole base cabinet 2000. For example, wiring and/or cables can be routed through conduits in a footing or base upon which the pole base cabinet 2000 is mounted and extend through the opening 2011 and into the cavity 2020. The wiring and/or cables can be used to supply electrical power to components/items stored in the cavity 2020, components/items stored outside the cavity 2020, and/or a light source mounted on a pole that is coupled to the pole base cabinet 2000. The opening 2011 can be centrally located. In a configuration, the opening 2011 can be located at any position on the bottom plate 2006.

The opening 2011 can have a circular, polygonal, irregular, and/or other shape. In a configuration, a periphery defining the opening 2011 can be rounded to reduce abrasion on devices extending therethrough. In a configuration, a periphery defining the opening 2011 can be coated or covered with a non-abrasive material to reduce abrasion on devices extending therethrough. In a configuration, the apertures 2054 and/or apertures 2055 can be distributed around the opening 2011, which can include circumferentially or radially distributed. In a configuration, the opening 2011 can be centrally located relative to the plurality of apertures 2054 and/or apertures 2055. The opening 2011 can be larger than each of the apertures 2054 and/or apertures 2055. The opening 2011 can be the same as or different than the opening 2010. In a configuration, the opening 2011 is larger than the opening 2010.

The top plate 2004 and the bottom plate 2006 can be offset and/or parallel from each other. The top plate 2004 and the bottom plate 2006 can define ends and/or opposing ends of the pole base cabinet 2000. The top plate 2004 and the bottom plate 2006 can be flat. In a configuration, the top plate 2004 and/or the bottom plate 2006 can include recesses, curves, and/or contours. The top plate 2004 and the bottom plate 206 can be positioned on a center-longitudinal axis of the pole base cabinet 2000. The top plate 2004 and the bottom plate 2006 can be centered on a center-longitudinal axis of the pole base cabinet 2000. In a configuration, the top plate 2004 can be the same as the bottom plate 2006.

In a configuration, the top plate 2004 does not have an opening 2010 and/or the bottom plate 2006 does not have an opening 2011.

Figure 42A:
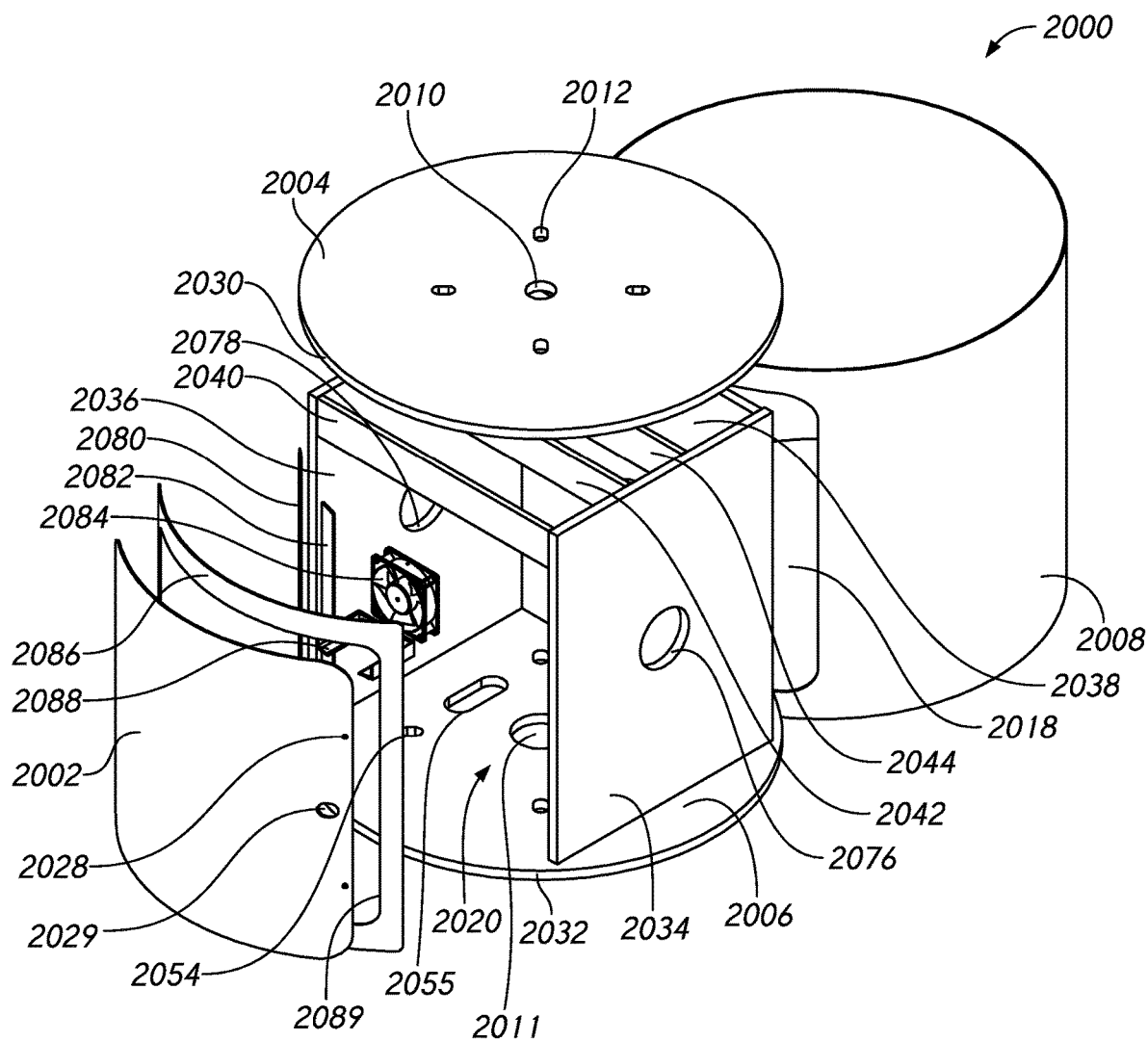
FIG. 42A schematically illustrates a perspective exploded view of an example pole base cabinet.
Figure 42B:
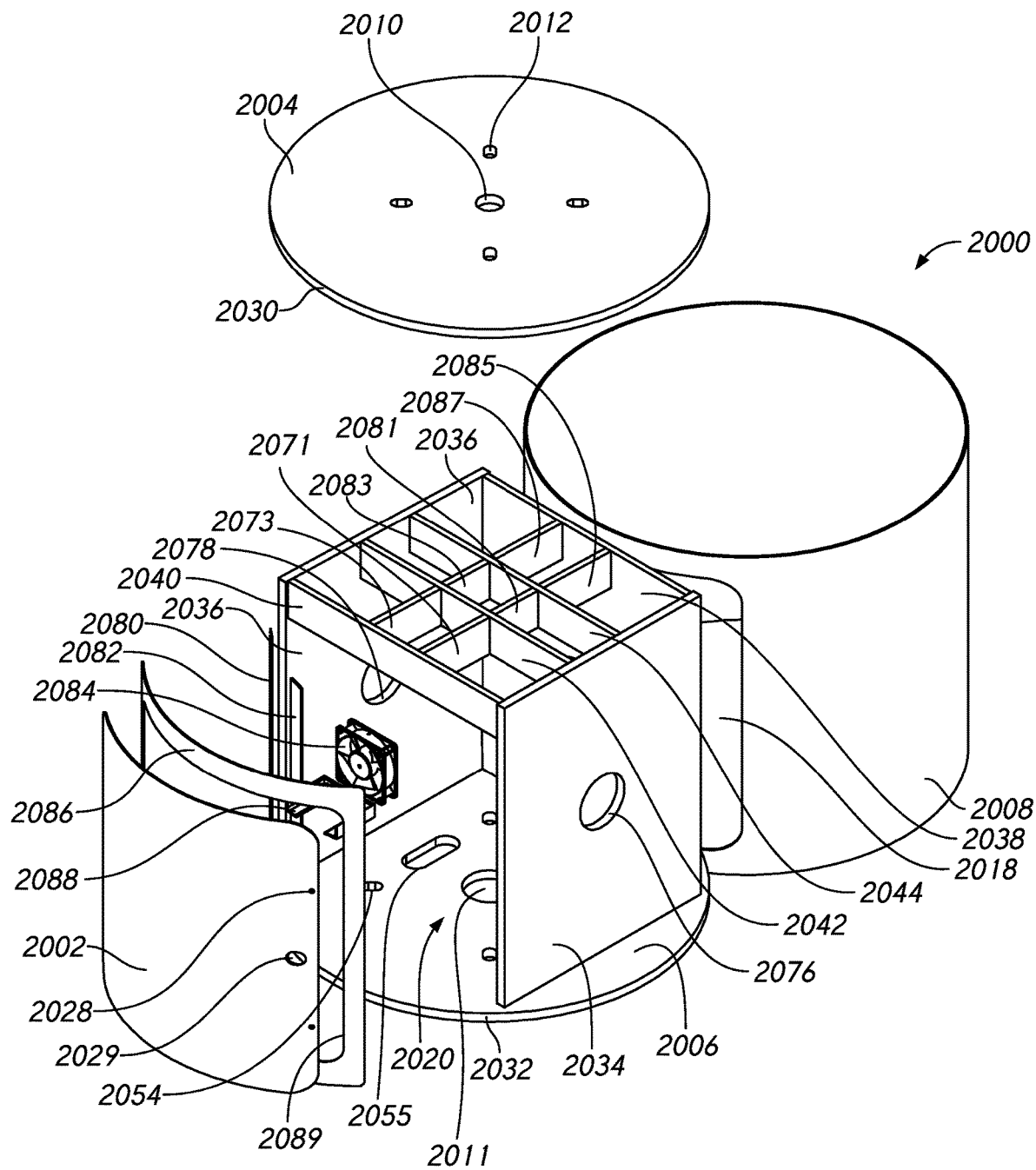
FIG. 42B schematically illustrates a perspective exploded view of an example pole base cabinet.
Figure 43:
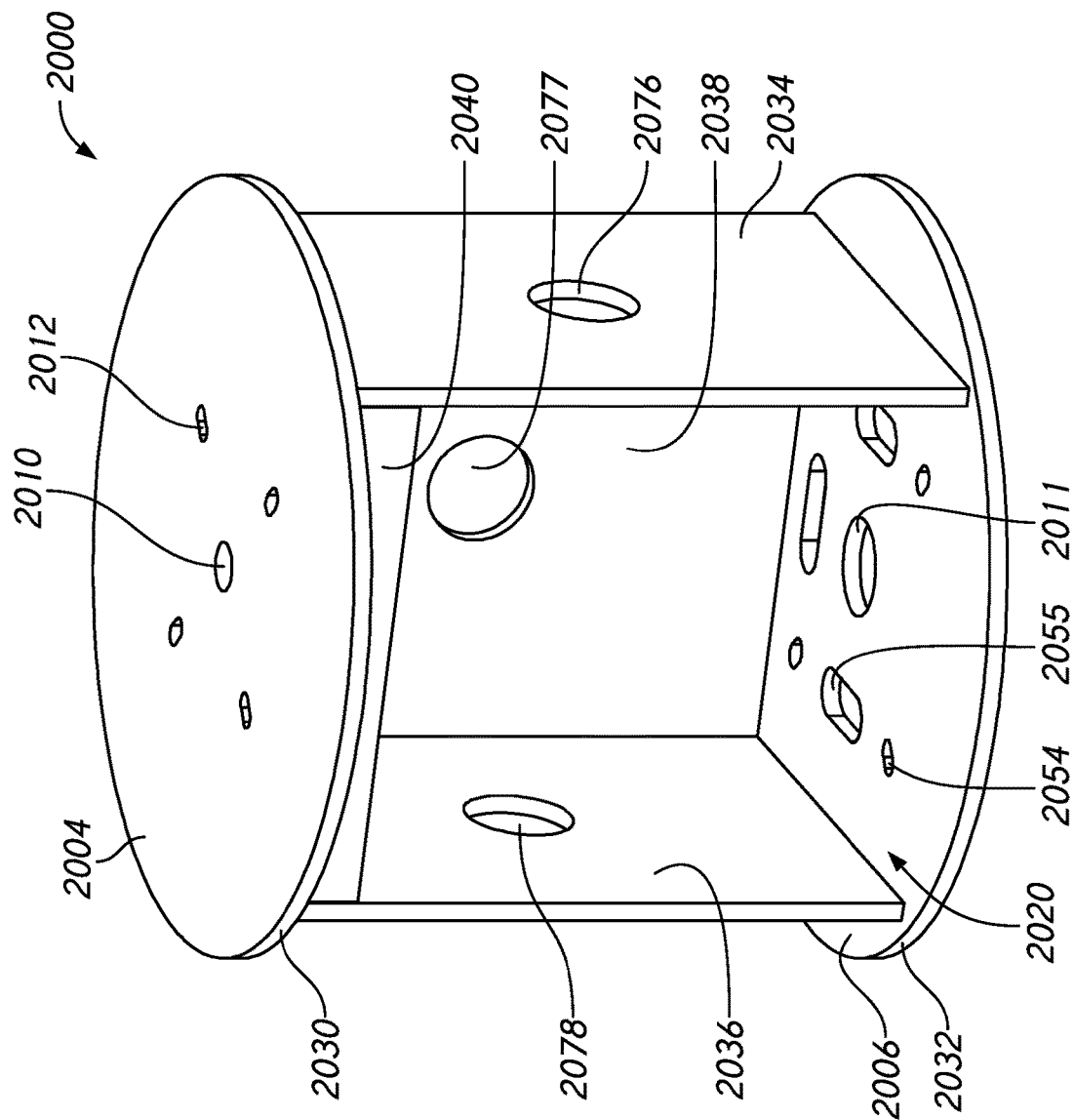
FIG. 43 schematically illustrates a perspective view of the example pole base cabinet of FIGS. 42A and/or 42B with the peripheral wall and door removed.
Figure 44:
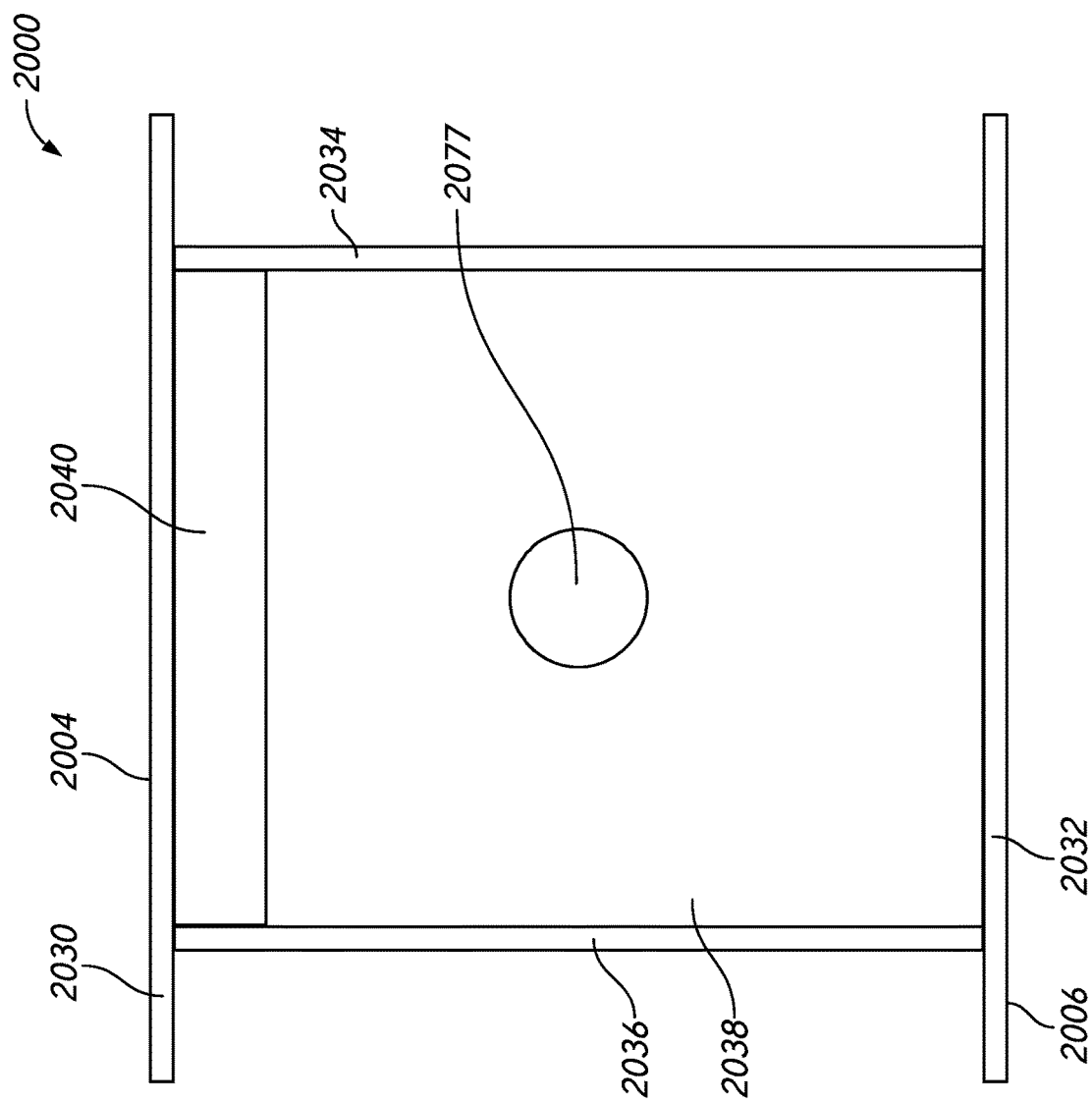
FIG. 44 schematically illustrates a front view of the example pole base cabinet of FIG. 43.
Figure 46:
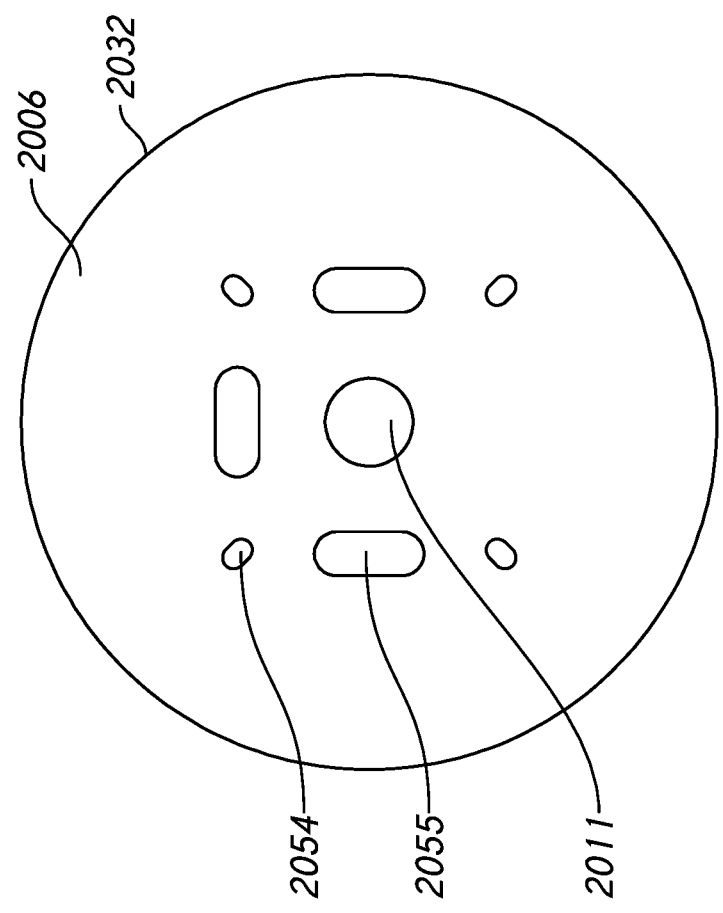
FIG. 46 schematically illustrates a top view of a bottom plate of the example pole base cabinet of FIGS. 42A and/or 42B.
Figure 45:
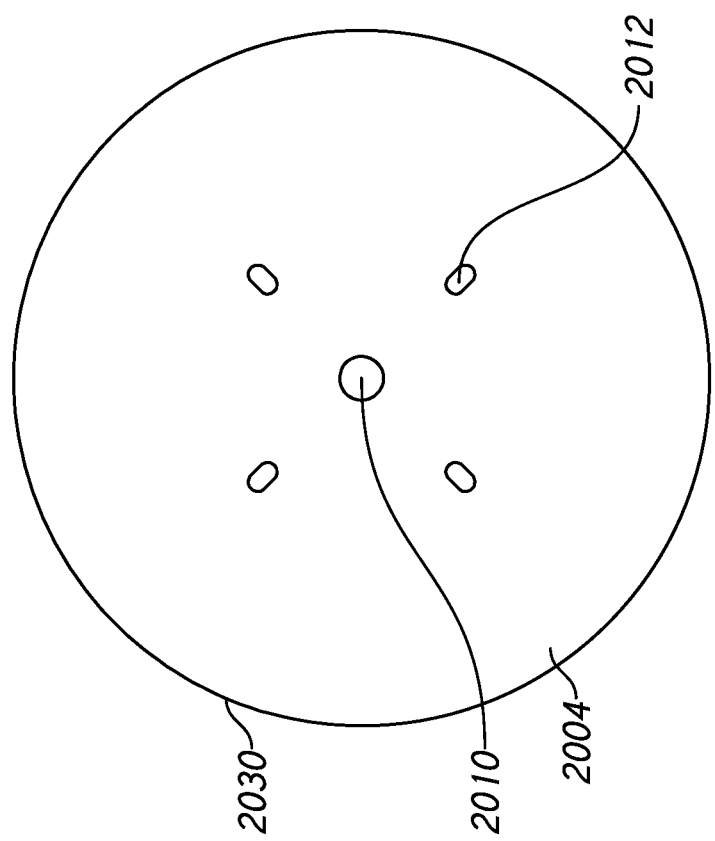
FIG. 45 schematically illustrates a top view of a top plate of the example pole base cabinet of FIGS. 42A and/or 42B.
Figure 47:
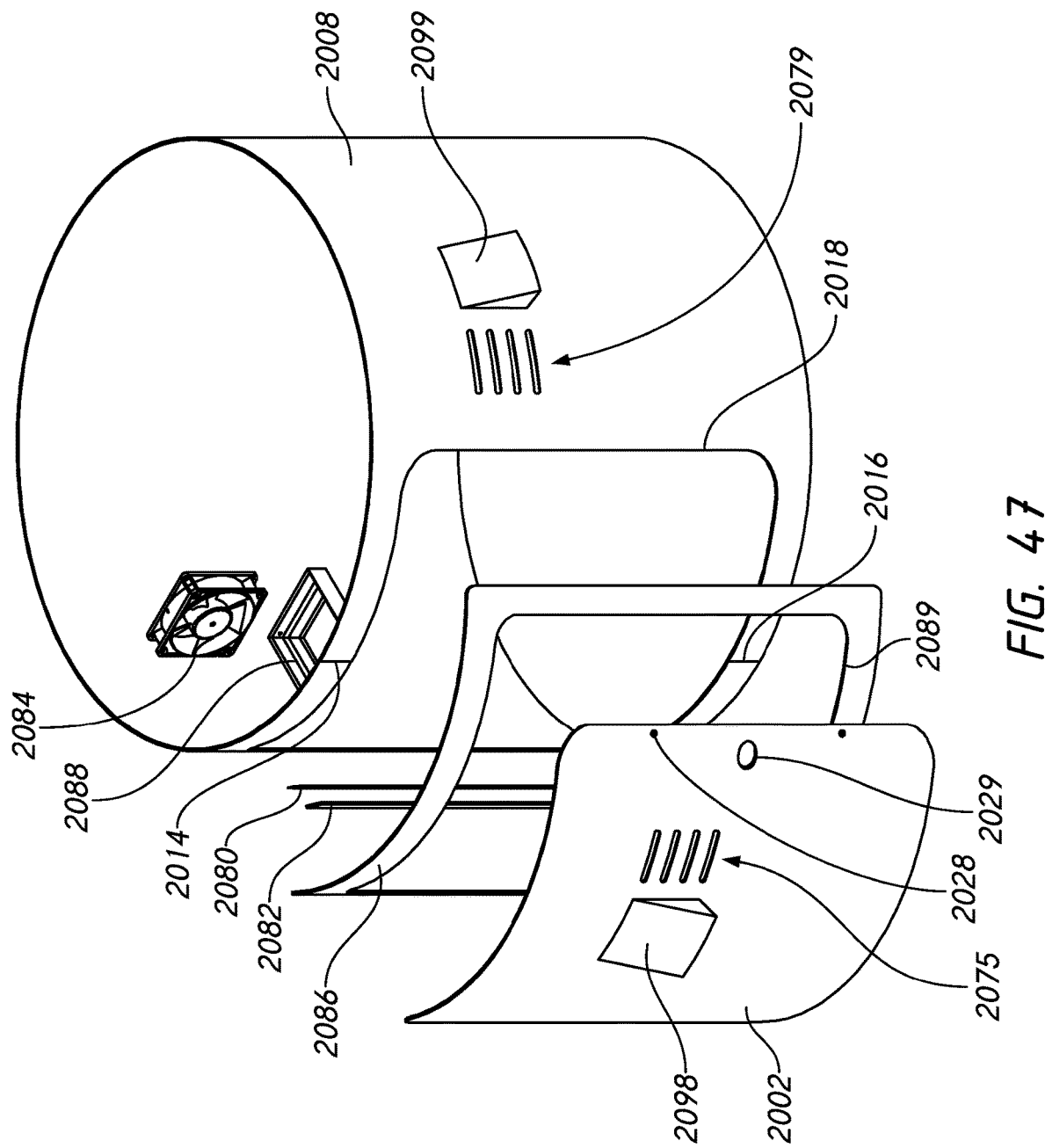
FIG. 47 schematically illustrates a perspective view of a peripheral wall and door of the example pole base cabinet of FIGS. 42A and/or 42B.
Figure 48:
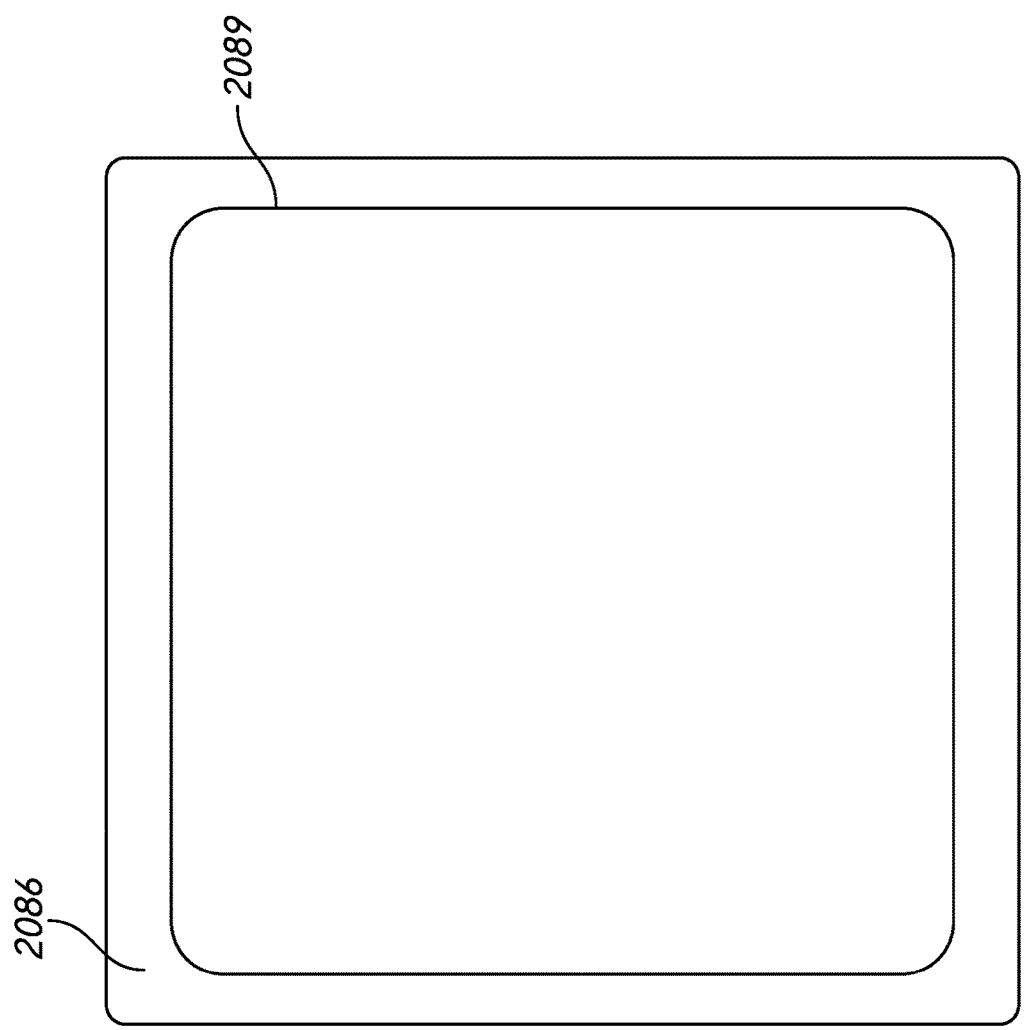
FIG. 48 schematically illustrates a front view of a door frame of the example pole base cabinet of FIGS. 42A and/or 42B.

As shown in FIGS. 42A, 42B, and 47, the pole base cabinet 2000 can have a peripheral wall, side, surface 2008, which can also be referred to as a skin and/or wall 2008. The peripheral wall 2008 can extend from and/or be coupled, which can include directly, rigidly, or fixedly connected, to the top plate 2004 to the bottom plate 2006. The peripheral wall 2008 can extend from and/or be coupled, which can include directly, rigidly, or fixedly connected, to the periphery 2030 of the top plate 2004 to and/or proximate a periphery 2032 of the bottom plate 2006. The peripheral wall 2008 can extend and/or be coupled, which can include directly, rigidly, or fixedly connected, around the periphery 2030 of the top plate 2004 and/or periphery 2032 of the bottom plate 2006.

The peripheral wall 2008 can define a periphery of the pole base cabinet 2000, which can be circular, polygonal, square, rectangular, irregular, and/or other shapes. The peripheral wall 2008 can define a periphery of the pole base cabinet 2000 that can be the same as or similar to the shape of the periphery 2030 of the top plate 2004 and/or periphery 2032 of the bottom plate 2006. The peripheral wall 2008 can define a rounded or circular periphery of the pole base cabinet 2000, which can be similar to a tube. In a configuration, the peripheral wall 2008 can be manipulated from a disassembled configuration to the configuration shown in FIGS. 42A, 42B, and 47 by forming the peripheral wall 2008 into the rounded tube-like configuration such that the peripheral wall 2008 can be coupled to or proximate itself at the top joint, abutment, seam, junction, connection 2014 and the bottom joint, abutment, seam, junction, connection 2016. In a configuration, the peripheral wall 2008 can be manufactured such that there is no top joint 2014 and/or bottom joint 2016.

The peripheral wall 2008 can define a main opening 2018. The main opening 2018 can provide access into a cavity 2020 of the pole base cabinet 2000. The cavity 2020 can be centrally located in the pole base cabinet 2000. The cavity 2020 can house items and/or components, which can include the items and/or components detailed herein. The main opening 2018 can be varying sizes and shapes, which can include circular, polygonal, irregular, and/or others. In a configuration, the main opening 2018 can be rectangular in shape with rounded corners. The main opening 2018 can extend to proximate the top plate 2004 and proximate the bottom plate 2006.

As shown in FIGS. 42A, 42B, 47, and 48, the pole base cabinet 2000 can have a gasket, seal, door stop, flange, door frame 2086. The door frame 2086 can be positioned around the main opening 2018 of the peripheral wall 2008. The door frame 2086 can extend into the main opening 2018. In some embodiments, the door frame 2086 can have a periphery or shape generally corresponding to the shape of main opening 2018. In some embodiments, the door frame 2086 can have an opening 2089 therethrough. The opening 2089 can be smaller than the main opening 2018. In some embodiments, the opening 2089 can be the same or similar shape as the main opening 2018 but smaller. In some embodiments, the opening 2089 can have a shape, edge, or lip generally corresponding to the shape of main opening 2018, such as a square or other shapes discussed herein, but can be smaller than the main opening 2018. An inner periphery of the door frame 2086 that defines the opening 2089 can extend into the main opening 2018. The door frame 2086 can be positioned such that the cavity 2020 can be accessed through the main opening 2018 and the opening 2089. The opening 2089 can be centered on a central axis of the main opening 2018. The inner periphery of the peripheral wall 2008 that defines the main opening 2018 can be positioned around the opening 2089. The main opening 2018 can surround the opening 2089. The inner periphery of the peripheral wall 2008 that defines the main opening 2018 can circumscribe the opening 2089.

In some embodiments, the door frame 2086 can be a door stop. The door frame 2086 can be positioned inside the cavity 2020 and/or on an interior side of the peripheral wall 2008. The door frame 2086 can be coupled, which can include directly, rigidly, or fixedly connected, to the peripheral wall 2008, a portion of the peripheral wall 2008 proximate the main opening 2018, and/or an interior surface of the peripheral wall 2008. In some embodiments, the door frame 2086 is coupled, which can include directly, rigidly, or fixedly connected, to a hinge 2080 and/or shim 2082 that are coupled, which can include directly, rigidly, or fixedly connected, to the peripheral wall 2008. As described above, the opening 2089 can be smaller than the main opening 2018. A portion of the door frame 2086 that is proximate the opening 2089 can extend into the main opening 2018.

The door 2002, described in more detail elsewhere herein, can interface (e.g., engage) with the door frame 2086. In some embodiments, the door 2002 can engage with the portion of the door frame 2086 that is proximate the opening 2089 and extending into the main opening 2018. In some embodiments, the door 2002 can engage with a gasket (e.g., seal) positioned on the portion of the door frame 2086 that is proximate the opening 2089 and extending into the main opening 2018. The door 2002 can be coupled to the pole base cabinet 2000 with a hinge 2080 such that the door 2002 can rotate closed to block access to the cavity 2020 or open to allow access to the cavity 2020. The door 2002 can cover the opening 2089 and the main opening 2018. As described elsewhere herein, the hinge 2080 can be coupled, which can include directly, rigidly, or fixedly connected, to the door frame 2086 and/or peripheral wall 2008. As described elsewhere herein, the shim 2082 can be coupled, which can include directly, rigidly, or fixedly connected, to the door frame 2086 and/or peripheral wall 2008. In some embodiments, the hinge 2080 and shim 2082 can offset the door frame 2086 from the inner surface of the peripheral wall 2008, which can enable the door 2002 to engage with the door frame 2086 and/or a gasket attached to the door frame 2086 while being flush with the outer surface of the peripheral wall. In some embodiments, the hinge 2080 and/or the shim 2082 can offset the door frame 2086 from the inner surface of the peripheral wall 2008, which can enable the door 2002 to engage with a gasket (e.g., seal) to provide a sealed interface. In some embodiments, the hinge 2080 and/or the shim 2082 can offset the door frame 2086 from the inner surface of the peripheral wall 2008 to enable a gasket to be positioned between the door frame 2086 and the peripheral wall 2008 that engages with the door 2002.

In a closed configuration, the door 2002 can interface with the portion of the door frame 2086 and/or a gasket coupled to the door frame 2086 that is proximate the opening 2089 and extending into the main opening 2018. The door frame 2086 can stop the door 2002 from rotating inward toward the cavity 2020. The door frame 2086 can physically impede rotation of the door 2002 in one direction. In the closed configuration, the door 2002 can be flush with the peripheral wall 2008 (e.g., outer surface of the peripheral wall 2008) while interfacing with the door frame 2086 and/or a gasket coupled to the door frame 2086. In the closed configuration, the door 2002 can be positioned within the inner periphery of the peripheral wall 2008 that defines the main opening 2018. In the closed configuration, the door 2002 can be positioned within the main opening 2018. The periphery of the door 2002 can be the same or similar shape, which can include smaller, as the periphery defining the main opening 2018. The door frame 2086 and the door 2002 can engage to form a seal (e.g., a sealed interface), which can advantageously inhibit particulate (e.g., dust), fluid, and/or other matter from entering the cavity 2020. The door frame 2086, peripheral wall 2008, and/or door 2002 can engage to form a seal (e.g., a sealed interface), which can advantageously inhibit particulate (e.g., dust), fluid, and/or other matter from entering the cavity 2020. In some embodiments, the periphery of the door 2002 can interface and/or be proximate the inner periphery of the peripheral wall defining the main opening 2018 to form a seal (e.g., a sealed interface), which can advantageously inhibit particulate (e.g., dust), fluid, and/or other matter from entering the cavity 2020. In some embodiments, a gasket can be positioned between the door 2002, door frame 2086, and/or portion of the peripheral wall defining the main opening 2018 to provide a seal (e.g., a sealed interface), which can advantageously inhibit particulate (e.g., dust), fluid, and/or other matter from entering the cavity 2020. The gasket can be made from a variety of materials, such as polymers (e.g., rubber, silicone, etc.) and or other suitable materials. Providing a sealed interface can protect the contents of the pole base cabinet 2000, such as electronics and/or other equipment. The door frame 2086 can be made of a variety of materials, such as metals, polymers (e.g., rubber, silicone, etc.), and/or other materials.

As described above, the main opening 2018 can be covered with the door 2002, as shown in FIGS. 42A and 42B, permanently or temporarily preventing and/or restricting access to the cavity 2020. The door 2002 can be curved, which can include curving about a central axis of the pole base cabinet 2000 such that the door 2002 has a curvature that generally matches the curvature of the peripheral wall 2008. This can allow the door 2002 to cover the main opening 2018 while providing a generally continuous periphery to the pole base cabinet 2000 with the peripheral wall 2008. The door frame 2086 can be curved to interface with the curved door 2002. As described above, the door 2002 can be flush with the peripheral wall 2008 in the closed configuration and match the curvature of the peripheral wall 2008. In some embodiments, the door 2002 can have a slightly greater radius than the peripheral wall 2008 to be positioned on the outer surface of the peripheral wall 2008. The door 2002 can couple to the pole base cabinet 2000, periphery of the main opening 2018, door frame 2086, and/or one or more of the supports described herein.

The door 2002 can open via a hinge (e.g., piano hinge) 2080, illustrated in FIGS. 42A, 42B, 47, and 49, such that the door 2002 can be rotated to prevent and allow access into the cavity 2020. The hinge 2080 can be coupled, which can include directly, rigidly, or fixedly connected, to the door frame 2086 and/or peripheral wall 2008. The hinge 2080 can be positioned between the peripheral wall 2008 and the door frame 2086. The hinge 2080 can space the door frame 2086 away from an inner surface of the peripheral wall 2008.

In some embodiments, a shim 2082, illustrated in FIGS. 42A, 42B, 47, and 50, can be coupled, which can include directly, rigidly, or fixedly connected, to the door frame 2086 and/or peripheral wall 2008. The shim 2082 can be coupled, which can include directly, rigidly, or fixedly connected, to the door frame 2086 and/or peripheral wall 2008. The shim 2082 can be positioned between the peripheral wall 2008 and the door frame 2086. The shim 2082 can space (e.g., offset) the door frame 2086 away from an inner surface of the peripheral wall 2008. The shim 2082 can be coupled, which can include directly, rigidly, or fixedly connected, to the door frame 2086 and/or peripheral wall 2008 on one side of the main opening 2018 while the hinge 2080 is on an opposite side of the main opening 2018. The shim 2082 can offset the door frame 2086 from the peripheral wall 2008 the same distance that the hinge 2080 offsets the door frame 2086 from the peripheral wall 2008. This can facilitate the door 2002 being flush with the peripheral wall 2008 in the closed configuration. The shim 2082 can ensure that the door frame 2086 and the door 2002 properly align in the closed configuration. In some embodiments, the shim 2082 can be the same length as the hinge 2080. The shim 2082, in some embodiments, can be wider than the hinge 2080. The shim 2082 can be an elongate structure, which can include having a rectangular periphery. In some embodiments, the shim 2082 is a wedge. In some embodiments, the shim 2082 is curved to match the curvature of the peripheral wall 2008. In some embodiments, the shim 2082 and the hinge 2080 have the same thickness.

As shown in FIG. 47, the door 2002 can include vent(s) 2098 (e.g., covered vents). In a configuration, the peripheral wall 2008 can include vent(s) 2099 (e.g., covered vents). The pole base cabinet 2000 can have both, none, and/or one of vent(s) 2098 and vent(s) 2099. The vent(s) 2098 and/or vent(s) 2099 can be used to vent the cavity 2020, which can advantageously assist in cooling the cavity 2020 and/or the contents therein (e.g., electronics). The door 2002 can include a plurality of door apertures 2028, which can include two, three, four, five, six, seven, eight, or more door apertures 2028. The door apertures 2028 can be used to couple the door 2002 to the pole base cabinet 2000, which can include the peripheral wall 2008, door frame 2086, top plate 2004, bottom plate 2006, and/or support panels. In some embodiments, a bolt, screw, rivet, and/or other similar device can be inserted through the door apertures 2028 to engage with the peripheral wall 2008, door frame 2086, top plate 2004, bottom plate 2006, and/or support panels to couple the door 2002 to the pole base cabinet 2000. The door apertures 2028 can correspond to apertures positioned on the pole base cabinet 2000, such as apertures on the peripheral wall 2008, door frame 2086, top plate 2004, bottom plate 2006, and/or support panels. The door 2002 can be a thickness generally matching or being generally the same as that of the thickness of the peripheral wall 2008. In some embodiments, the door 2002 has a thickness that is larger than the thickness of the peripheral wall 2008.

In some embodiments, the door 2002 can include one or more vents 2075. Unlike as illustrated in FIG. 47, the door 2002 can have none, one, or both of vent 2075 or vent 2098. In some embodiments, the vent 2075 can include a single aperture (e.g., hole, opening, perforation) or multiple apertures, which can include apertures of different sizes and/or shapes. In some embodiments, the vent 2075 is uncovered.

In some embodiments, the peripheral wall 2008 can include one or more vents 2079. Unlike as illustrated in FIG. 47, the peripheral wall 2008 can have none, one, or both of vent 2079 or vent 2099. In some embodiments, the vents 2079 can include a single aperture (e.g., hole, opening, perforation) or multiple apertures, which can include apertures of different sizes and/or shapes. In some embodiments, the vent 2079 is uncovered.

The door 2002 can be locked and/or unlocked. In some embodiments, the door 2002 can include an aperture 2029. The aperture 2029 can be used to lock the door 2002. For example, the aperture 2029 can receive a lock. The lock received by the aperture 2029 can have a component that engages with the peripheral wall 2008, door frame 2086, and/or another component of the pole base cabinet 2000 to prevent the door 2002 from being opened. In some embodiments, the aperture 2029 can receive a handle.

As shown in FIGS. 42A-44, the pole base cabinet 2000 can include a frame providing structural support and/or integrity, wherein the frame can have a plurality of support panels and/or a plurality of internal stiffening panels. The peripheral wall 2008 can be coupled, which can include directly, rigidly, or fixedly connected, to portions of the frame, which can include welded.

The plurality of support panels can include a first support panel, plank, girder, joist, pillar, plank, brace, beam 2034, second support panel, plank, girder, joist, pillar, plank, brace, beam 2036, and/or a third support panel, plank, girder, joist, pillar, plank, brace, beam 2038. In some embodiments, the pole base cabinet 2000 does not have a third support panel 2038. As shown in FIGS. 42A-44, the first support panel 2034, second support panel 2036, and/or third support panel 238 can at least partially define the cavity 2020. In some embodiments, the first support panel 2034, second support panel 2036, third support panel 238, top plate 2004, and/or bottom plate 2006 can at least partially define the cavity 2020. The first support panel 2034, second support panel 2036, and/or a third support panel 2038 can extend between and/or be coupled, which can include directly, rigidly, or fixedly connected, to the top plate 2004 and the bottom plate 2006.

The first support panel 2034, second support panel 2036, and/or a third support panel 2038 can form three sides of a rectangular-like structure surrounding or at least partially surrounding the cavity 2020. The first support panel 2034, second support panel 2036, and/or a third support panel 2038 can be the same, similar, or different size and shape. The first support panel 2034, second support panel 2036, and/or a third support panel 2038 can be rectangular panels. The first support panel 2034, second support panel 2036, and/or a third support panel 2038 can be straight or curved. The first support panel 2034, second support panel 2036, and/or third support panel 2038 can have ends (e.g., edges, longitudinal edges) that are proximate the periphery 2030 of the top plate 2004 and/or the periphery 2032 of the bottom plate 2006. The first support panel 2034, second support panel 2036, and/or third support panel 2038 can extend and/or be coupled, which can include directly, rigidly, or fixedly connected (e.g., welded), to the peripheral wall 2008.

The first support panel 2034 can be offset from and/or parallel to the second support panel 2036. The third support panel 2038 can extend between and/or be coupled, which can include directly, rigidly, or fixedly connected, to the first support panel 2034 and the second support panel 2036. The third support panel 2038 can extend between and/or be coupled to, which can include directly, rigidly, or fixedly connected, ends or proximate ends (e.g., edges, longitudinal edges) of the first support panel 2034 and second support panel 2036. The third support panel 2038 can extend between and/or be coupled, which can include directly, rigidly, or fixedly connected, to ends or proximate ends (e.g., edges, longitudinal edges) of the first support panel 2034 and second support panel 2036 that are opposite the main opening 2018. The third support panel 2038 can be positioned opposite the main opening 2018. The third support panel 2038 can be perpendicular to the first support panel 2034 and/or second support panel 2036. The first support panel 2034, second support panel 2036, and third support panel 2038 can cooperate to form three sides of a box.

The first support panel 2034, second support panel 2036, and/or a third support panel 2038 can each respectively have a first aperture (e.g., hole, opening, port) 2076, second aperture (e.g., hole, opening, port) 2078, and/or third aperture (e.g., hole, opening, port) 2077. In a configuration, respective peripheries defining the first aperture 2076, second aperture 2078, and/or third aperture 2077 can be rounded to reduce abrasion on devices extending therethrough. In a configuration, respective peripheries defining the first aperture 2076, second aperture 2078, and/or third aperture 2077 can be coated or covered with a non-abrasive material to reduce abrasion on devices extending therethrough. The first aperture 2076 can be centered on the first support panel 2034. The second aperture 2078 can be centered on the second support panel 2036. The third aperture 2077 can be centered on the third support panel 2038.

The first aperture 2076, second aperture 2078, and/or third aperture 2077 can be circles, polygons, irregular shaped, and/or other shapes. The first aperture 2076, second aperture 2078, and/or third aperture 2077 can be the same size and/or shape. The first aperture 2076 and second aperture 2078 can be coaxially aligned. The third aperture 2077 can have an axis that intersects and/or is perpendicular to a shared central axis of the first aperture 2076 and second aperture 2078. The first aperture 2076, second aperture 2078, and/or third aperture 2077 can increase, respectively, the rigidity of the first support panel 2034, second support panel 2036, and/or a third support panel 2038. The first aperture 2076, second aperture 2078, and/or third aperture 2077 can provide access to the main cavity 2020 for wiring, cords, optical fibers, and/or other devices.

The pole base cabinet 2000 can include a plurality of internal stiffening panels, planks, girders, joists, pillars, planks, braces, beams, which can include the first internal stiffening panel 2040, second internal stiffening panel 2042, and/or third internal stiffening panel 2044. In some embodiments, the pole base cabinet 2000 can have fewer than three (e.g., one or two) or more than three (e.g., four, five, six, seven, etc.) internal stiffening panels. In some embodiments, the first internal stiffening panel 2040, second internal stiffening panel 2042, and/or third internal stiffening panel 2044 are the same. In some embodiments, the first internal stiffening panel 2040, second internal stiffening panel 2042, and/or third internal stiffening panel 2044 provide structural integrity (e.g., rigidity, strength) to the pole base cabinet 2000, while allowing the cavity 2020 to have sufficient space to house items described herein.

The first internal stiffening panel 2040, second internal stiffening panel 2042, and/or third internal stiffening panel 2044 can be coupled, which can include directly, rigidly, or fixedly connected, to the top plate 2004. In some embodiments, the first internal stiffening panel 2040, second internal stiffening panel 2042, and/or third internal stiffening panel 2044 can be spaced away from the top plate 2004. The first internal stiffening panel 2040, second internal stiffening panel 2042, and/or third internal stiffening panel 2044 can extend equidistantly or to different distances away from (e.g., relative to) the top plate 2004. The first internal stiffening panel 2040, second internal stiffening panel 2042, and/or third internal stiffening panel 2044 can have a length that is the same as the width of the third support panel 2038. The first internal stiffening panel 2040, second internal stiffening panel 2042, and/or third internal stiffening panel 2044 can extend to a position between the top plate 2004 and the bottom plate 2006, providing room for items to be store in the cavity 2020 while providing structural support. In some embodiments, the first internal stiffening panel 2040, second internal stiffening panel 2042, and/or third internal stiffening panel 2044 extend from the top plate 2004 and/or a top edge of the first support panel 2034 and/or second support panel 2036 a distance that that is less than $1/20$, $1/20$-$1/10$, $2/20$-$3/20$, $3/20$-$1/5$, $1/5$-$1/4$, $1/4$-$6/20$, $6/20$-$7/20$, $7/20$-$2/5$, $9/20$-$1/2$, and/or greater than $1/2$ the height of the cavity 2020, distance between the top plate 2004 and the bottom plate 2006, and/or length (e.g., height) of the first support panel 2034, second support panel 2036, and/or third support panel 2038. In some embodiments, the first internal stiffening panel 2040, second internal stiffening panel 2042, and/or third internal stiffening panel 2044 extend from the top plate 2004 and/or a top edge of the first support panel 2034 and/or second support panel 2036 a distance that that is less than $1/20$, $1/19$, $1/18$, $1/17$, $1/16$, $1/15$, $1/14$, $1/13$, $1/12$, $1/11$, $1/10$, $1/9$, $1/8$, $1/7$, $1/6$, $1/5$, $1/4$, $1/3$, and/or $1/2$ the height of the cavity 2020, distance between the top plate 2004 and the bottom plate 2006, and/or length (e.g., height) of the first support panel 2034, second support panel 2036, and/or third support panel 2038. In some embodiments, the first internal stiffening panel 2040, second internal stiffening panel 2042, and/or third internal stiffening panel 2044 have a width (e.g., height) that is less than $1/20$, $1/19$, $1/18$, $1/17$, $1/16$, $1/15$, $1/14$, $1/13$, $1/12$, $1/11$, $1/10$, $1/9$, $1/8$, $1/7$, $1/6$, $1/5$, $1/4$, $1/3$, and/or $1/2$ the height of the cavity 2020, distance between the top plate 2004 and the bottom plate 2006, and/or length (e.g., height) of the first support panel 2034, second support panel 2036, and/or third support panel 2038. The first internal stiffening panel 2040, second internal stiffening panel 2042, and/or third internal stiffening panel 2044 can be rectangular, square, and/or other shaped panels. The first internal stiffening panel 2040, second internal stiffening panel 2042, and/or third internal stiffening panel 2044 can be straight or curved. The first internal stiffening panel 2040, second internal stiffening panel 2042, and/or third internal stiffening panel 2044 can be the same size (e.g., same length, width, and/or thickness).

The first internal stiffening panel 2040, second internal stiffening panel 2042, and/or third internal stiffening panel 2044 can extend between and/or be coupled to, which can include directly, rigidly, or fixedly connected, the first support panel 2034 and the second support panel 2036. In some embodiments, the first internal stiffening panel 2040, second internal stiffening panel 2042, and/or third internal stiffening panel 2044 are coupled to, which can include directly, rigidly, or fixedly connected, the first support panel 2034 and the second support panel 2036 proximate the top plate 2004 and/or top portion of the first support panel 2034 and the second support panel 2036. In some embodiments, the first internal stiffening panel 2040, second internal stiffening panel 2042, and/or third internal stiffening panel 2044 are positioned at the same elevation. In some embodiments, the first internal stiffening panel 2040, second internal stiffening panel 2042, and/or third internal stiffening panel 2044 can extend between and/or be coupled to, which can include directly, rigidly, or fixedly connected, the first support panel 2034 and the second support panel 2036 at the same elevation. In some embodiments, the first internal stiffening panel 2040, second internal stiffening panel 2042, and/or third internal stiffening panel 2044 extend perpendicularly relative to a central axis of the pole base cabinet 2000. The first internal stiffening panel 2040, second internal stiffening panel 2042, and/or third internal stiffening panel 2044 can be parallel to the third support panel 2044 and/or each other. The first internal stiffening panel 2040, second internal stiffening panel 2042, and/or third internal stiffening panel 2044 can be perpendicular relative to the first support panel 2034 and the second support panel 2036. The first internal stiffening panel 2040, second internal stiffening panel 2042, and/or third internal stiffening panel 2044 can be spaced apart (e.g., offset) from each other. In some embodiments, the first internal stiffening panel 2040 and third internal stiffening panel 2044 are on opposite sides of the second internal stiffening panel 2042. In some embodiments, the first internal stiffening panel 2040 and third internal stiffening panel 2044 are equally spaced from the second internal stiffening panel 2042. In some embodiments, the first internal stiffening panel 2040 and third internal stiffening panel 2044 are unequally spaced away from the internal stiffening panel 2042. The first internal stiffening panel 2040, second internal stiffening panel 2042, and/or third internal stiffening panel 2044 can be positioned between the top plate 2004 and the bottom plate 2006.

The first internal stiffening panel 2040 can extend between and/or be coupled to, which can include directly, rigidly, or fixedly connected, ends and/or proximate ends (e.g., edges, longitudinal edges) of the first support panel 2034 and second support panel 2036 that are proximate the opening 2018. The first internal stiffening panel 2040 can be positioned between the second internal stiffening panel 2042 and the main opening 2018. The first internal stiffening panel 2040 can be positioned proximate the main opening 2018. The first internal stiffening panel 2040 can be offset from the second internal stiffening panel 2042.

The second internal stiffening panel 2042 can be positioned, which can include equidistantly positioned, between the first internal stiffening panel 2040 and third internal stiffening panel 2044. The second internal stiffening panel 2042 can be positioned along a median plane of the pole base cabinet 2000. The second internal stiffening panel 2042 can be positioned on a common plane as a central axis that extends between the aperture 2076 and the aperture 2078. The second internal stiffening panel 2042 can be positioned between and/or offset from the first internal stiffening panel 2040 and third internal stiffening panel 2044. The second internal stiffening panel 2042 can be positioned between and/or be coupled to, which can include directly, rigidly, or fixedly connected, midpoints and/or portions of the first support panel 2034 and second support panel 2036. The second internal stiffening panel 2042 can intersect a central axis of the pole base cabinet 2000. The second internal stiffening panel 2042 can extend across the opening 2010.

The third internal stiffening panel 2044 can be positioned between the second internal stiffening panel 2042 and the third support panel 2038. The third internal stiffening panel 2044 can be offset from the second internal stiffening panel 2042 and the third support panel 2038. The third internal stiffening panel 2044 can be positioned at and/or proximate a midpoint between the second internal stiffening panel 2042 and the third support panel 2038. In some embodiments, the third internal stiffening panel 2044 can be positioned closer to the second internal stiffening panel 2042 or third support panel 2038.

The pole base cabinet 2000 shown in FIG. 42B can be the same as the pole base cabinet 2000 shown in FIG. 42A, aside from the differences described herein. As shown in FIG. 42B, the pole base cabinet 2000 can include internal stiffening panels, internal panel, planks, girders, joists, pillars, planks, braces, beams, which can include the first internal brace 2071, second internal brace 2073, third internal brace 2081, fourth internal brace 2083, fifth internal brace 2085, and/or sixth internal brace 2087. In some embodiments, the first internal brace 2071, second internal brace 2073, third internal brace 2081, fourth internal brace 2083, fifth internal brace 2085, and/or sixth internal brace 2087 provide structural integrity (e.g., rigidity, strength) to the pole base cabinet 2000, while allowing the cavity 2020 to have sufficient space to house items described herein. In some embodiments, the first internal brace 2071, second internal brace 2073, third internal brace 2081, fourth internal brace 2083, fifth internal brace 2085, and/or sixth internal brace 2087 can be the same height as the first internal stiffening panel 2040, second internal stiffening panel 2042, and/or third internal stiffening panel 2044.

The first internal brace 2071, second internal brace 2073, third internal brace 2081, fourth internal brace 2083, fifth internal brace 2085, and/or sixth internal brace 2087 can be coupled, which can include directly, rigidly, or fixedly connected, to the top plate 2004. In some embodiments, the first internal brace 2071, second internal brace 2073, third internal brace 2081, fourth internal brace 2083, fifth internal brace 2085, and/or sixth internal brace 2087 can be spaced away from the top plate 2004. The first internal brace 2071, second internal brace 2073, third internal brace 2081, fourth internal brace 2083, fifth internal brace 2085, and/or sixth internal brace 2087 can extend equidistantly or to different distances away from (e.g., relative to) the top plate 2004.

The first internal brace 2071, second internal brace 2073, third internal brace 2081, fourth internal brace 2083, fifth internal brace 2085, and/or sixth internal brace 2087 can extend to a position between the top plate 2004 and the bottom plate 2006, providing room for items to be stored in the cavity 2020 while providing structural support. In some embodiments, the first internal brace 2071, second internal brace 2073, third internal brace 2081, fourth internal brace 2083, fifth internal brace 2085, and/or sixth internal brace 2087 extend from the top plate 2004 and/or a top edge of the first support panel 2034 and/or second support panel 2036 a distance that that is less than $1/20$, $1/20$-$1/10$, $2/20$-$3/20$, $3/20$-$1/5$, $1/5$-$1/4$, $1/4$-$6/20$, $6/20$-$7/20$, $7/20$-$2/5$, $9/20$-$1/2$, and/or greater than $1/2$ the height of the cavity 2020, distance between the top plate 2004 and the bottom plate 2006, and/or length (e.g., height) of the first support panel 2034, second support panel 2036, and/or third support panel 2038. In some embodiments, the first internal brace 2071, second internal brace 2073, third internal brace 2081, fourth internal brace 2083, fifth internal brace 2085, and/or sixth internal brace 2087 extend from the top plate 2004 and/or a top edge of the first support panel 2034 and/or second support panel 2036 a distance that that is less than $1/20$, $1/19$, $1/18$, $1/17$, $1/16$, $1/15$, $1/14$, $1/13$, $1/12$, $1/11$, $1/10$, $1/9$, $1/8$, $1/7$, $1/6$, $1/5$, $1/4$, $1/3$, and/or $1/2$ the height of the cavity 2020, distance between the top plate 2004 and the bottom plate 2006, and/or length (e.g., height) of the first support panel 2034, second support panel 2036, and/or third support panel 2038. In some embodiments, the first internal brace 2071, second internal brace 2073, third internal brace 2081, fourth internal brace 2083, fifth internal brace 2085, and/or sixth internal brace 2087 have a width (e.g., height) that is less than $1/20$, $1/19$, $1/18$, $1/17$, $1/16$, $1/15$, $1/14$, $1/13$, $1/12$, $1/11$, $1/10$, $1/9$, $1/8$, $1/7$, $1/6$, $1/5$, $1/4$, $1/3$, and/or $1/2$ the height of the cavity 2020, distance between the top plate 2004 and the bottom plate 2006, and/or length (e.g., height) of the first support panel 2034, second support panel 2036, and/or third support panel 2038. The first internal brace 2071, second internal brace 2073, third internal brace 2081, fourth internal brace 2083, fifth internal brace 2085, and/or sixth internal brace 2087 can be rectangular, square, and/or other shaped panels. The first internal brace 2071, second internal brace 2073, third internal brace 2081, fourth internal brace 2083, fifth internal brace 2085, and/or sixth internal brace 2087 can be straight or curved. The first internal brace 2071, second internal brace 2073, third internal brace 2081, fourth internal brace 2083, fifth internal brace 2085, and/or sixth internal brace 2087 can be the same thickness.

The first internal brace 2071, second internal brace 2073, third internal brace 2081, fourth internal brace 2083, fifth internal brace 2085, and/or sixth internal brace 2087 can be parallel and/or offset from the first support panel 2034 and the second support panel 2036. The first internal brace 2071, second internal brace 2073, third internal brace 2081, fourth internal brace 2083, fifth internal brace 2085, and/or sixth internal brace 2087 can be perpendicular to the third support panel 2038. The first internal brace 2071, third internal brace 2081, and/or fifth internal brace 2085 can be equidistantly spaced away from the first support panel 2034 and the second support panel 2036. The first internal brace 2071, third internal brace 2081, and/or fifth internal brace 2085 can be coplanar. The second internal brace 2073, fourth internal brace 2083, and/or sixth internal brace 2087 can be equidistantly spaced away from the first support panel 2034 and the second support panel 2036. The second internal brace 2073, fourth internal brace 2083, and/or sixth internal brace 2087 can be coplanar.

The first internal brace 2071 and second internal brace 2073 can be the same size and shape. In some embodiments, the first internal brace 2071, second internal brace 2073, fifth internal brace 2085, and sixth internal brace 2087 are the same size and shape. In some embodiments, the first internal brace 2071, second internal brace 2073, third internal brace 2081, fourth internal brace 2083, fifth internal brace 2085, and/or sixth internal brace 2087 are the same size and shape. The first internal brace 2071 and second internal brace 2073 can be spaced apart from and parallel to each other. The first internal brace 2071 and second internal brace 2073 can extend between and/or be coupled to, which can include directly, rigidly, or fixedly connected, the first internal stiffening panel 2040 and the second internal stiffening panel 2042. The first internal brace 2071 and second internal brace 2073 can be positioned between at least two of the apertures 2012 of the top plate 2004.

The third internal brace 2081 and fourth internal brace 2083 can be spaced apart from and parallel to each other. The third internal brace 2081 and fourth internal brace 2083 can extend between and/or be coupled to, which can include directly, rigidly, or fixedly connected, the second internal stiffening panel 2042 and the third internal stiffening panel 2044. The opening 2010 of the top plate 2010 can be positioned between the third internal brace 2081 and fourth internal brace 2083. A central axis of the opening 2010 of the top plate 2010 can be positioned between the third internal brace 2081 and fourth internal brace 2083. In some embodiments, the opening 2010 and/or the central axis of the opening 2010 can be positioned between the third internal brace 2081, fourth internal brace 2083, second internal stiffening panel 2042, and third internal stiffening panel 2044. In some embodiments, the third internal brace 2081, fourth internal brace 2083, second internal stiffening panel 2042, and third internal stiffening panel 2044 can define a square and/or rectangle through which the central axis of the opening 2010 extends.

The fifth internal brace 2085 and sixth internal brace 2087 can be spaced apart from and parallel to each other. The fifth internal brace 2085 and sixth internal brace 2087 can extend between and/or be coupled to, which can include directly, rigidly, or fixedly connected, the third internal stiffening panel 2044 and the third support panel 2038. The fifth internal brace 2085 and sixth internal brace 2087 can be positioned between at least two of the apertures 2012 of the top plate 2004. The same distance can separate the first internal brace 2071 from the second internal brace 2073, the third internal brace 2081 from the fourth internal brace 2083, and the fifth internal brace 2085 from the sixth internal brace 2087.

As shown in FIGS. 42A, 42B, 47, and 51, the pole base cabinet 2000 can have a bracket (e.g., seat, holder, receiver, pocket, receptacle) 2088. The bracket 2088 can receive a fan 2084, which can include a cooling fan, pump, or other fluid moving device, that can cool the cavity 2020 and/or equipment within the cavity 2020 by moving air within the cavity 2020 or directing air through (in and out of) the cavity 2020 (e.g., providing a flow of air inside or through the cavity 2020). The fan 2084 can be corrosion resistant. The bracket 2088 can, as shown in FIG. 47, be coupled, which can include directly, rigidly, or fixedly connected, to an inside surface of the peripheral wall 2008. In some embodiments, the bracket 2088 can be coupled, which can include directly, rigidly, or fixedly connected, to one or more of the plurality of support panels, one or more of the internal stiffening panels, top plate 2004, door 2002, and/or bottom plate 2006.

Figure 51:
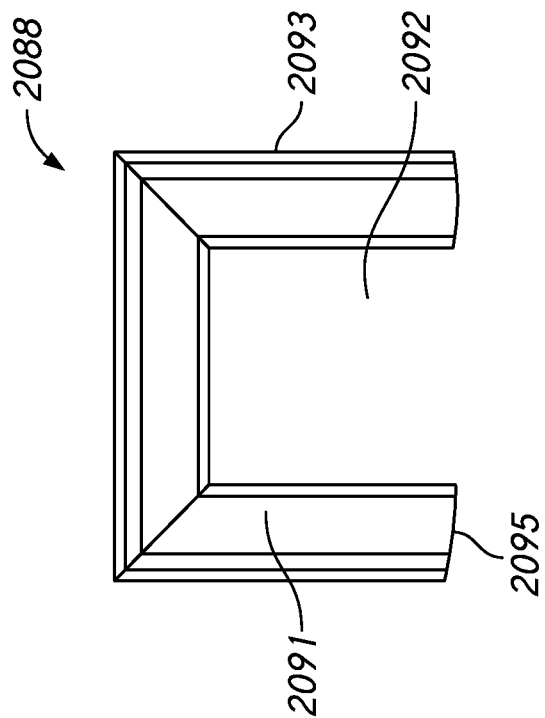
FIG. 51 schematically illustrates a fan bracket of FIGS. 42A and/or 42B.
Figure 50:
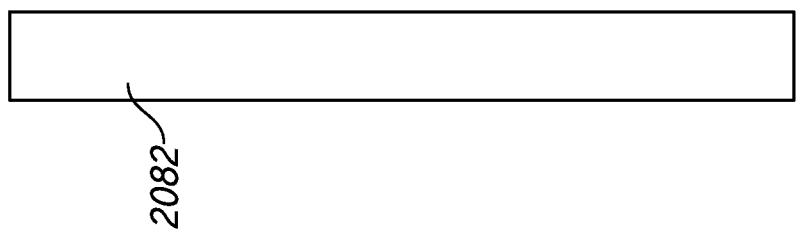
FIG. 50 schematically illustrates a shim of the pole base cabinet of FIGS. 42A and/or 42B.
Figure 49:
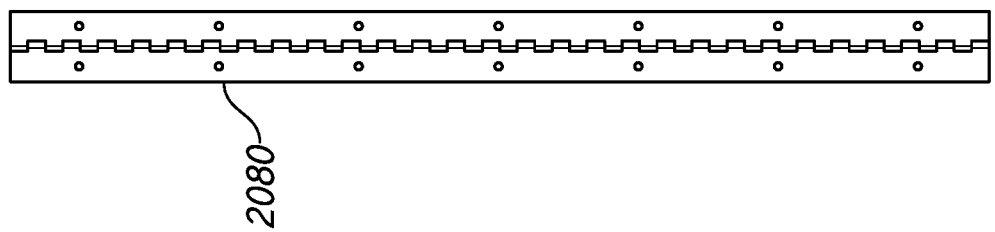
FIG. 49 schematically illustrates a hinge of the pole base cabinet of FIGS. 42A and/or 42B.

The bracket 2088 can receive the fan 2084 such that the fan 2084 directs air toward the top plate 2004, bottom plate 2006, and/or one or more of the plurality of support panels and/or internal stiffening panels. As shown in FIG. 51, the bracket 2088 can have a peripheral edge (e.g., wall, retainer, side) 2093 that defines a recess (pocket, receiver) 2091 that can receive the fan 2084. The peripheral edge 2093 can retain the fan 2084. In some embodiments, the fan 2084 can be coupled to the bracket 2088 with a snap-fit, press-fit, fasteners, friction fit, and/or other coupling techniques. The bracket 2088 can have a hole (e.g., aperture) 2092 through which the fan 2084 can direct air. In some embodiments, the ends 2095 can interface with the peripheral wall 2008. In some embodiments, the ends 2095 can have a curvature that matches the curvature of the peripheral wall 2008. In some embodiments, the ends 2095 can be straight and/or flat.

The thickness and/or material of the varying components of the pole base cabinet 2000 can vary depending on the desired structural integrity. For example, materials such as metals (such as steel, high strength steel, aluminum, and/or others), metal alloys, polymers (such as plastic), ceramics, and/or others can be used. For example, each of the plurality of support panels can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Each of the plurality of internal stiffening panels and/or internal braces can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The peripheral wall can have a thickness of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. The top plate and/or bottom plate can have thicknesses of less than 1/16, 1/16-1/4, 1/4-1/2, 1/2-3/4, 3/4-1, 1-1 1/4, 1 1/4-1 1/2, 1 1/2-1 3/4, 1 3/4-2, 2-2 1/4, 2 1/4-2 1/2, 2 1/2-2 3/4, 2 3/4-3, 3-3 1/4, 3 1/4-3 1/2, 3 1/2-3 3/4, 3 3/4-4, and/or greater than 4 inches. Relatedly, the components listed above can have varying widths, heights, and/or lengths to provide a desired size. For example, the pole base cabinet 2000 can have an overall diameter or width of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches and/or height or length of less than 6, 6-12, 12-18, 18-24, 24-30, 30-36, 36-42, 42-48, 48-54, 54-60, 60-66, 66-72, 72-78, 78-84, 84-90, 90-96, or greater than 96 inches. These are example ranges, such that other dimensions can be employed that are not explicitly listed herein.

[0239] The pole base cabinets and components thereof can be made of a variety of materials such metals (such as steel, aluminum, and/or others), metal alloys, polymers (such as plastic), ceramics, and/or other suitable materials. The pole base cabinets can be galvanized, pained, zinc coated, powder coated, vinyl coated, plasti dripped, or finished with other materials or methods.

Although the systems and methods have been disclosed in the context of certain embodiments and examples, it will be understood by those skilled in the art that the systems and methods extend beyond the specifically disclosed embodiments to other alternative embodiments and/or uses of the embodiments and certain modifications and equivalents thereof. Various features and aspects of the disclosed embodiments can be combined with or substituted for one another in order to form varying modes of the conveyor. The scope of this disclosure should not be limited by the particular disclosed embodiments described herein.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Moreover, while operations may be depicted in the drawings or described in the specification in a particular order, such operations need not be performed in the particular order shown or in sequential order, and all operations need not be performed, to achieve the desirable results. Other operations that are not depicted or described can be incorporated in the example methods and processes. For example, one or more additional operations can be performed before, after, simultaneously, or between any of the described operations. Further, the operations may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language, such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Some embodiments have been described in connection with the accompanying drawings. Components can be added, removed, and/or rearranged. Orientation references such as, for example, "top" and "bottom" are for ease of discussion and may be rearranged such that top features are proximate the bottom and bottom features are proximate the top. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

In summary, various embodiments and examples of juicing devices and methods have been disclosed. Although the systems and methods have been disclosed in the context of those embodiments and examples, it will be understood by those skilled in the art that this disclosure extends beyond the specifically disclosed embodiments to other alternative embodiments and/or other uses of the embodiments, as well as to certain modifications and equivalents thereof. This disclosure expressly contemplates that various features and aspects of the disclosed embodiments can be combined with, or substituted for, one another. Accordingly, the scope of this disclosure should not be limited by the particular disclosed embodiments described above, but should be determined only by a fair reading of the claims that follow.

What is claimed is:

1. A pole base cabinet, the cabinet comprising:
   a top plate configured to be coupled to a pole;
   a bottom plate spaced away from and parallel to the top plate, the bottom plate configured to be coupled to a base;
   a first panel connected to and extending between the top plate and the bottom plate;
   a second panel connected to and extending between the top plate and the bottom plate, wherein the first panel and the second panel are offset from each other and parallel, wherein the first panel and second panel are configured to support a load of the pole;
   a first brace connected to and extending between the first panel and the second panel;
   a second brace disposed between, offset from, and parallel to the first panel and the second panel;
   a third brace connected to and extending between the first panel and the second brace;
   a fourth brace connected to and extending between the second panel and the second brace; and
   a peripheral wall extending from a periphery of the top plate to a periphery of the bottom plate, the peripheral wall comprising an opening providing access into a cavity configured to house one or more items between the first panel, the second panel, the top plate, and the bottom plate, the cavity configured to be accessible with the cabinet disposed between the pole and the base;
   wherein each of the first brace, the second brace, the third brace, and the fourth brace are connected to and extend from the top plate toward the bottom plate a distance that is less than one-fourth of a distance between the top plate and the bottom plate.

2. The cabinet of claim 1, wherein the third brace and the fourth brace are offset from and parallel to the first brace.

3. The cabinet of claim 1, wherein the second brace is perpendicular relative to the first brace.

4. The cabinet of claim 1, wherein the third brace is perpendicular relative to the first panel.

5. The cabinet of claim 1, wherein the fourth brace is perpendicular relative to the second panel.

6. The cabinet of claim 1, wherein the second brace is connected to and extends from the first brace.

7. The cabinet of claim 1, wherein the bottom plate comprises a central hole, the central hole comprising a polygonal periphery.

8. The cabinet of claim 1, wherein the peripheral wall defines a circular periphery.

9. The cabinet of claim 1, wherein the peripheral wall defines a rectangular periphery.

10. The cabinet of claim 1, wherein the top plate is circular.

11. The cabinet of claim 1, wherein the first panel and the second panel are connected to the top plate inward of a periphery of the top plate.

12. A pole base cabinet, the cabinet comprising:
- a top plate configured to be coupled to a pole;
- a bottom plate spaced away from and parallel to the top plate, the bottom plate configured to be coupled to a base;
- a first panel connected to and extending between the top plate and the bottom plate;
- a second panel connected to and extending between the top plate and the bottom plate, the first panel and the second panel are configured to support a load of the pole;
- a first brace connected to and extending between the first panel and the second panel;
- a second brace connected to and extending between the first panel and the second panel, the second brace offset from and parallel to the first brace; and
- a space between the top plate, the bottom plate, the first panel, and the second panel for housing one or more items;
- wherein the first brace and the second brace extend from the top plate toward the bottom plate a distance that is less than half of a distance between the top plate and the bottom plate.

13. The cabinet of claim 12, further comprising a third brace disposed between the first panel and the second panel, wherein the third brace is offset from and parallel to the first panel and the second panel.

14. The cabinet of claim 13, wherein the second brace is connected to the third brace.

15. The cabinet of claim 13, wherein the third brace is connected to and extends from the first brace.

16. The cabinet of claim 13, further comprising a fourth brace connected to the second panel and the third brace, the fourth brace offset from and parallel to the first brace, wherein the second brace is connected to the first panel and the third brace.

17. The cabinet of claim 12, further comprising a fourth brace connected to the second panel and extending between the first panel and the second panel, the fourth brace offset from and parallel to the first brace.

18. The cabinet of claim 12, wherein the first brace and the second brace are connected to the top plate.

19. A base cabinet, the cabinet comprising:
- a top plate;
- a first panel connected to and extending from the top plate;
- a second panel connected to and extending from the top plate, wherein the first panel and the second panel are offset from each other;
- a first brace connected to and extending between the first panel and the second panel;
- a second brace connected to the first brace, the second brace disposed between the first panel and the second panel, and wherein the second brace is offset from and parallel to the first panel and the second panel;
- a third brace connected to and extending between the first panel and the second brace;
- a fourth brace connected to and extending between the second panel and the second brace; and
- a peripheral wall extending from a periphery of the top plate, the peripheral wall comprising an opening providing access into a cavity for housing one or more items that are between the first panel and the second panel;
- wherein each of the first brace, the second brace, the third brace, and the fourth brace extend from the top plate a distance that is less than half of a length of each of the first panel and the second panel.

20. The cabinet of claim 19, wherein the first brace, the second brace, the third brace, and the fourth brace are connected to the top plate.

21. The cabinet of claim 19, a bottom plate spaced away from and parallel to the top plate, the bottom plate configured to be coupled to a base, wherein the first panel is connected to and extends between the top plate and the bottom plate, and wherein the second panel connected to and extends between the top plate and the bottom plate.

* * * * *